US008438523B2

(12) United States Patent
Iwahashi et al.

(10) Patent No.: US 8,438,523 B2
(45) Date of Patent: May 7, 2013

(54) INTEGRATED CIRCUIT MANUFACTURING METHOD AND SEMICONDUCTOR INTEGRATED CIRCUIT

(75) Inventors: Daisuke Iwahashi, Nara (JP); Masayoshi Tojima, Osaka (JP); Tokuzo Kiyohara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/383,335

(22) PCT Filed: May 27, 2011

(86) PCT No.: PCT/JP2011/002985
§ 371 (c)(1),
(2), (4) Date: Jan. 10, 2012

(87) PCT Pub. No.: WO2011/152013
PCT Pub. Date: Dec. 8, 2011

(65) Prior Publication Data
US 2012/0110535 A1 May 3, 2012

(30) Foreign Application Priority Data

May 31, 2010 (JP) ................................ 2010-125275
May 27, 2011 (JP) ................................ 2011-119206

(51) Int. Cl.
*G06F 17/50* (2006.01)
(52) U.S. Cl.
USPC ........... 716/119; 716/100; 716/101; 716/110; 716/114; 716/118; 716/138; 710/1; 710/20; 710/21; 710/25; 710/52

(58) Field of Classification Search .......... 716/100–101, 716/110, 114, 118–119, 138; 703/13–14; 710/1, 20–21, 25, 52
See application file for complete search history.

(56) References Cited

U.S. PATENT DOCUMENTS

| 5,883,814 A | 3/1999 | Luk et al. |
| 5,884,100 A * | 3/1999 | Normoyle et al. ............. 710/52 |

(Continued)

FOREIGN PATENT DOCUMENTS

| JP | 6-131414 | 5/1994 |
| JP | 10-293782 | 11/1998 |

(Continued)

OTHER PUBLICATIONS

International Search Report issued Aug. 30, 2011 in corresponding International Application No. PCT/JP2011/002985.

(Continued)

*Primary Examiner* — Nghia Doan
(74) *Attorney, Agent, or Firm* — Wenderoth, Lind & Ponack, L.L.P.

(57) ABSTRACT

In layout design step of the semiconductor integrated circuit manufacturing method, when it is found that the wiring length between an external terminal and an IO block (external terminal I/F circuit) corresponding to the external terminal increases after a floorplan of a circuit including a functional block and the IO block is determined, placement of the IO block is determined such that the IO block is placed close to the external terminal to alleviate constraints on the wiring between the IO block and the external terminal, and timing adjustment circuits whose number is determined according to the wiring length of a bus (or a shared bus) connecting a data transfer circuit and the IO block is inserted into the bus.

29 Claims, 35 Drawing Sheets

U.S. PATENT DOCUMENTS

| | | | |
|---|---|---|---|
| 6,041,061 A * | 3/2000 | Su | 370/461 |
| 6,175,886 B1 | 1/2001 | Usami | |
| 6,502,227 B1 | 12/2002 | Kato | |
| 6,901,562 B2 * | 5/2005 | Cooke et al. | 716/101 |
| 6,948,138 B1 * | 9/2005 | Shen | 716/114 |

FOREIGN PATENT DOCUMENTS

| | | |
|---|---|---|
| JP | 11-73258 | 3/1999 |
| JP | 3250542 | 11/2001 |
| JP | 2003-271688 | 9/2003 |
| JP | 2005-107556 | 4/2005 |
| JP | 2007-334692 | 12/2007 |

OTHER PUBLICATIONS

Ikutaro Kojima, "Meaningful 'design planning' advocated by NEC", <URL:http://Techon.nikkeibp.co.jp/article/news/20070329/129739/?P=3>, Mar. 1, 1999, pp. 1-3 (with English translation).

* cited by examiner

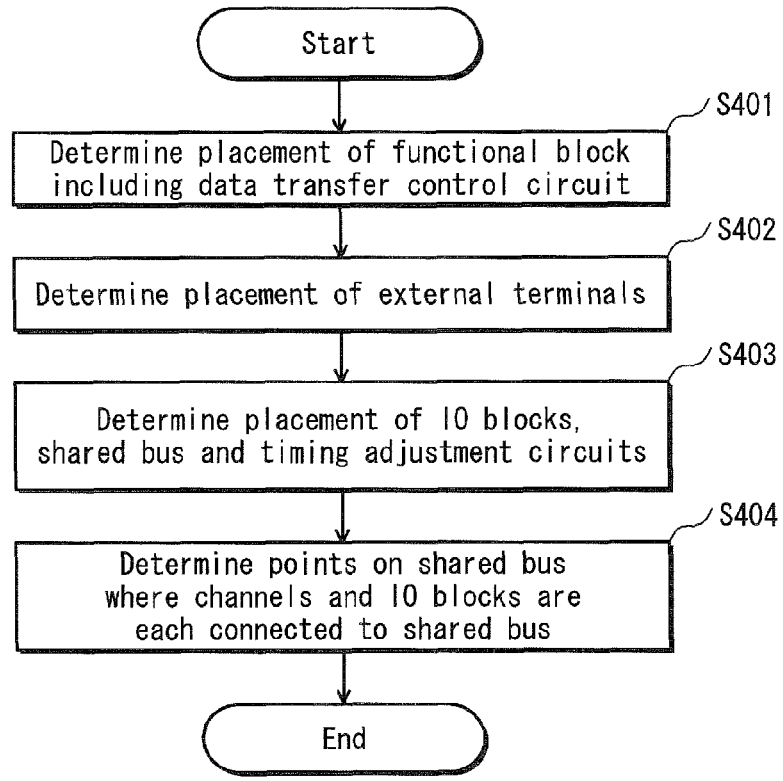
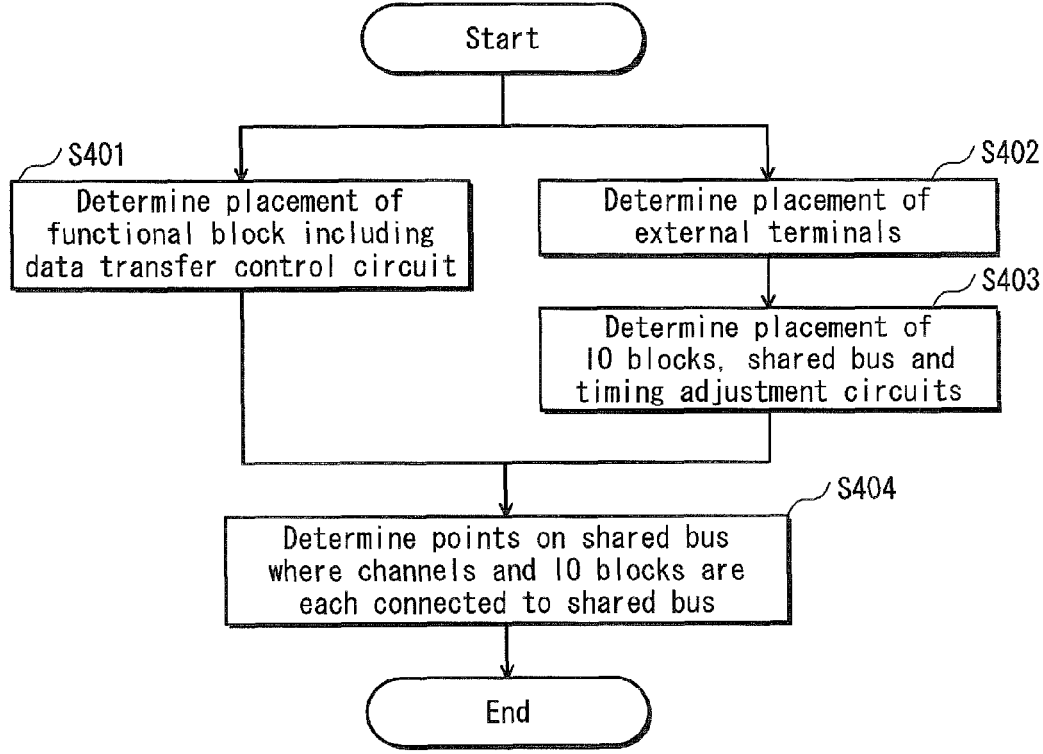

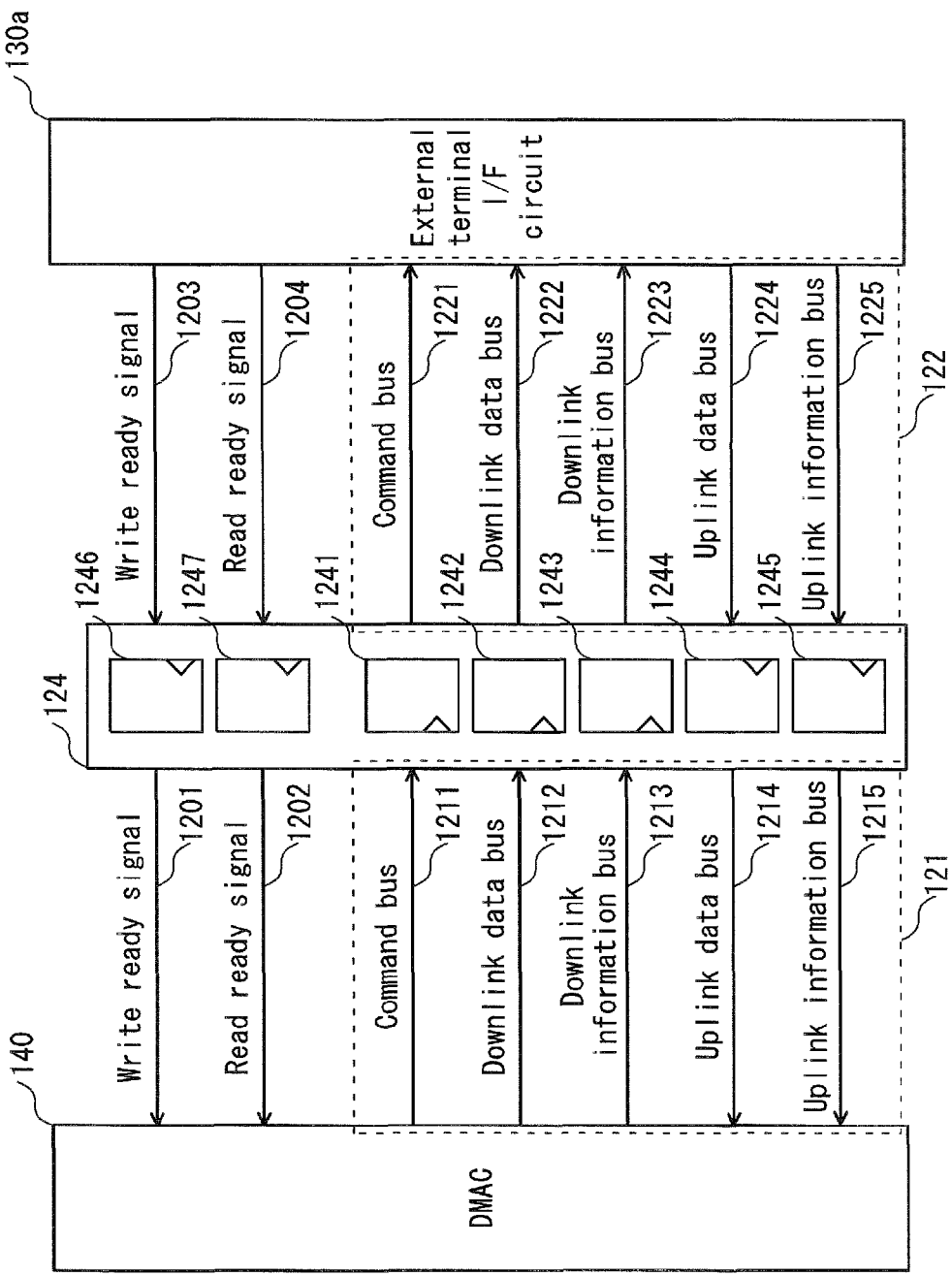

INTEGRATED CIRCUIT MANUFACTURING METHOD AND SEMICONDUCTOR INTEGRATED CIRCUIT

TECHNICAL FIELD

The present invention relates to a semiconductor integrated circuit and a method for manufacturing the semiconductor integrated circuit, and in particular, relates to layout design of circuit components.

BACKGROUND ART

A process of designing a semiconductor integrated circuit has been divided into two major steps, i.e., front-end design and back-end design. The front-end design is a step of creating a netlist by going through steps such as design of specifications for a semiconductor integrated circuit, functional design, test design and logic synthesis. On the other hand, the back-end design is a step of creating manufacturing data to be used in a manufacturing step by going through steps such as layout design and sign-off verification.

The layout design is further divided into two steps, i.e., floorplanning and wiring planning. The floorplanning is a step of determining placement of various blocks within the semiconductor integrated circuit such as a hard macro, a user macro and a RAM, taking into account timing and simplicity of wiring design. The wiring planning is a step of determining a route of wiring between a block whose placement has been determined in the floorplanning and a terminal, or between blocks, taking into account constraints on the wiring (e.g. constraints on connection between components and constraints on layers through which the components are connected). In brief, by going through the floorplanning and the wiring, the placement of components and wiring between the components are determined according to a function that the semiconductor integrated circuit is required to have.

With conventional technology, placement of external terminals has already been determined at the layout design stage, and placement of a block having an external terminal I/F (Inter Face) circuit to be connected to the external terminal is ideally determined in the floorplanning such that the block is placed close to the external terminal. Alternatively, the placement of the external terminals is ideally determined such that a distance between the external terminal and the block having the external terminal I/F circuit whose placement is determined in the floorplanning is reduced as much as possible. This is because, by reducing a wiring length between the external terminal and the external terminal I/F circuit (or the block having the external terminal I/F circuit) as much as possible, a transfer delay therebetween is suppressed.

The placement of the external terminals, however, is closely related to board design, noise design and the like. Therefore, the external terminal is not necessarily placed in such a position that a load on the layout design can be reduced. In addition, complexity of uses of the external terminal has tended to increase (tendency of a single external terminal to have a plurality of functions has increased) in recent years, and thus determination of the placement of the external terminals has tended to be delayed. Therefore, placement of the external terminal assumed in the floorplanning can be different from placement of the external terminal actually specified, and thus the wiring length between the external terminal and the block having the external terminal I/F circuit can increase. The following describes an example of such a case with use of FIGS. 35A and 35B.

FIG. 35A illustrates an example of a configuration of a semiconductor integrated circuit. An internal block of the semiconductor integrated circuit illustrated in FIG. 35A is composed of five functional blocks, i.e., a block A, a block B, a block C, a block D and a block E. Although not illustrated, suppose that each block includes various components and wiring connecting the components.

As illustrated in FIG. 35A, suppose that layout of functional blocks, wiring, components (external terminal I/F circuits (130a and 130b) and an internal circuit (140)) and the like is determined based on placement of external terminals (110a and 110b) determined in advance. Suppose that, however, the placement of the external terminals is changed later. In such a case, as illustrated in FIG. 35B, the wiring length between the external terminal and the external terminal I/F circuit increases compared with a case illustrated in FIG. 35A. In some cases, the wiring length between the external terminal and the external terminal I/F circuit can deviate from an ideal length. Due to a signal transfer delay occurring by an increase in wiring length, a signal may not be input at an appropriate timing.

Non-Patent Literature 1 discloses that part of the layout design is performed at the front-end design stage.

CITATION LIST

Non-Patent Literature

[Non-Patent Literature 1]
Tech-on [News] "meaningful 'design planning' advocated by NEC" [searched on the internet on Mar. 16, 2010] <URL: http://techon.nikkeibp.co.jp/article/NEWS/20070329/129739/?P=3>

SUMMARY OF INVENTION

Technical Problem

Determination of the placement of the external terminals has tended to be delayed in semiconductor integrated circuit design in recent years for the following reasons: increased tendency of the external terminal to have various uses, which is associated with multiple functionalities of a device on which the semiconductor integrated circuit is to be mounted; a delay in a decision on a specification for the device on which the semiconductor integrated circuit is to be mounted; and a delay in a decision on a policy to unify specifications for semiconductor integrated circuits to be mounted on different devices.

Therefore, the wiring length tends to increase as describe above. This can cause problems that time and costs are increased in the layout design of the semiconductor integrated circuit.

The present invention has been conceived in view of the above problems. A purpose of the present invention is to provide an integrated circuit manufacturing method using a layout design method that reduces cost even when the determination of the placement of the external terminals is delayed, and a semiconductor integrated circuit manufactured by the integrated circuit manufacturing method.

Solution to Problem

In order to solve the above-presented problems, one aspect of the present invention is an integrated circuit manufacturing method including: a layout design step of creating a mask pattern for integrated circuit manufacturing; and a manufacturing step of manufacturing an integrated circuit on a semiconductor material using the mask pattern, wherein the layout design step includes: a first step of determining placement of a functional block; a second step of determining placement of a plurality of IO (Input-Output) terminals for connecting the integrated circuit to an external device; a third step of determining placement of one or more IO blocks each to be connected to any of the plurality of IO terminals, according to the placement of the plurality of IO terminals determined in the second step; and a fourth step of determining placement of one or more buses each connecting a different one of the IO blocks to the functional block, and determining (i) a number of timing adjustment circuits to be inserted into each of the buses according to a wiring length of the bus and (ii) placement of the determined number of timing adjustment circuits, the timing adjustment circuits each adjusting timing of signals flowing through the bus.

Advantageous Effects of Invention

With the above-mentioned configuration, when the placement of the external terminals is determined after the placement of each functional block and wiring are determined, the placement of the IO blocks (also, referred to as IO cores) is determined such that each IO block corresponds to any of the external terminals. Therefore, it becomes unnecessary to take into account timing adjustment in data transfer between the IO block and the external terminal. Furthermore, by inserting the timing adjustment circuits into the wiring connecting the IO block to the data transfer control circuit according to the wiring length, the transfer delay is prevented. By going through the first, second, third and fourth steps described above, layout design of the functional block is performed without determining the placement of the external terminals. When the placement of the external terminals is determined, the layout design of the semiconductor integrated circuit is performed without changing the placement of each functional block and the like.

BRIEF DESCRIPTION OF DRAWINGS

FIGS. 4A and 4B are each flow charts showing a layout design method for a semiconductor integrated circuit pertaining to Modification 1.

FIG. 10 is a functional block diagram illustrating a configuration of a slice group 124 pertaining to Embodiment 2.

DESCRIPTION OF EMBODIMENTS

The following describe, as an embodiment of the present invention, a layout design method for a semiconductor integrated circuit and a semiconductor integrated circuit manufactured by the layout design method, with reference to the drawings.

Embodiment 1

Figure 1A:
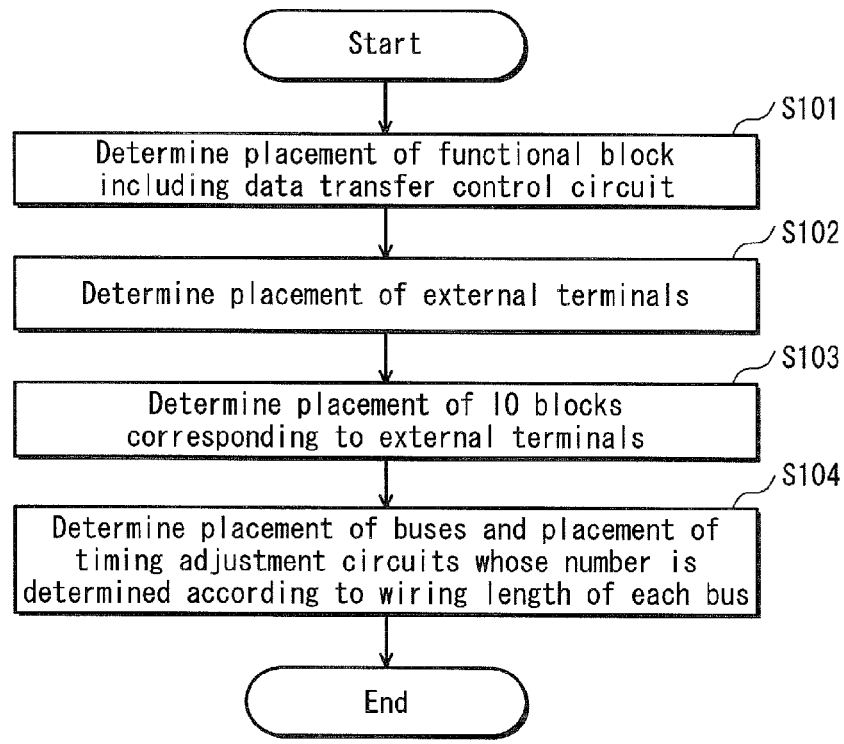
FIGS. 1A and 1B are each flow charts showing a layout design method for a semiconductor integrated circuit pertaining to Embodiment 1.

Embodiment 1 describes the layout design method for a semiconductor integrated circuit with reference to a flow chart of FIG. 1A.

As shown in FIG. 1A, in the layout design method for a semiconductor integrated circuit in Embodiment 1, placement of functional blocks including a data transfer control circuit is determined at first (step S101). The functional blocks are determined according to a specification required for the semiconductor integrated circuit. The data transfer control circuit has a function of performing data transfer with a circuit and a device to which the designed semiconductor integrated circuit is to be connected. The data transfer control circuit is, for example, a DMAC (Direct Memory Access Controller). That is to say, the data transfer control circuit is a circuit having a master function of the data transfer.

With such a configuration, design within the semiconductor integrated circuit is completed even if placement of external terminals is not determined.

When the specification for placement of the external terminals is actually determined, placement of the external terminals within the semiconductor integrated circuit is determined according to the determined specification (step S102).

After the placement of the external terminals is determined, placement of a plurality of IO blocks each corresponding to any of the external terminals is determined (step S103). Specifically, the placement of the IO blocks is determined such that each IO block is placed close to a corresponding external terminal. That is to say, at least one IO block is placed close to any of the external terminals. The term "close to" indicates the IO block is placed within such a distance that there is no need to adjust timing, i.e. to adjust a delay of signals flowing between the external terminal and the IO block, in the data transfer between the external terminal and the IO block.

After the placement of the IO blocks is determined, placement of buses each connecting a different one of the IO blocks to the data transfer control circuit is determined. Timing adjustment circuits whose number (number of stages to be adjusted) is determined according to a wiring length of each of the buses are inserted into the bus. Each of the timing adjustment circuits has a function of retiming a wiring delay of a signal line. Examples of the timing adjustment circuit are a flip-flop and a latch. The retiming is to output a signal obtained by synchronizing an input signal with a cycle of an operation clock used during operation of the semiconductor integrated circuit. While a plurality of signals flow through the bus, depending on the wiring length and a material of the bus, the signals individually become out of synchronization (in other words, out of phase) with the cycle of the operation clock of the semiconductor integrated circuit, i.e. each of the signals becomes out of phase with the cycle while flowing through the bus, and this can interfere with normal operation of the semiconductor integrated circuit. Therefore, it is necessary to adjust the phase difference. The timing adjustment circuit takes the role. Note that, although wiring for the operation clock and the like are not illustrated in the drawings, they are naturally included. The semiconductor integrated circuit may be equipped with a crystal oscillator and the like for generating the operation clock. The operation clock may be supplied from outside the semiconductor integrated circuit.

Figure 1B:
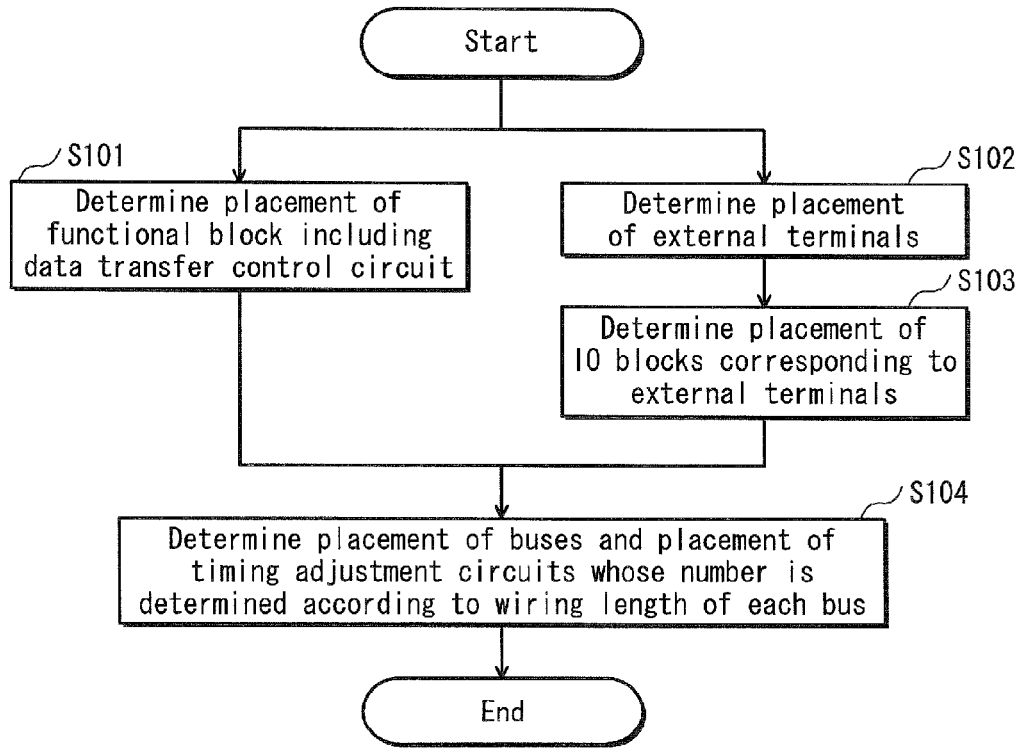

The layout design method shown in the flow chart of FIG. 1A may be changed to that shown in the flow chart of FIG. 1B. That is to say, processing of determining the placement of the functional blocks in the step S101 may be performed in parallel with processing of determining the placement of the external terminals in the step S102 and processing of determining the placement of the IO blocks in the step S103, which follows the step S102.

Note that, although FIGS. 1A and 1B each show an example in which the data transfer control circuit is included in the functional blocks, the data transfer control circuit may not have to be included in the functional blocks. The layout design may be performed on the assumption that the data transfer control circuit is included in each of the IO blocks, or is placed so as to correspond to each of the IO blocks.

Figure 2A:
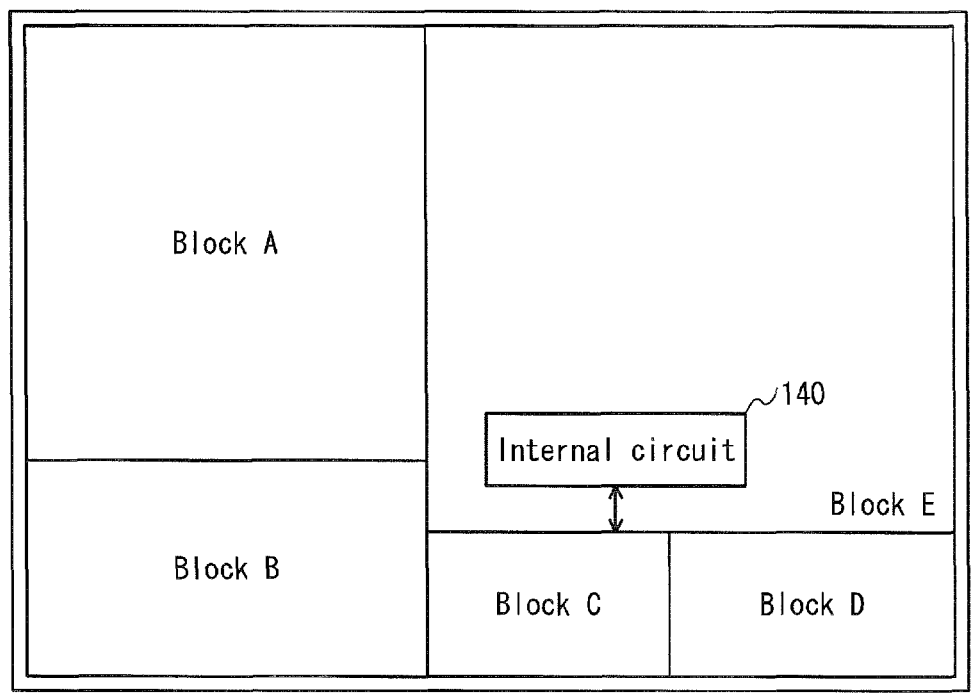
FIGS. 2A and 2B illustrate transition of layout of the semiconductor integrated circuit pertaining to Embodiment 1.
Figure 2B:
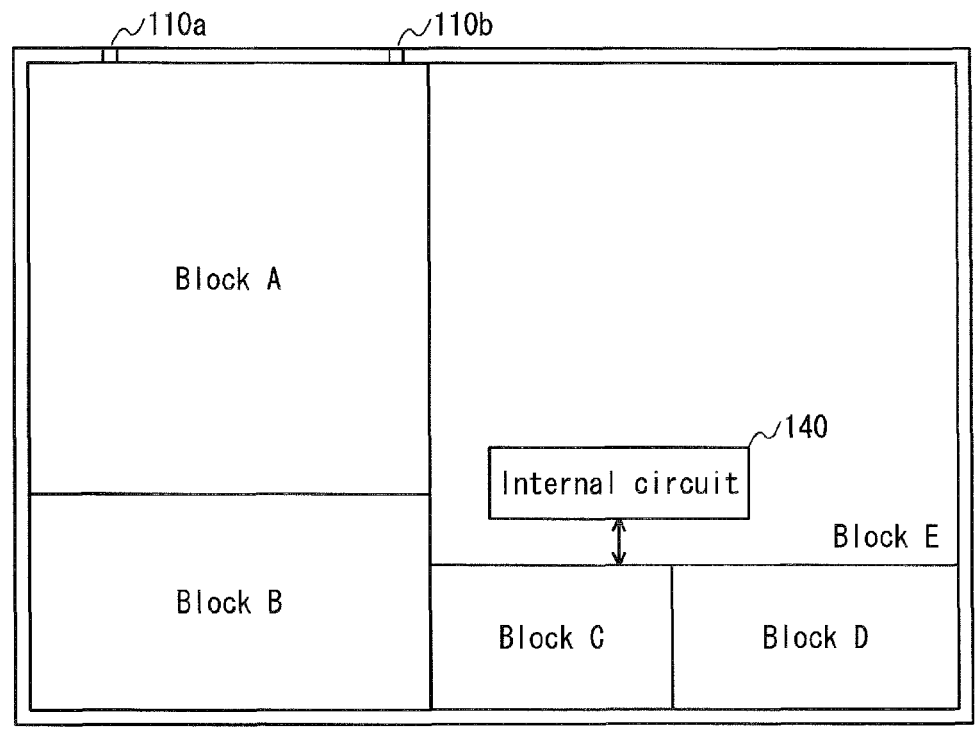

FIGS. 2A and 2B illustrate a specific example of designing the semiconductor integrated circuit in accordance with the layout design method shown in FIGS. 1A and 1B.

At first, as illustrated in FIG. 2A, placement of the functional blocks (blocks A, B, C, D and E) and an internal circuit 140 as the data transfer control circuit is determined. The placement is determined according to areas in which components and wiring connecting the components, which are determined based on a specification required for each functional block, are placed. In this case, a gap is left so that the bus connecting the IO blocks and the bus connecting each of the IO blocks to the internal circuit 140 can be placed. Although not illustrated in FIG. 2A, suppose that the IO blocks are included in any of the functional blocks (blocks A, B, C, D and E) and have already been laid out.

Next, once a specification for placement of the external terminals is determined according to the configuration of a device on which the semiconductor integrated circuit is to be mounted and the like, placement of the external terminals is actually determined according to the specification, as illustrated as external terminals 110a and 110b in FIG. 2B, for example.

Figure 3A:
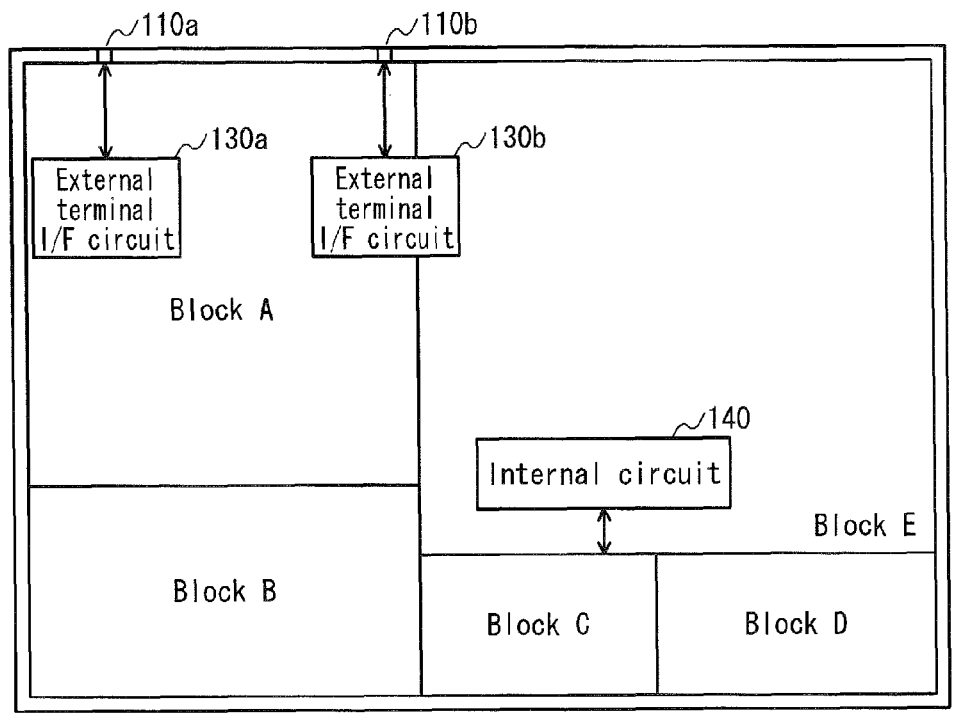
FIGS. 3A and 3B illustrate transition of layout of the semiconductor integrated circuit pertaining to Embodiment 1.

Then, placement of external terminal I/F circuits as the IO blocks is determined such that each of the external terminal I/F circuits is placed close to any one of the external terminals as illustrated in FIG. 3A, for example. That is to say, placement of an external terminal I/F circuit 130a is determined such that the external terminal I/F circuit 130a is placed close to the external terminal 110a, and placement of an external terminal I/F circuit 130b is determined such that the external terminal I/F circuit 130b is placed close to the external terminal 110b.

Figure 3B:
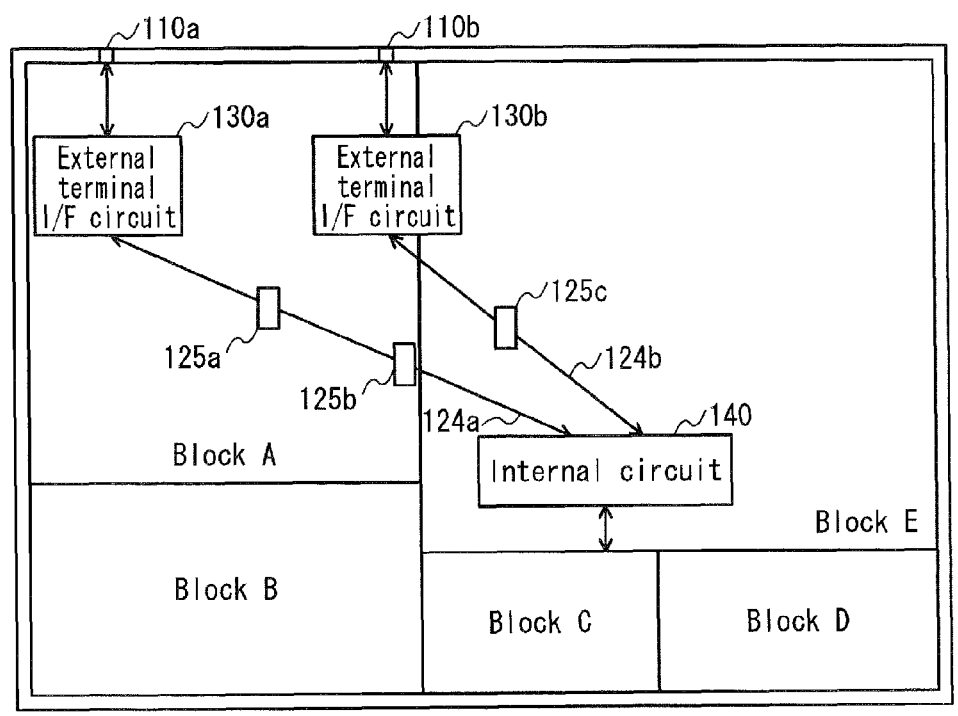

Then, placement of buses each connecting a different one of the external terminal I/F circuits 130a and 130b to the internal circuit 140 is determined as illustrated in FIG. 3B. That is to say, placement of a bus 124a connecting the internal circuit 140 to the external terminal I/F circuit 130a, and placement of a bus 124b connecting the internal circuit 140 to the external terminal I/F circuit 130b are determined as illustrated in FIG. 3B. Note that, although the internal circuit 140 is directly connected to each of the external terminal I/F circuits 130a and 130b in FIG. 3B, placement of the buses is actually determined such that each of the buses threads through components included in each block.

The number of slices as the timing adjustment circuits is determined according to a wiring length of the bus, which is determined after the placement of the bus is determined, and then placement (a point on the bus into which each slice is to be inserted) of the determined number of slices is determined. That is to say, as illustrated in FIG. 3B, placement of slices 125a and 125b is determined according to a wiring length of the bus 124a, and placement of a slice 125c is determined according to a wiring length of the bus 124b.

Note that, in FIGS. 2A, 2B, 3A and 3B, the internal circuit, the external terminal I/F circuits and slices are enlarged to increase visibility. An area required to place each component, however, is actually not as large as that illustrated in FIGS. 2A, 2B, 3A and 3B.

Summary

As described above, in the layout design method in Embodiment 1, after the layout of components included in each of one or more functional blocks including the data transfer control circuit and the wiring is determined, the placement of the external terminals is determined so that the external terminals are each placed in the required positions, and the placement of the IO blocks is determined so that each of the IO blocks is placed close to any one of the external terminals. With such a configuration, layout in which the placement of the external terminals and the IO blocks is close to ideal placement is achieved. In addition, by connecting each of the IO blocks to the data transfer control circuit by the bus, and by inserting, into the bus, timing adjustment circuits whose number is determined according to the wiring length of the bus, it is possible to manufacture the semiconductor integrated circuit in which timing of signals is adjusted and that operates normally.

Therefore, the layout design of the semiconductor integrated circuit is performed more flexibly without causing problems such as a change of a floorplan due to a change of the placement of the external terminals, and costs of the layout design are reduced.

Modification 1

In the layout design method in Embodiment 1, the layout design is performed so as to provide the buses for connecting each of the external terminal I/F circuits to the internal circuit. With this structure, however, it is necessary to provide as many buses as the external terminal I/F circuits. There is a problem that an area of the semiconductor integrated circuit increases accordingly.

In order to solve the above-presented problem, Modification 1 discloses a layout design method that can reduce the area of the semiconductor integrated circuit, compared with the method in Embodiment 1 described above.

Modification 1 is different from Embodiment 1 in that the bus is not provided for each external terminal I/F circuit, but a shared bus is used to connect the external terminal I/F circuits.

FIG. 4A is a flow chart showing a layout design method pertaining to Modification 1.

The layout design method shown in the flow chart of FIG. 4A is different from the method shown in the flow chart of FIG. 1A in processing in a step S403 onward. Processing in steps S401 and S402 is respectively the same as the processing in the steps S101 and 102, and thus description thereof is omitted here.

After the placement of the external terminals is determined in the step S402, the placement of the external terminal I/F circuits as the IO blocks is determined. According to the determined placement of the external terminal I/F circuits, placement of the shared bus is determined such that the shared bus is placed as close as possible to all the external terminal I/F circuits. Then, placement of wiring connecting the internal circuit as the data transfer control circuit to the shared bus is determined such that the wiring length is reduced as much as possible. According to a wiring length from the internal circuit, i.e., at regular intervals from the internal circuit, placement, on the shared bus, of slices as the timing adjustment circuits is determined (step S403).

Points on the shared bus where the plurality of channels and the external terminal I/F circuits as the IO blocks are each connected to the shared bus is determined. Then, placement of wiring connecting each of the plurality of channels and the external terminal I/F circuits to the shared bus is determined (step S404).

The layout design method shown in the flow chart of FIG. 4A may be changed to that shown in the flow chart of FIG. 4B. That is to say, processing of determining the placement of the functional blocks in the step S401 may be performed in parallel with processing of determining the placement of the external terminals in the step S402 and processing of determining the placement of the IO blocks, the shared bus and the timing adjustment circuits in the Step S403, which follows the Step S402.

Note that, although FIGS. 4A and 4B each show an example in which the data transfer control circuit is included in the functional blocks, the data transfer control circuit may not have to be included in the functional blocks. The layout design may be performed on the assumption that the data transfer control circuit is included in each of the IO blocks, or is placed so as to correspond to each of the IO blocks.

Figure 5A:
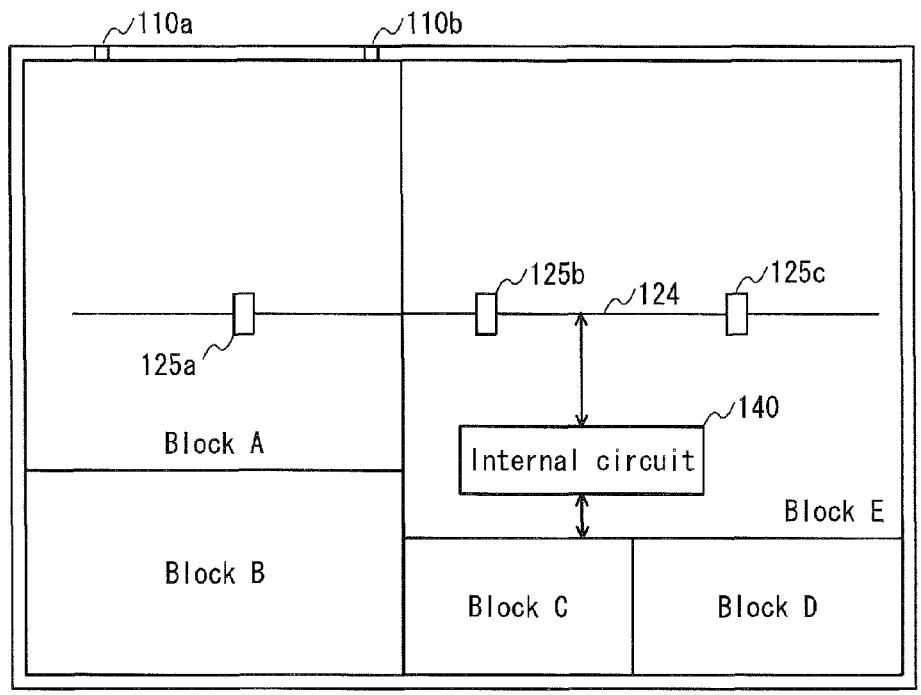
FIGS. 5A and 5B illustrate transition of layout of the semiconductor integrated circuit pertaining to Modification 1.
Figure 5B:
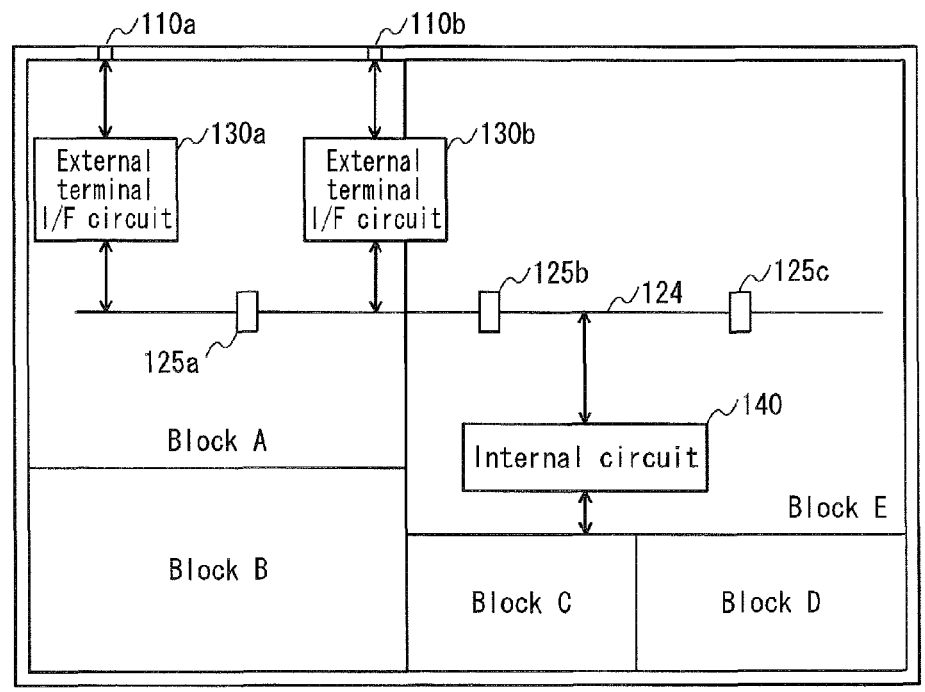

Although FIGS. 4A, 4B and 5B each show an example in which the functional blocks and the IO blocks are connected in a bus topology, the functional block and each of the IO blocks may be connected to each other in a daisy-chain topology. Whether to connect them in the bus topology or in the daisy-chain topology is determined according to a design specification. The layout design is performed according to the design specification.

FIGS. 2A, 2B, 5A and 5B illustrate a specific example of performing the layout design in accordance with the layout design method in Modification 1.

By going through the processing in the steps S401 and S402, the layout as illustrated in FIG. 2B is achieved. Processing performed so far is as described in Embodiment 1.

In Modification 1, however, layout as illustrated in FIG. 5A is achieved by going through the processing in the Step S403.

As illustrated in FIG. 5A, Modification 1 is different from Embodiment 1 described above in that, after the placement of the external terminals (110a and 110b) is determined, the placement of the shared bus 124 to be connected to the external terminals is determined in the Step S403. Then, a point on the shared bus where the internal circuit 140 is connected to the shared bus is determined, and placement of wiring connecting the internal circuit 140 to the shared bus 124 is determined. According to a distance from the internal circuit 140, placement, on the shared bus 124, of slices 125a, 125b and 125c as the timing adjustment circuits is determined. That is to say, the slices are placed at regular intervals from the internal circuit 140.

According to a wiring length between each of the external terminal I/F circuits 130a and 130b and the internal circuit 140 connected via the shared bus 124, the number of timing adjustment circuits to be inserted therebetween is determined, and points on the shared bus where the IO blocks are each connected to the shared bus are determined such that the determined number of timing adjustment circuits are inserted between each of the IO blocks and the internal circuit, as illustrated in FIG. 5B. In the example shown in FIG. 5B, a point on the shared bus 124 where the external terminal I/F circuit 130a is connected to the shared bus 124 is determined such that two slices, namely the slices 125a and 125b, are inserted between the external terminal I/F circuit 130a and the internal circuit 140. Also, a point on the shared bus 124 where the external terminal I/F circuit 130b is connected to the shared bus 124 is determined such that one slice, namely the slice 125b, is inserted between the external terminal I/F circuit 130b and the internal circuit 140.

Summary

In the layout design method for a semiconductor integrated circuit in Modification 1, even when determination of the placement of the external terminals is delayed, layout design in which the external terminals are placed is performed without significantly changing the layout design of the semiconductor integrated circuit. In addition, by using the shared bus as the bus connecting each of the external terminal I/F circuits to the internal circuit, the area of the semiconductor integrated circuit is reduced, compared with the case where the shared bus is not used.

Modification 2

Modification 1 described above presents the layout design using the shared bus as the bus connecting each of the external terminal I/F circuits to the internal circuit. Modification 2 presents a more convenient layout design method.

Modification 2 is different from Modification 1 described above in timing of determining the placement of the shared bus. That is to say, Modification 2 is different from Modification 1 in that the placement of the shared bus is determined before the placement of the external terminals is determined.

Figure 6A:
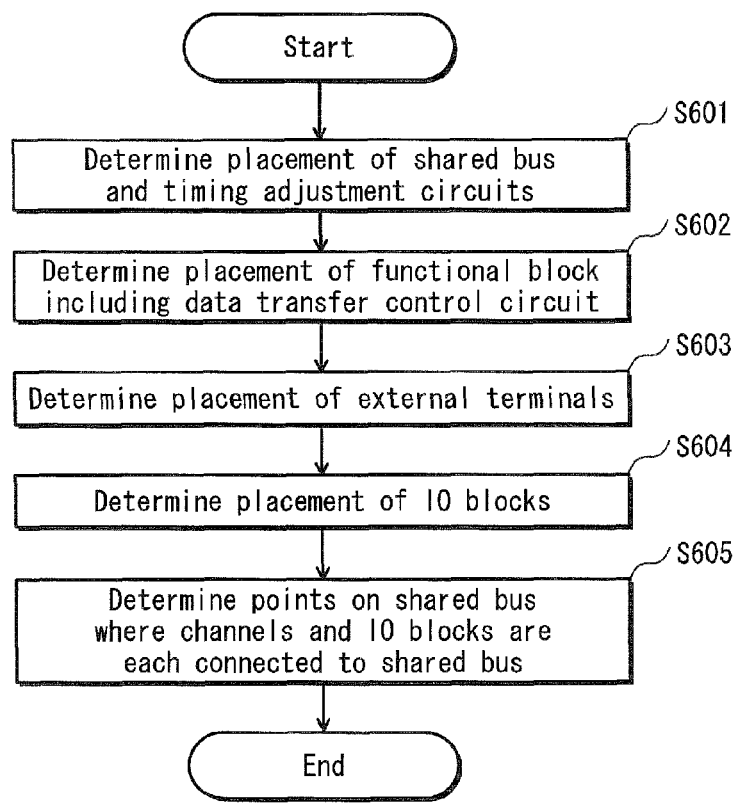
FIGS. 6A and 6B are each flow charts showing a layout design method for a semiconductor integrated circuit pertaining to Modification 2.
Figure 6B:
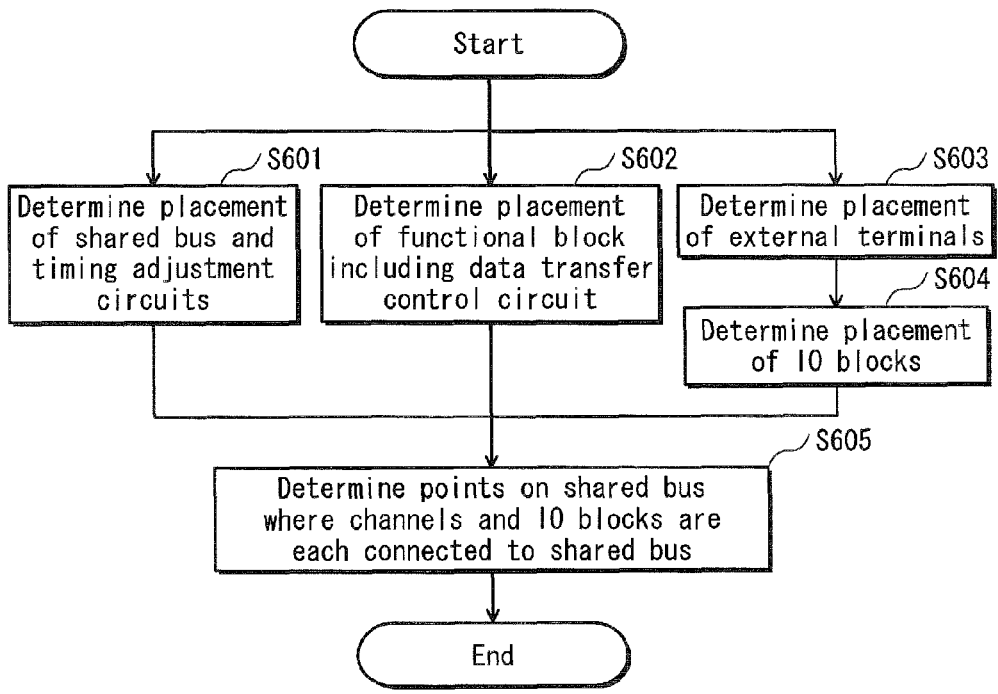

FIGS. 6A and 6B are each flow charts showing the layout design method pertaining to Modification 2.

As shown in the flow chart of FIG. 6A, a size of a semiconductor integrated circuit is determined first according to a specification required for the semiconductor integrated circuit to be designed, and then placement of the shared bus is determined. Then, placement of the timing adjustment circuits for adjusting timing of signals flowing through the shared bus is determined (step S601). The placement of the shared bus is determined such that the shared bus is connectable to any internal circuits and is placed as close as possible to the periphery of the semiconductor integrated circuit, at which the external terminals are to be placed. The timing adjustment circuits should be placed according to the wiring length between each of the internal circuits to an external terminal. Therefore, in this case, the placement of the timing adjustment circuits is determined such that the timing adjustment circuits are placed on the shared bus at regular intervals.

Next, according to the specification required for the semiconductor integrated circuit to be designed, placement of the functional blocks including the data transfer control circuit is determined (step S602). Note that, in the case of FIG. 6A, the processing in the Step S602 may be performed before the processing in the Step S601.

After the placement of the shared bus, the timing adjustment circuits and the functional blocks including the data transfer control circuit is determined, the specification for placement of the external terminals is determined according to the specification required for the semiconductor integrated circuit, and the placement of the external terminals is determined according to the determined specification (step S603).

After the placement of the external terminals is determined, the placement of the IO blocks is determined such that each of the IO blocks corresponds to any one of the external terminals, as described in Embodiment 1 (step S604).

After the placement of the IO blocks is determined, points on the shared bus where the IO blocks are each connected to the shared bus are determined (step S605). The points on the shared bus where the IO blocks are each connected to the shared bus are determined such that the wiring length between each of the IO blocks and the shared bus is reduced as much as possible.

The layout design method shown in the flow chart of FIG. 6A may be changed to that shown in the flow chart of FIG. 6B. That is to say, (i) processing of determining the placement of the shared bus and the timing adjustment circuits in the Step S601 may be performed in parallel with (ii) processing of determining the placement of the functional blocks in the Step S602 and (iii) processing of determining the placement of the external terminals in the Step S603 and processing of determining the placement of the IO blocks in the Step S604, which follows the Step S603.

Note that, although FIGS. 6A and 6B each show an example in which the data transfer control circuit is included in the functional blocks, the data transfer control circuit may not have to be included in the functional blocks. The layout design may be performed on the assumption that the data transfer control circuit is included in each of the IO blocks, or is placed so as to correspond to each of the IO blocks.

Figure 8:
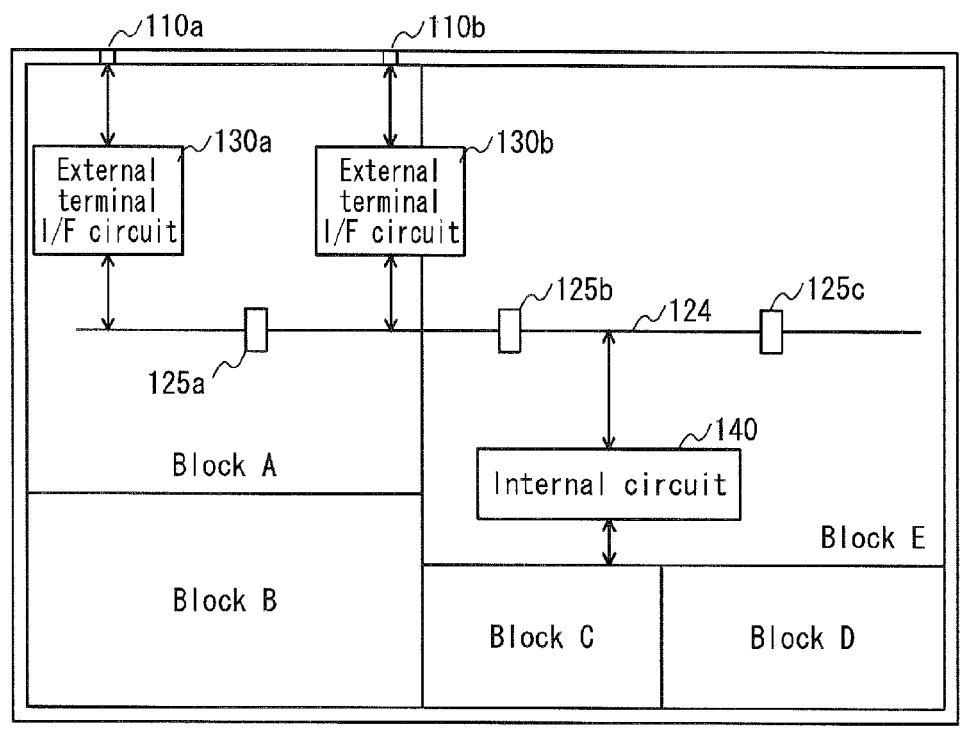
FIG. 8 illustrates transition of layout of the semiconductor integrated circuit pertaining to Modification 2.

Although FIGS. 6A, 6B and 8 each show an example in which the functional block and each of the IO blocks are connected in a bus topology, the functional block and each of the IO blocks may be connected to each other in a daisy-chain topology. Whether to connect them in the bus topology or in the daisy-chain topology is determined according to a design specification. The layout design is performed according to the design specification.

Figure 7A:
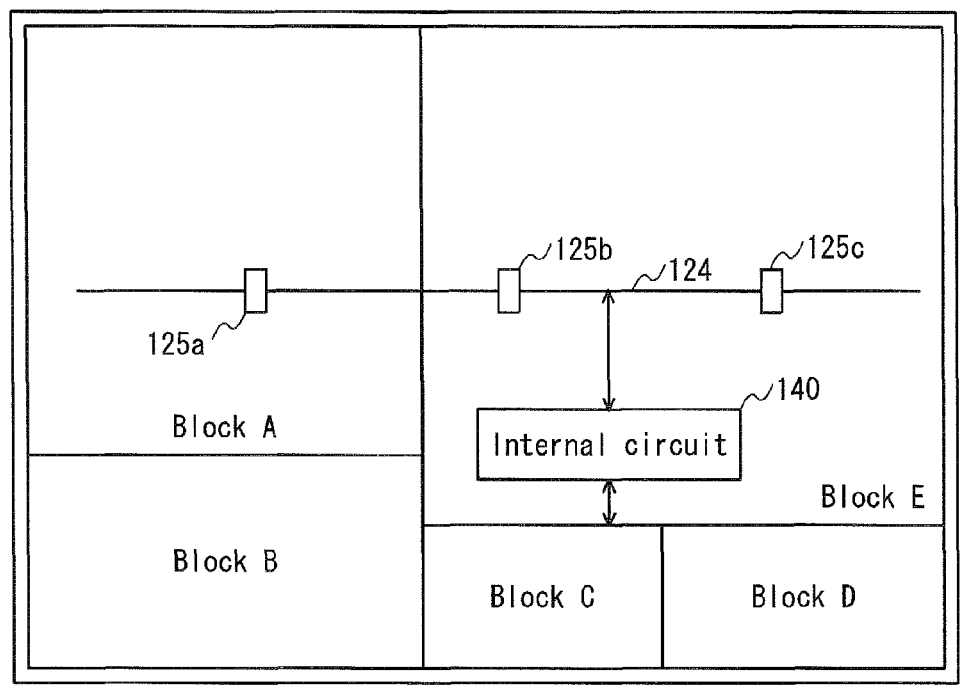
FIGS. 7A and 7B illustrate transition of layout of the semiconductor integrated circuit pertaining to Modification 2.
Figure 7B:
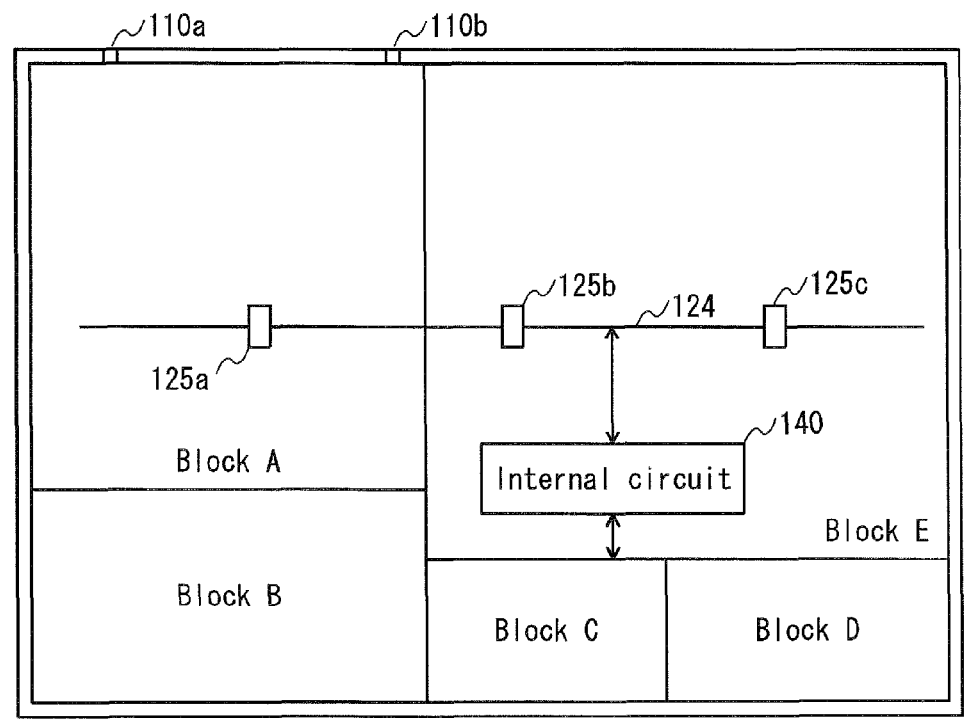

The following describes an example of the layout design performed in accordance with the above-mentioned method, with use of FIGS. 7A, 7B and 8.

As illustrated in FIG. 7A, in Modification 2, the placement of the internal circuit 140 and the functional blocks as well as the shared bus 124 is determined first according to the size of and the specification required for the semiconductor integrated circuit and the size of each of the functional blocks including the internal circuit 140 as the data transfer control circuit.

Next, as illustrated in FIG. 7B, the placement of the external terminals 110a and 110b is determined according to the determined specification for the placement of the external terminals 110a and 110b.

After the placement of the external terminals 110a and 110b is determined, the placement of the external terminal I/F circuits is determined such that each of the external terminal I/F circuits corresponds to any one of the external terminals 110a and 110b, as illustrated in FIG. 8.

According to a distance from each of the external terminal I/F circuits to the internal circuit 140, points on the shared bus where the external terminal I/F circuits are each connected to the shared bus 124 are determined, and the placement of wiring connecting a different one of the external terminal I/F circuits to the shared bus 124 is determined.

Summary

In the layout design method in Modification 2, since the placement of the shared bus is determined before the placement of the external terminals is determined, the number of design steps after the placement of the external terminals is determined is reduced compared with the case described in Modification 1.

Embodiment 2

Embodiment 2 explains a configuration and operations of a semiconductor integrated circuit manufactured by the layout design method in each modification described above.

Figure 9:
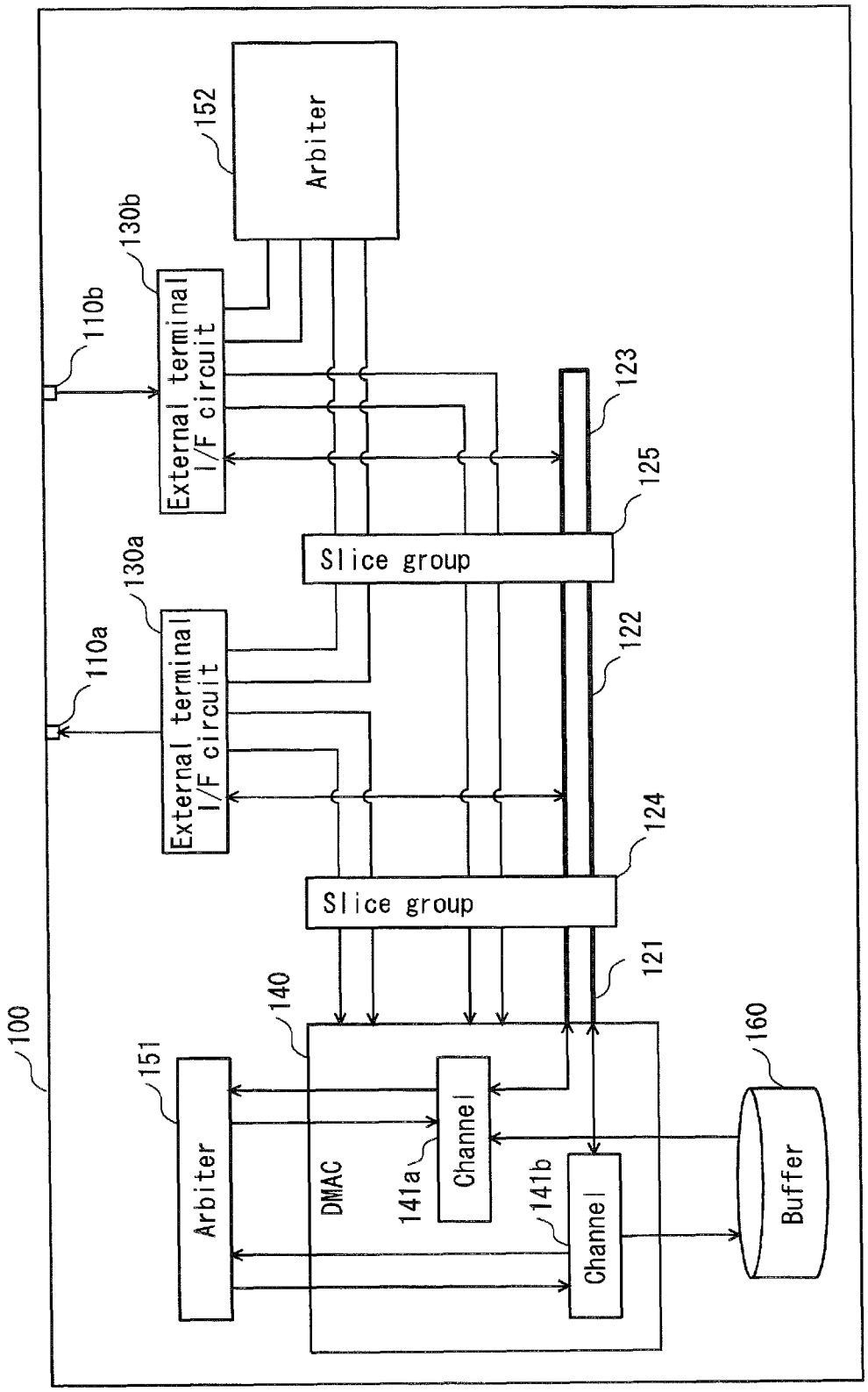
FIG. 9 is a functional block diagram illustrating a functional configuration of a semiconductor integrated circuit pertaining to Embodiment 2.

FIG. 9 is a functional block diagram illustrating a functional configuration of a semiconductor integrated circuit 100.

As illustrated in FIG. 9, the semiconductor integrated circuit 100 includes external terminals 110a and 110b, slice buses 121, 122 and 123, slice groups 124 and 125, external terminal I/F circuits 130a and 130b, a DMAC (Direct Memory Access Controller) 140, arbiters 151 and 152 and a buffer 160. In order to clarify that the DMAC in Embodiment 2 corresponds to the internal circuit 140 in Embodiment 1, the same reference sign is used, although a different reference sign should be used for the DMAC.

The external terminals 110a and 110b are respectively connected to the external terminal I/F circuits 130a and 130b. Each of the external terminals 110a and 110b is a terminal for connecting the semiconductor integrated circuit 100 to a circuit and the like on a device on which the semiconductor integrated circuit 100 is to be mounted. Each of the external terminals 110a and 110b is composed of at least one terminal.

The slice buses 121, 122 and 123 are signal lines for transmitting signals between the slice group 124 and the DMAC 140, and between the slice group 124 and the slice group 125.

The slice groups 124 and 125 each have a function of adjusting timing of input signals. Here, each slice adjusts timing of input signals within a time interval of a predetermined length. Specifically, each of the slice groups 124 and 125 is achieved by the flip-flop or the latch. Suppose here that each of the slice groups 124 and 125 has a function of retiming input signals. As described above, the retiming is to output a signal obtained by synchronizing an input signal with the cycle of the operation clock used during operation of the semiconductor integrated circuit. Note that, although the wiring for the operation clock and the like are not illustrated in the drawings, they are naturally included. The semiconductor integrated circuit may be equipped with the crystal oscillator and the like for generating the operation clock. The operation clock may be supplied from outside the semiconductor integrated circuit. The slice buses 121, 122 and 123, and the slice groups 124 and 125 constitute the shared bus.

The external terminal I/F circuits 130a and 130b each have functions of relaying external signals to the DMAC 140 and of transmitting signals transferred from the DMAC 140 to an external device connected thereto.

The DMAC 140 has a function of accessing the buffer 160 to read or write data. The DMAC 140 also has a function of performing communication with a circuit and a device connected to the semiconductor integrated circuit 100. The DMAC 140 performs the communication by using a plurality of channels that transfer data via individual paths, and includes a channel 141a and a channel 141b here.

In the present embodiment, the channel 141a transfers data from the buffer 160 to the external terminal I/F circuit 130a, and the channel 141b transfers data from the external terminal I/F circuit 130b to the buffer 160. Therefore, the semiconductor integrated circuit 100 uses the channel 141a to output information from the buffer 160 to the outside the semiconductor integrated circuit 100 via the shared bus, the external terminal I/F circuit 130a and the external terminal 110a. Also, the semiconductor integrated circuit 100 uses the channel 141b to input information from outside the semiconductor integrated circuit 100 to the buffer 160 via the external terminal 110b, the external terminal I/F circuit 130b and the shared bus.

The arbiters 151 and 152 each have a function of arbitrating signals that are input into the shared bus and to be transferred. Note that the arbiter 151 arbitrates downlink signals from the DMAC 140 to the external terminal I/F circuit, and the arbiter 152 arbitrates uplink signals from the external terminal I/F circuit to the DMAC 140. The information transfer between the channel 141a and the external terminal I/F circuit 130a (hereinafter, referred to as information transfer A) is performed via the shared bus, and the information transfer between the channel 141b and the external terminal I/F circuit 130b (hereinafter, referred to as information transfer B) is also performed via the shared bus. Since the shared bus is used in both of the information transfer A and the information transfer B, it is necessary to be granted the shared bus before performing each of the information transfer A and the information transfer B. The arbiters 151 and 152 each play a role in arbitration of the bus request.

The buffer 160 is a memory having a function of temporarily storing data transferred from the DMAC 140, the semiconductor integrated circuit 100 and the like. The buffer 160 also has functions of holding data written by the DMAC 140 and of outputting data, from among the held data, required by the DMAC 140.

The following describes information transmitted/received between the DMAC 140 and the external terminal I/F circuit 130a, and signal connection for achieving the transmission/reception of information, with use of FIG. 10.

Between the DMAC 140 and the external terminal I/F circuit 130a, all or a subset of five pieces of information, namely a command, downlink data, downlink information, uplink data and uplink information, are transmitted/received via a shared bus 1200. The shared bus 1200 is composed of five buses, namely a command bus, a downlink data bus, a downlink information bus, an uplink data bus and an uplink information bus. The command bus is used to transmit/receive the command. The downlink data bus is used to transmit/receive the downlink data. The downlink information bus is used to transmit/receive the downlink information. The uplink data bus is used to transmit/receive the uplink data. The uplink information bus is used to transmit/receive the uplink information.

Signals constituting the command bus, the downlink data bus and the downlink information bus transfer information from the DMAC 140 to the external terminal I/F circuit 130a. Signals constituting the uplink data bus and the uplink information bus transfer information from the external terminal I/F circuit 130a to the DMAC 140.

The command is information indicating an attribute of data transmitted from the DMAC 140 to the external terminal I/F circuit 130a. Specifically, information transmitted/received by the command includes information indicating whether the data transfer is the transfer of the downlink data or the transfer of the uplink data, information on a size of the transferred data and information on a transfer address.

The downlink data is data and data synchronization information transmitted from the DMAC 140 to the external terminal I/F circuit 130a. The uplink data is data and data synchronization information transmitted from the external terminal I/F circuit 130a to the DMAC 140. Here, the data synchronization information is information indicating an attribute of the data and is transmitted in the same cycle as the data. Specifically, the data synchronization information includes information on byte enables of the data, final data transfer and the like.

The information is transmitted/received between the DMAC 140 and the external terminal I/F circuit 130a asynchronously with the data transfer. Specifically, as the uplink information, information including a transfer start request is transmitted from the external terminal I/F circuit 130a to the channel 141a, for example. As the downlink information, information including information indicating that data writing to the buffer 160 is completed is transmitted from the channel 141a to the external terminal I/F circuit 130a, for example.

Other than information transmitted/received via the shared bus 1200, information on write ready and information on read ready are transmitted from the external terminal I/F circuit 130a to the DMAC 140. The write ready is information indicating that the external terminal I/F circuit 130a is capable of receiving a command for transferring the downlink data. The read ready is information indicating that the external terminal I/F circuit 130a is capable of receiving a command for transferring the uplink data. In contrast to signals transmitted/received via the shared bus, the write ready and the read ready are signals connected via peer-to-peer networks between the external terminal I/F circuit 130a and the channel 141a, and between the external terminal I/F circuit 130b and the channel 141b.

In FIG. 10, the DMAC 140 and the external terminal I/F circuit 130a are connected by the shared bus, and the shared bus is sliced by the slice group 124. The DMAC 140 and the slice group 124 are connected by the slice bus 121, and the slice bus 121 is composed of a command bus 1211, a downlink data bus 1212, a downlink information bus 1213, an uplink data bus 1214 and an uplink information bus 1215. The slice group 124 and the external terminal I/F circuit 130a are connected by the slice bus 122, and the slice bus 122 is composed of a command bus 1221, a downlink data bus 1222, a downlink information bus 1223, an uplink data bus 1224 and an uplink information bus 1225.

The slice group 124 includes: a slice 1241 for slicing the command bus 1211 and the command bus 1221; a slice 1242 for slicing the downlink data bus 1212 and the downlink data bus 1222; a slice 1243 for slicing the downlink information bus 1213 and the downlink information bus 1223; a slice 1244 for slicing the uplink data bus 1214 and the uplink data bus 1224; a slice 1245 for slicing the uplink information bus 1215 and the uplink information bus 1225; a slice 1246 for slicing the write ready signal (described later); and a slice 1247 for slicing the read ready signal (described later).

The command is output from the DMAC 140 to the external terminal I/F circuit 130a via the command bus 1211, the slice 1241 and the command bus 1221. The downlink data is output from the DMAC 140 to the external terminal I/F circuit 130a via the downlink data bus 1212, the slice 1242 and the downlink data bus 1222. The downlink information is output from the DMAC 140 to the external terminal I/F circuit 130a via the downlink information bus 1213, the slice 1243 and the downlink information bus 1223.

The uplink data is output from the external terminal I/F circuit 130a to the DMAC 140 via the uplink data bus 1224, the slice 1244 and the uplink data bus 1214. The uplink information is output from the external terminal I/F circuit 130a to the DMAC 140 via the uplink information bus 1225, the slice 1245 and the uplink information bus 1215.

Other than signals transmitted/received via the shared bus, the write ready signal and the read ready signal are transmitted from the external terminal I/F circuit 130a to the DMAC 140, and respectively sliced by the slice 1246 and the slice 1247, similarly to the signals transmitted/received via the shared bus.

Although not illustrated in FIG. 10, the write ready signal and the read ready signal are also transmitted from the external terminal I/F circuit 130b to the DMAC 140. The slice group 124 also includes slices for slicing the write ready signal and the read ready signal transmitted from the external terminal I/F circuit 130b.

Figure 11A:
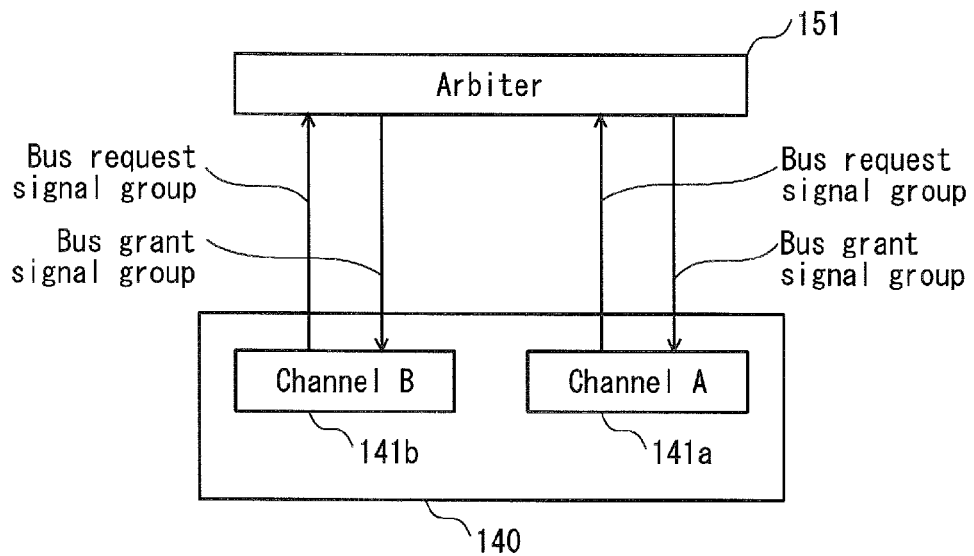
FIGS. 11A and 11B are functional block diagrams illustrating a configuration of a slice group 125 pertaining to Embodiment 2.

The following describes signal connection between the DMAC 140 and the arbiter 151, with use of FIG. 11A.

The arbiter 151 is placed close to the DMAC 140. The wiring between the DMAC 140 and the arbiter 151 is not sliced.

Each of the channels 141a and 141b is directly connected to the arbiter 151. A bus request signal group is transmitted from each of the channels 141a and 141b to the arbiter 151, and a bus grant signal group is transmitted from the arbiter 151 to each of the channels 141a and 141b.

The bus request signal group transmitted from each of the channels 141a and 141b to the arbiter 151 is composed of all or a subset of a command bus request signal, a downlink data bus request signal and a downlink information bus request signal. The bus grant signal group transmitted from the arbiter 151 to each of the channels 141a and 141b is composed of all or a subset of a command bus grant signal, a downlink data bus grant signal and a downlink information bus grant signal.

In order for the channel 141a to use the command bus, the channel 141a transmits the command bus request signal to the arbiter 151, and the arbiter 151 returns the command bus grant signal to the channel 141a. In order for the channel 141a to use the downlink data bus, the channel 141a transmits the downlink data bus request signal to the arbiter 151, and the arbiter 151 returns the downlink data bus grant signal to the channel 141a. In order for the channel 141a to use the downlink information bus, the channel 141a transmits the downlink information bus request signal to the arbiter 151, and the arbiter 151 returns the downlink information bus grant signal to the channel 141a. The same applies to the channel 141b.

Figure 11B:
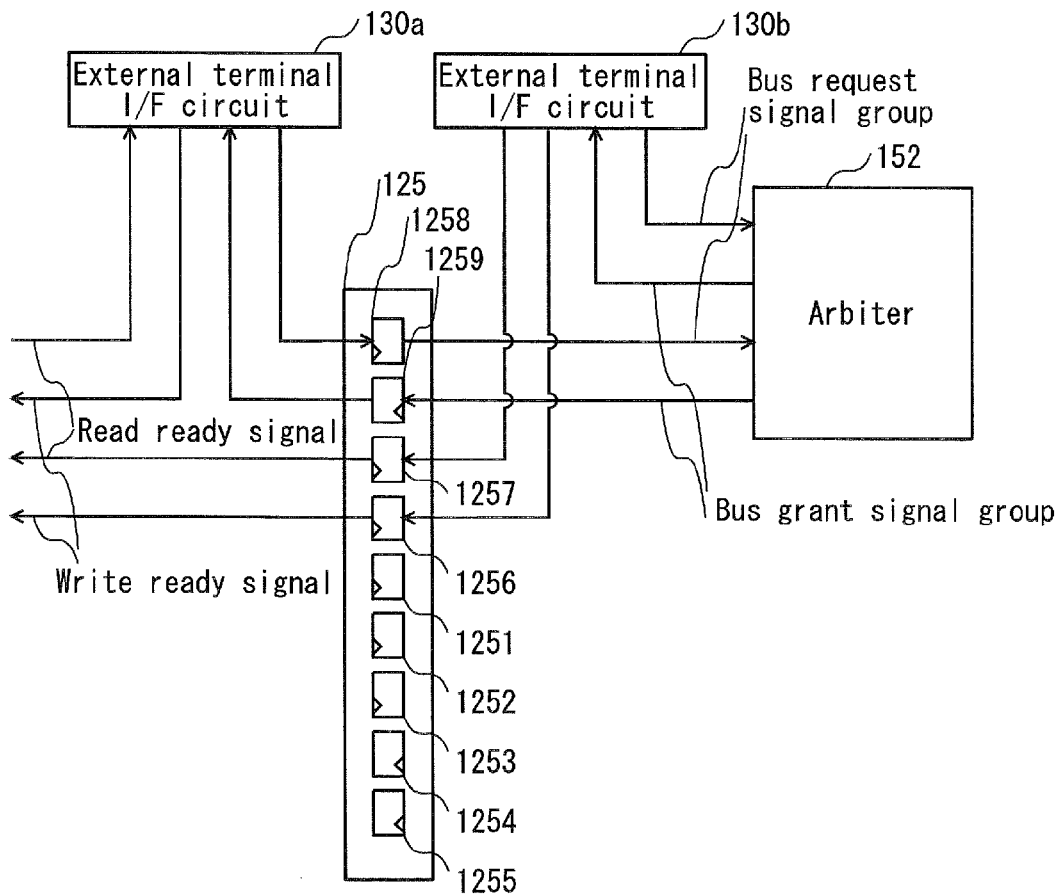

The following describes signal connection between an external terminal I/F circuit group 130 and the arbiter 152, with use of FIG. 11B. In the present embodiment, the external terminal I/F circuit 130b is placed away from the external terminal I/F circuit 130a, and the arbiter 152 is placed close to the external terminal I/F circuit 130b. Therefore, whereas the wiring between the external terminal I/F circuit 130a and the arbiter 152 is sliced by a slice group 1250, the wiring between the external terminal I/F circuit 130b and the arbiter 152 is not sliced.

Similarly to the slice group 1240, the slice group 1250 includes: slices 1251, 1252, 1253, 1254 and 1255 for slicing the shared bus (corresponding to the slices 1241, 1242, 1243, 1244 and 1245 constituting the slice group 1240); slices 1256 and 1257 for respectively slicing the write ready signal and the read ready signal transmitted from the external terminal I/F circuit 130b to the DMAC 140; and slices 1258 and 1259 for respectively slicing the bus request signal group and the bus grant signal group.

The bus request signal group is transmitted from the external terminal I/F circuit 130b to the arbiter 152, and the bus grant signal group is transmitted from the arbiter 152 to the external terminal I/F circuit 130b. Also, the bus request signal group is transmitted from the external terminal I/F circuit 130a to the arbiter 152 via the slice 1258, and the bus grant signal group is transmitted from the arbiter 152 to the external terminal I/F circuit 130a via the slice 1259.

The bus request signal group transmitted from each of the external terminal I/F circuits 130a and 130b to the arbiter 152 is composed of all or a subset of an uplink data bus request signal and an uplink information bus request signal. The bus grant signal group transmitted from the arbiter 152 to each of the external terminal I/F circuits 130a and 130b is composed of all or a subset of an uplink data bus grant signal and an uplink information bus grant signal.

In order for the external terminal I/F circuit 130a to use the uplink data bus, the external terminal I/F circuit 130a transmits the uplink data bus request signal to the arbiter 152, and the arbiter 152 returns the uplink data bus grant signal to the external terminal I/F circuit 130a. In order for the external terminal I/F circuit 130a to use the uplink information bus, the external terminal I/F circuit 130a transmits the uplink information bus request signal to the arbiter 152, and the arbiter 152 returns the uplink information bus grant signal to the external terminal I/F circuit 130a. The same applies to the external terminal I/F circuit 130b.

Figure 12A:
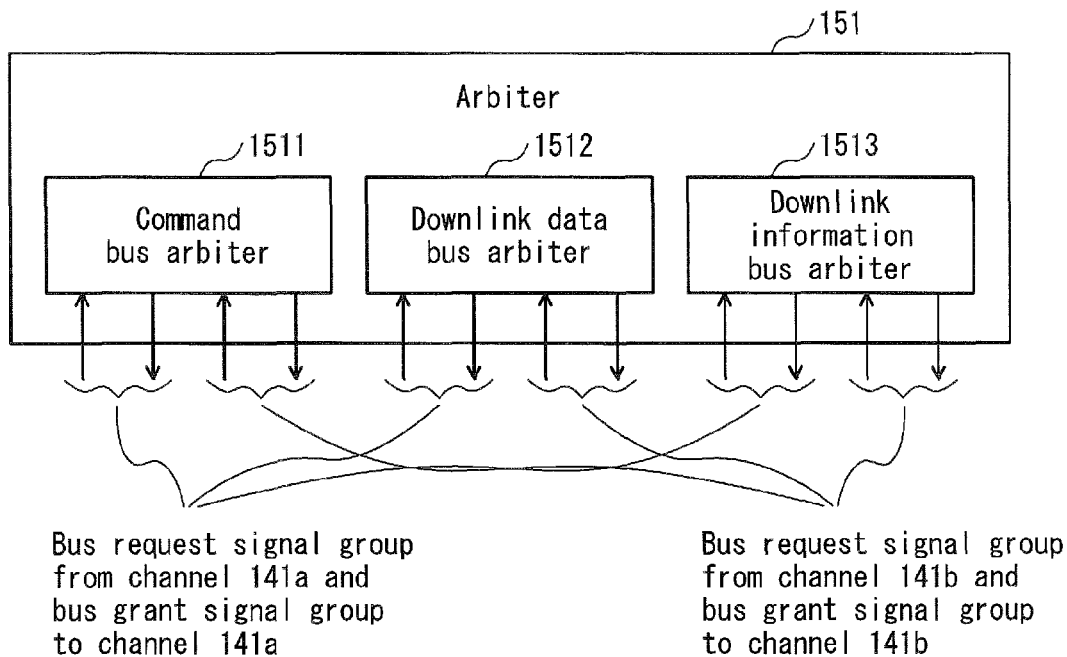
FIGS. 12A and 12B are functional block diagrams illustrating a configuration of an arbiter pertaining to Embodiment 2.
Figure 12B:
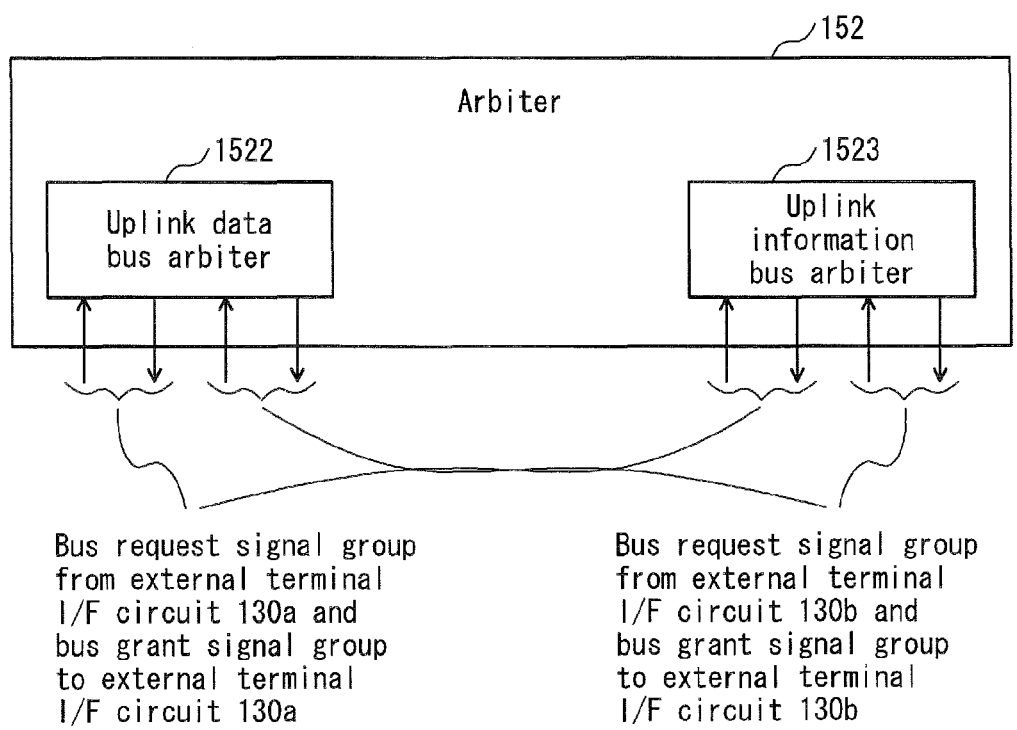

FIGS. 12A and 12B illustrate a configuration of the arbiter. FIG. 12A illustrates a configuration of the arbiter 151. The arbiter 151 includes a command bus arbiter 1511, a downlink data bus arbiter 1512 and a downlink information bus arbiter 1513.

The command bus arbiter 1511 receives the command bus request signal from each of the channels 141a and 141b, and returns the command bus grant signal to each of the channels 141a and 141b.

The downlink data bus arbiter 1512 receives the downlink data bus request signal from each of the channels 141a and 141b, and returns the downlink data bus grant signal to each of the channels 141a and 141b. The downlink information bus arbiter 1513 receives the downlink information bus request signal from each of the channels 141a and 141b, and returns the downlink information bus grant signal to each of the channels 141a and 141b.

FIG. 12B illustrates a configuration of the arbiter 152. The arbiter 152 includes an uplink data bus arbiter 1522 and an uplink information bus arbiter 1523.

The uplink data bus arbiter 1522 receives the uplink data bus request signal from each of the external terminal I/F circuits 130a and 130b, and returns the uplink data bus grant signal to each of the external terminal I/F circuits 130a and 130b.

The uplink information bus arbiter 1523 receives the uplink information bus request signal from each of the external terminal I/F circuits 130a and 130b, and returns the uplink information bus grant signal to each of the external terminal I/F circuits 130a and 130b.

The above is the configuration of each of the arbiters 151 and 152.

After being granted the command bus, the downlink data bus and the downlink information bus, the channel 141a or the channel 141b is allowed to use the shared bus within a cycle determined for each type of the shared bus (the command bus, the downlink data bus and the downlink information bus). The number of cycles may vary among circuits using the shared bus (the channels 141a and 141b).

Also, after being granted the uplink data bus and the uplink information bus, the external terminal I/F circuit 130a or the external terminal I/F circuit 130b is allowed to use the shared bus within a cycle determined for each type of the shared bus (the uplink data bus, the uplink information bus). The number of cycles may vary among circuits using the shared bus (the external terminal I/F circuits 130a and 130b).

Operations

Figure 13A:
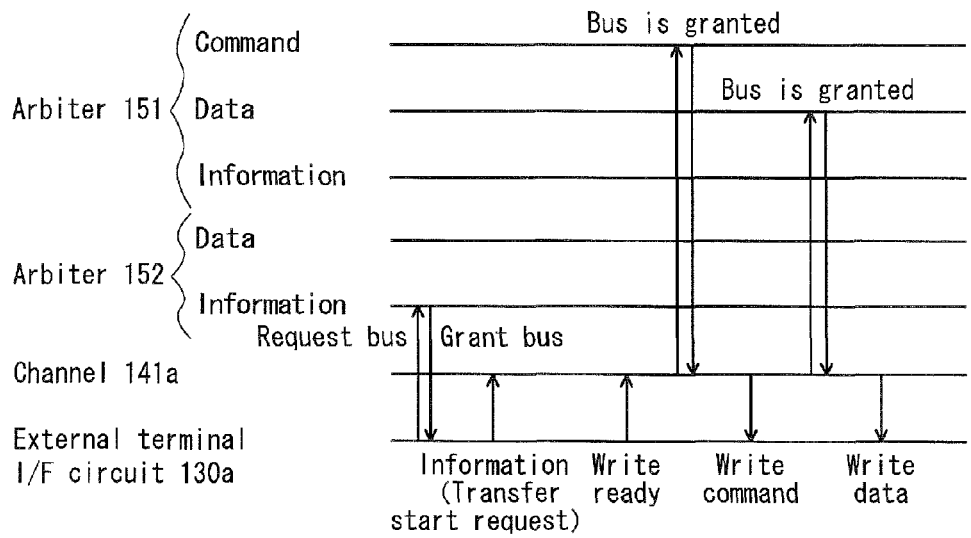
FIGS. 13A and 13B each illustrate an information transfer flow between a DMAC and an external terminal I/F circuit pertaining to Embodiment 2.
Figure 13B:
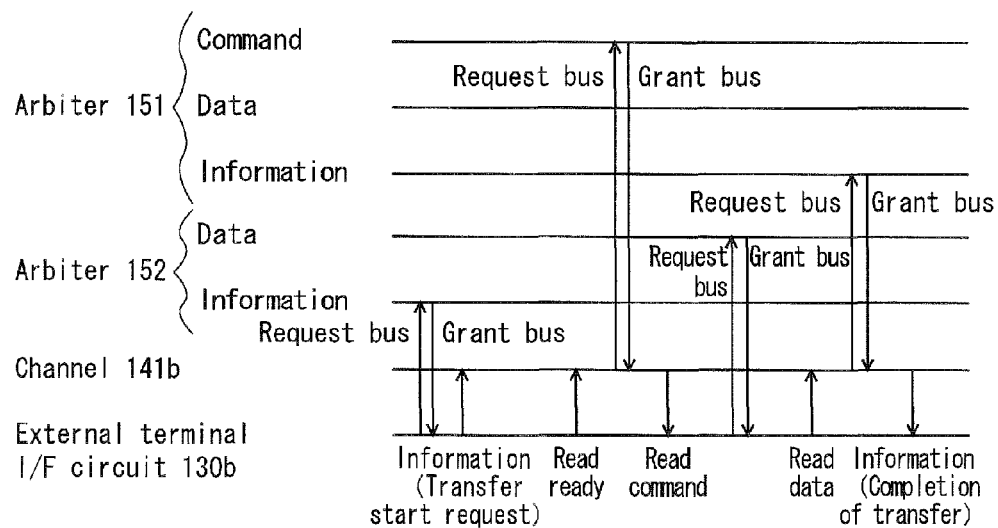

The following describes operations of the semiconductor integrated circuit 100, with use of the timing diagrams of FIGS. 13A and 13B, and flow charts of FIGS. 14, 15, 16 and 17.

A typical example of the data transfer between the channel 141a and the external terminal I/F circuit 130a is described with use of FIG. 13A, and a typical example of the data transfer between the channel 141b and the external terminal I/F circuit 130b is described with use of FIG. 13B. FIG. 13A illustrates an information transfer flow in the case of the data transfer from the channel 141a to the external terminal I/F circuit 130a.

In Embodiment 2, in order to perform the data transfer, the external terminal I/F circuit 130a transmits a transfer start request including size information of the transferred data to the channel 141a at first. In response to the transfer start request, the channel 141a starts the data transfer. The channel 141a does not transfer data having a size indicated by the size information at once, but performs the data transfer by dividing the data into a plurality of data pieces each having a predetermined size and transferring the plurality of data pieces one by one. When performing the data transfer, the channel 141a transmits the command, and then transmits the downlink data to the external terminal I/F circuit 130a. The processing is repeated until the transfer of the data having the indicated size is completed. Note that, when the size indicated in the transfer start request is smaller than the predetermined size, the data transfer is completed only by transferring the data having the indicated size at once.

FIG. 13A is a flow chart illustrating the transmission/reception of the transfer start request at the beginning of the data transfer, and the transmission/reception of the command and the data. The following describes the flow illustrated in FIG. 13A in detail.

At first, in order to transmit the transfer start request to the channel 141a, the external terminal I/F circuit 130a transmits the uplink information bus request signal to the arbiter 152. In response to this, the arbiter 152 returns the uplink information bus grant signal to the external terminal I/F circuit 130a. Upon receiving the uplink information bus grant signal, the external terminal I/F circuit 130a transmits the transfer start request to the channel 141a using the uplink information bus.

Upon receiving the transfer start request, the channel 141a transmits the command bus request signal to the arbiter 151 in order to transmit the command to the external terminal I/F circuit 130a. In response to this, the arbiter 151 returns the command bus grant signal to the channel 141a. Upon receiving the command bus grant signal, the channel 141a transmits the command to the external terminal I/F circuit 130a using the command bus.

After transmitting the command, the channel 141a transmits the downlink data bus request signal to the arbiter 151 in order to transmit the data to the external terminal I/F circuit 130a. In response to this, the arbiter 151 returns the downlink data bus grant signal to the channel 141a. Upon receiving the downlink data bus grant signal, the channel 141a transmits the data to the external terminal I/F circuit 130a using the downlink data bus.

FIG. 13B illustrates an information transfer flow in the case of the data transfer from the external terminal I/F circuit 130b to the channel 141b.

In Embodiment 2, in order to perform the data transfer, the external terminal I/F circuit 130b transmits a transfer start request including size information of the transferred data to the channel 141b at first. In response to the transfer start request, the channel 141b starts the data transfer. The channel 141b does not transfer data having a size indicated by the size information at once, but performs the data transfer by dividing the data into a plurality of data pieces each having a predetermined size and transferring the plurality of data pieces one by one. When performing the data transfer, the channel 141b transmits the command to the external terminal I/F circuit 130b, and then the external terminal I/F circuit 130b transmits the uplink data to the channel 141b. The processing is repeated until the transfer of the data having the indicated size is completed. Note that, when the size indicated in the transfer start request is smaller than the predetermined size, the data transfer is completed only by transferring the data having the indicated size at once. After the transfer of all the data pieces is completed, the channel 141b notifies the external terminal I/F circuit 130b of the completion of the data transfer.

FIG. 13B illustrates a case where the data transfer is completed only by transmitting the data having the indicated size at once. After the command and the data are transmitted/received, the channel 141b notifies the external terminal I/F circuit 130b of the completion of the data transfer. The following describes the flow illustrated in FIG. 13B in detail.

At first, in order to transmit the transfer start request to the channel 141b, the external terminal I/F circuit 130b transmits the uplink information bus request signal to the arbiter 152. In response to this, the arbiter 152 returns the uplink information bus grant signal to the external terminal I/F circuit 130b. Upon receiving the uplink information bus grant signal, the external terminal I/F circuit 130b transmits the transfer start request to the channel 141b using the uplink information bus.

Upon receiving the transfer start request, the channel 141b transmits the command bus request signal to the arbiter 151 in order to transmit the command to the external terminal I/F circuit 130b. In response to this, the arbiter 151 returns the command bus grant signal to the channel 141b. Upon receiving the command bus grant signal, the channel 141b transmits the command to the external terminal I/F circuit 130b using the command bus.

Upon receiving the command, the external terminal I/F circuit 130b transmits the uplink data bus request signal to the arbiter 152 in order to transmit the data to the channel 141b. In response to this, the arbiter 152 returns the uplink data bus grant signal to the external terminal I/F circuit 130b. Upon receiving the uplink data bus grant signal, the external terminal I/F circuit 130b transmits the data to the channel 141b using the uplink data bus.

After confirming that wiring of the data to the buffer 160 is completed, the channel 141b receiving the data transmits the downlink information bus request signal to the arbiter 151 in order to notify the external terminal I/F circuit 130b of the completion of the data transfer. In response to this, the arbiter 151 returns the downlink information bus grant signal to the channel 141b. Upon receiving the downlink information bus grant signal, the channel 141b notifies the external terminal I/F circuit 130b of the completion of the data transfer using the downlink information bus.

Figure 14:
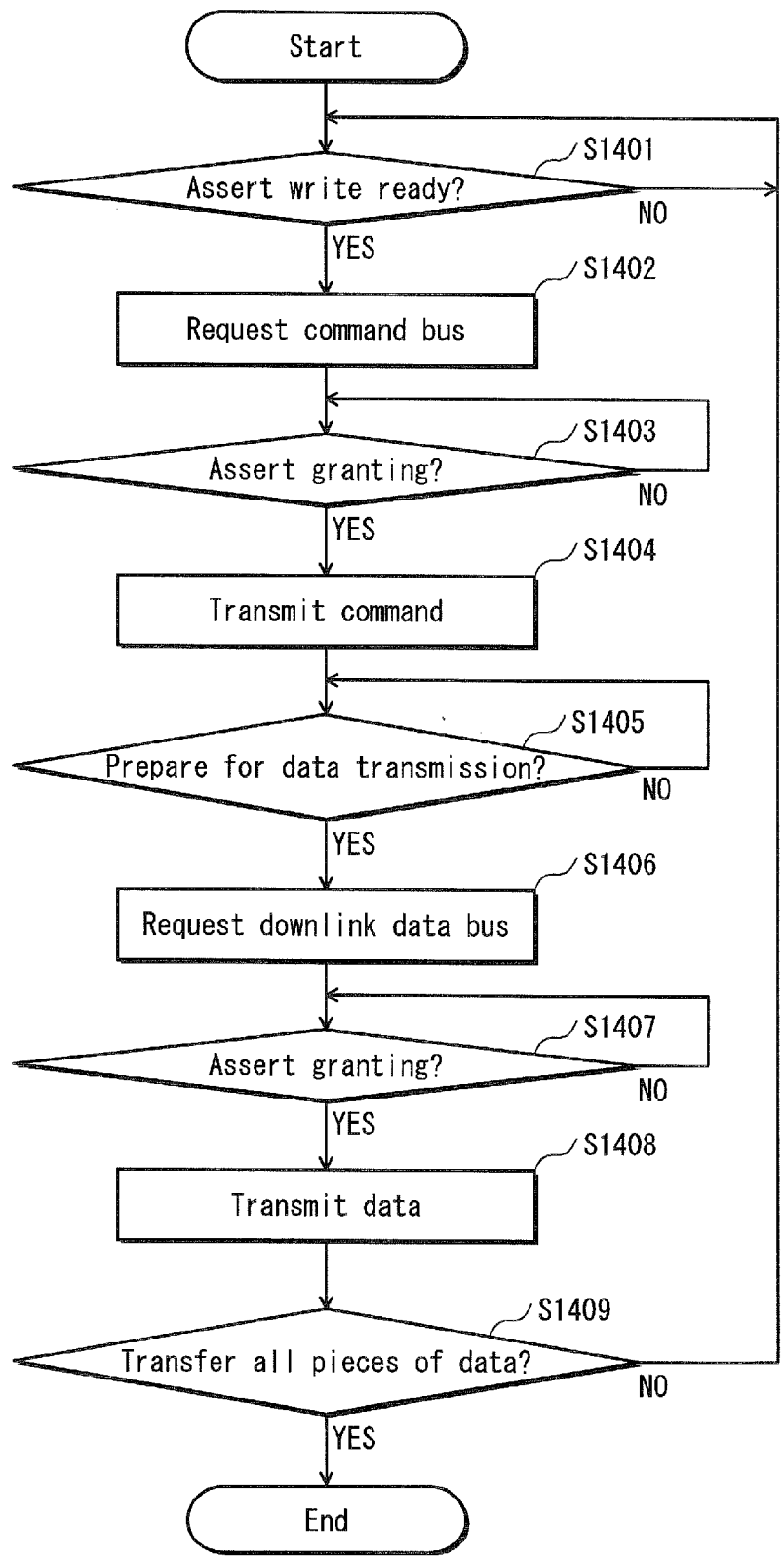
FIG. 14 is a flow chart showing data transfer control over a channel A pertaining to Embodiment 2.

FIG. 14 is a flow chart showing data transfer control over the channel 141a. Upon receiving the transfer start request from the external terminal I/F circuit 130a, the channel 141a starts operating.

Once stating operating, the channel 141a confirms reception of the write ready signal transmitted from the external terminal I/F circuit 130a at first. The channel 141a waits until the external terminal I/F circuit 130a asserts the write ready signal (NO in a step S1401). When the write ready signal is asserted (YES in the step S1401), the channel 141a requests the command bus (step S1402). After requesting the command bus, the channel 141a waits until the command bus is granted (NO in a step S1403). When the command bus is granted (YES in the step S1403), the channel 141a transmits a command (step S1404).

After transmitting the command, the channel 141a waits until data to be transmitted to the external terminal I/F circuit 130a is prepared (NO in a step S1405). When the data is prepared (YES in the step S1405), the channel 141a requests the downlink data bus (step S1406). After requesting the downlink data bus, the channel 141a waits until the downlink data bus is granted (NO in a step S1407). When the downlink data bus is granted (YES in the step S1407), the channel 141a transmits downlink data (step S1409).

In a case where the transfer of data having a size indicated in the transfer start request is not completed (NO in a step S1409), processing returns to the step S1401 and the data transfer is repeated. In a case where the transfer of data having the indicated size is completed (YES in the step S1409), the channel 141a stops operating and does not start operating until the next transfer start request is received.

Figure 15:
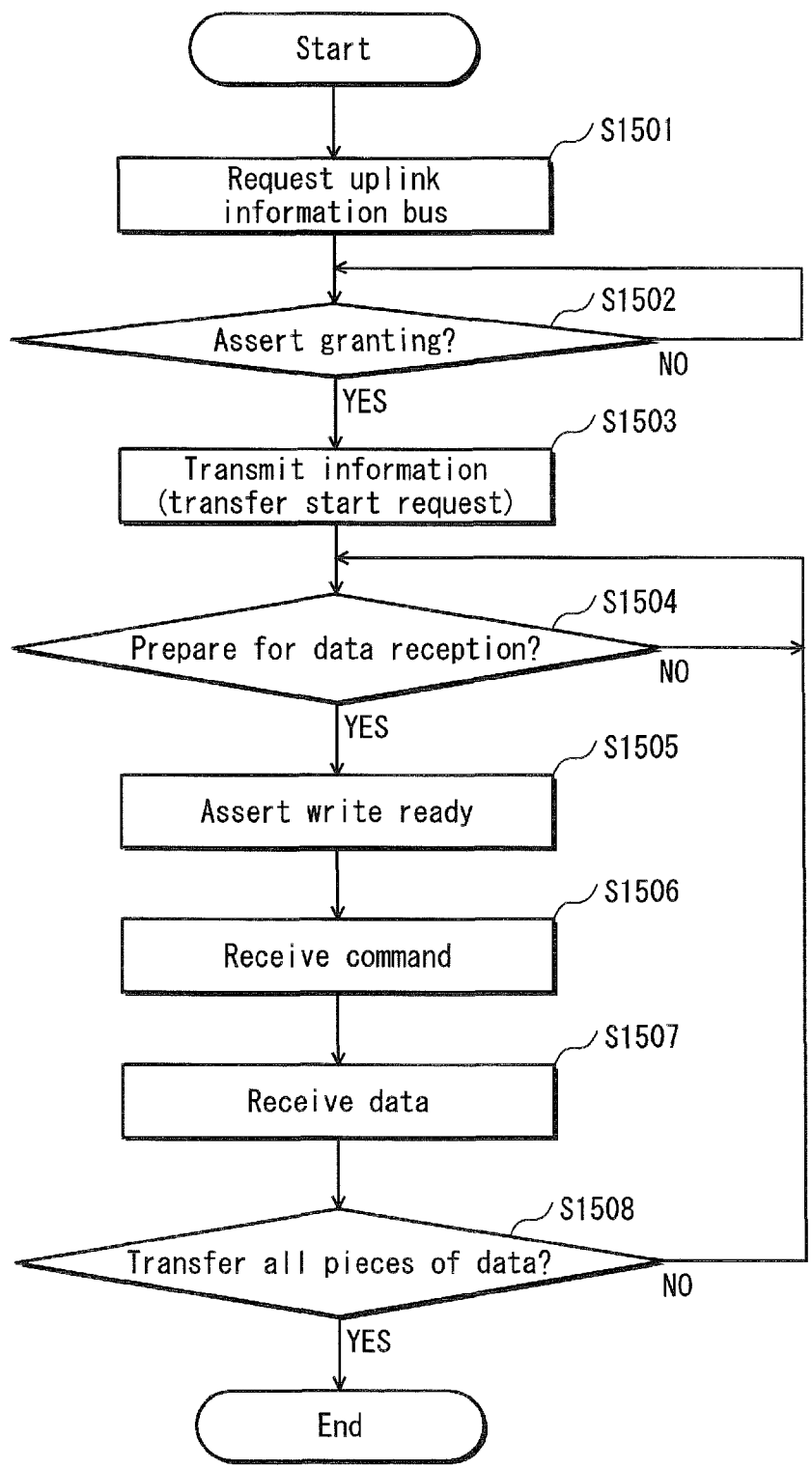
FIG. 15 is a flow chart showing data transfer control over an external terminal I/F circuit 130$a$ pertaining to Embodiment 2.

FIG. 15 is a flow chart showing data transfer control over the external terminal I/F circuit 130a. At first, the external terminal I/F circuit 130a is activated by a processor (not illustrated) within the semiconductor integrated circuit 100.

Upon being activated, the external terminal I/F circuit 130a requests the uplink information bus to transmit the transfer start request to the channel 141a (step S1501). After requesting the uplink information bus, the external terminal I/F circuit 130a waits until the uplink information bus is granted (NO in a step S1502). When the uplink information bus is granted (YES in the step S1502), the external terminal I/F circuit 130a transmits the transfer start request using the uplink information bus (step S1503).

Next, the external terminal I/F circuit 130a waits until the external terminal I/F circuit 130a is prepared for the reception of data (NO in a step S1504). When the external terminal I/F circuit 130a is prepared for the reception of data, the external terminal I/F circuit 130a asserts the write ready signal (step S1505). The external terminal I/F circuit 130a receives the command transmitted from the channel 141a (step S1506) and then receives the downlink data (step S1507).

In a case where the transfer of data having a size indicated in the transfer start request is not completed (NO in a step S1508), processing returns to the step S1501 and the data transfer is repeated. In a case where the transfer of data having the indicated size is completed, the external terminal I/F circuit 130a stops operating and does not start operating until the next transfer start request is received.

Figure 16:
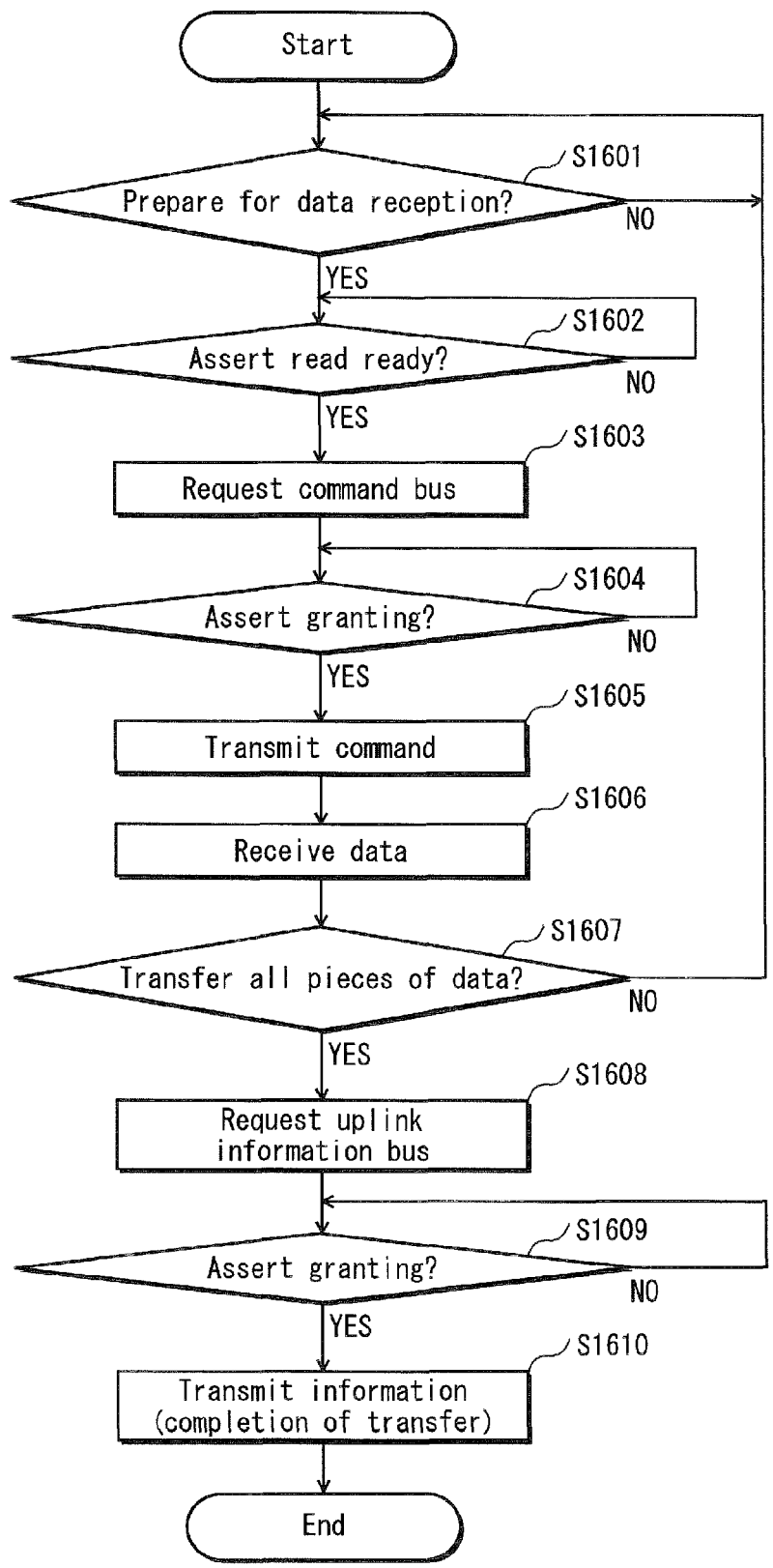
FIG. 16 is a flow chart showing data transfer control over a channel B pertaining to Embodiment 2.

FIG. 16 is a flow chart showing data transfer control over the channel 141b. Upon receiving the transfer start request from the external terminal I/F circuit 130b, the channel 141b starts operating.

Once stating operating, the channel 141b waits until the channel 141b is prepared for the reception of data (NO in a step S1601). When the channel 141b is prepared for the reception of data (YES in the step S1601), the channel 141b then confirms reception of the read ready signal transmitted from the external terminal I/F circuit 130b. The channel 141b waits until the external terminal I/F circuit 130b asserts the read ready signal (NO in a step S1602). When the read ready signal is asserted (YES in the step S1602), the channel 141b requests the command bus (YES in a step S1603). After requesting the command bus, the channel 141b waits until the command bus is granted (NO in a step S1604). When the command bus is granted (YES in the step S1604), the channel 141b transmits a command (step S1605). The channel 141b then receives the data transmitted from the external terminal I/F circuit 130b, and writes the data to the buffer 160 (step S1606).

In a case where the transfer of data having a size indicated in the transfer start request is not completed (NO in a step S1607), processing returns to the step S1601 and the data transfer is repeated. In a case where the transfer of data having the indicated size is completed, the channel 141b requests the uplink information bus to notify the external terminal I/F circuit 130b of the completion of the data transfer (step S1608). After requesting the uplink information bus, the channel 141b waits until the uplink information bus is granted (NO in a step S1609). When the uplink information bus is granted, the channel 141b notifies the external terminal I/F circuit 130b of the completion of the data transfer using the uplink information bus (step S1610). Then, the channel 141b stops operating and does not start operating until the next transfer start request is received.

Figure 17:
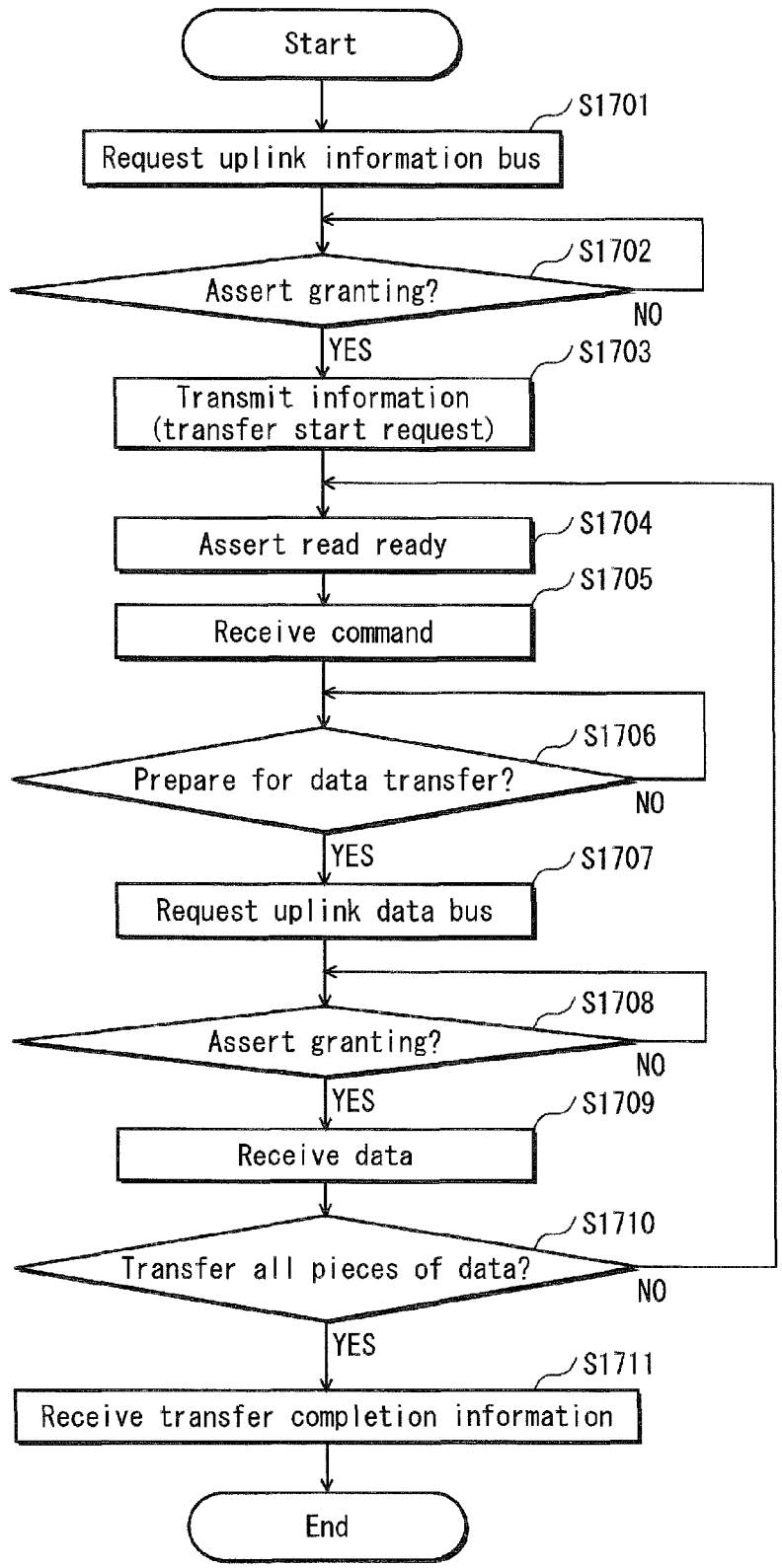
FIG. 17 is a flow chart showing data transfer control over an external terminal I/F circuit 130$b$ pertaining to Embodiment 2.

FIG. 17 is a flow chart showing data transfer control over the external terminal I/F circuit 130b. At first, the external terminal I/F circuit 130b is activated by a processor (not illustrated) within the semiconductor integrated circuit 100.

Upon being activated, the external terminal I/F circuit 130b requests the uplink information bus to transmit the transfer start request to the channel 141b (step S1701). After requesting the uplink information bus, the external terminal I/F circuit 130b waits until the uplink information bus is granted (NO in a step S1702). When the uplink information bus is granted (YES in the step S1702), the external terminal I/F circuit 130b transmits the transfer start request using the uplink information bus (step S1703).

The external terminal I/F circuit 130b then asserts the read ready signal (step S1704). The external terminal I/F circuit 130b receives the command transmitted from the channel 141b (step S1705). After receiving the command, the external terminal I/F circuit 130b waits until data to be transmitted to the channel 141b is prepared (NO in a step S1706). When the data is prepared (YES in the step S1706), the external terminal I/F circuit 130b requests the uplink data bus (step S1707). After requesting the uplink data bus, the external terminal I/F circuit 130b waits until the uplink data bus is granted (NO in a step S1708). When the uplink data bus is granted (YES in the step S1708), the external terminal I/F circuit 130b transmits data (step S1709).

In a case where the transfer of data having a size indicated in the transfer start request is not completed (NO in a step S1710), processing returns to the step S1704 and the data transfer is repeated. In a case where the transfer of data having the indicated size is completed (YES in the step S1710), the external terminal I/F circuit 130b stops operating after being notified of the completion of the data transfer (step S1711), and does not start operating until being activated.

This concludes the description of each data transfer operation.

The following describes an actual timing of the data transfer.

Figure 18:
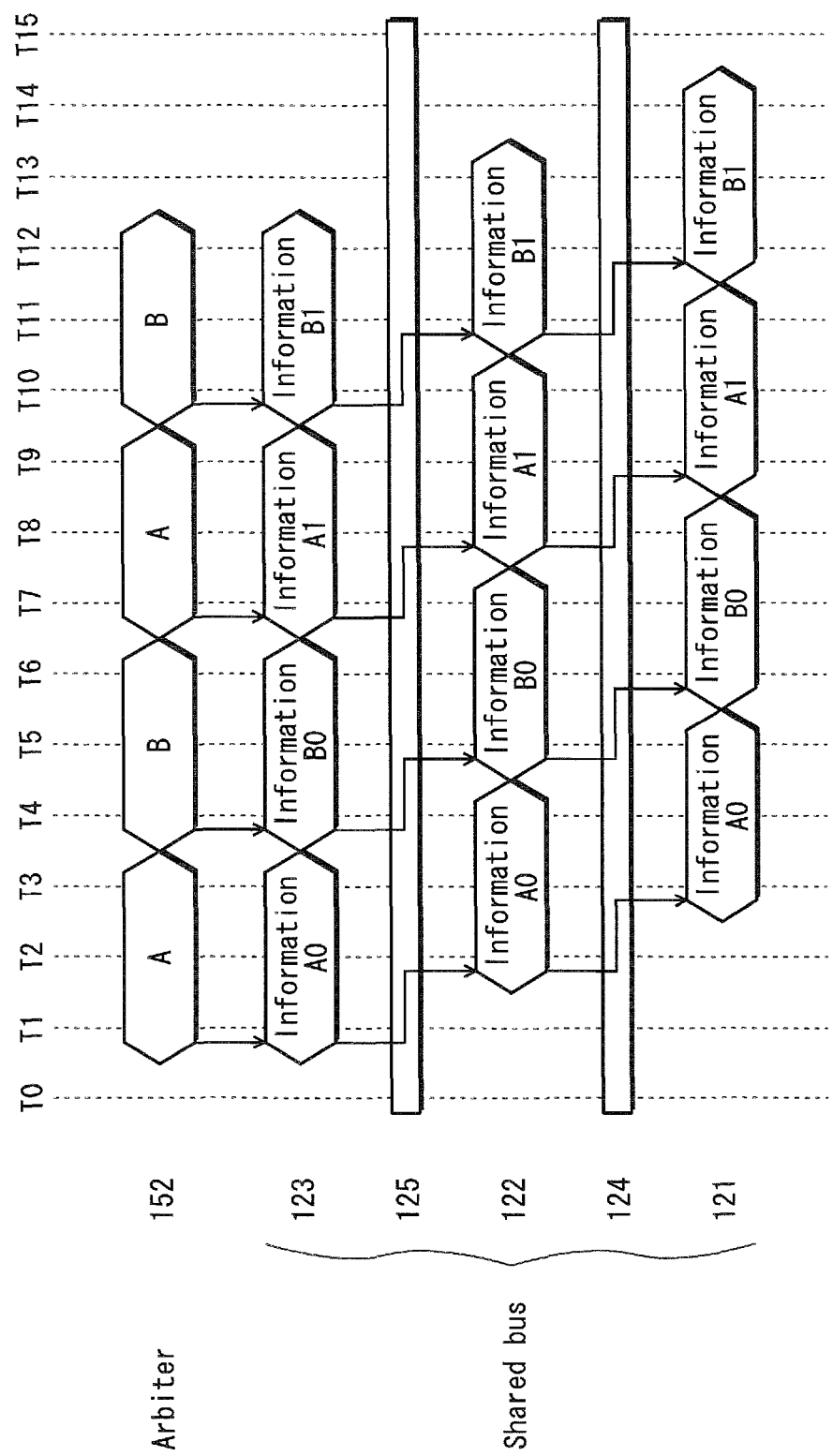
FIG. 18 is a timing diagram showing an example of data transfer within the semiconductor integrated circuit pertaining to Embodiment 2.

FIG. 18 illustrates allocation of the shared bus and usage status of the shared bus via which information is transmitted from the DMAC 140 to each of the external terminal I/F circuits 130a and 130b. Described here is an example where the channels 141a and 141b use the command bus. Each of the channels 141a and 141b uses the shared bus in three cycles when being granted the shared bus.

By the time T0, the command bus request signal transmitted from the channel 141a reaches the arbiter 151. Upon receiving the command bus request signal, the arbiter 151 transmits the command bus grant signal to the channel 141a at the time T0. As a result, the channel 141a is granted the command bus included in the slice bus 121 between the time T0 and the time T2 (downlink bus=A).

The command output from the channel 141a to the command bus included in the slice bus 121 between the time T0 and the time T2 is delayed in one cycle while passing through the slice group 124, and is output to the command bus included in the slice bus 122 between the time T1 and the time T3. Here, the command is acquired by the external terminal I/F circuit 130a.

Next, by the time T3, the command bus request signal transmitted from the channel 141b reaches the arbiter 151. Upon receiving the command bus request signal, the arbiter 151 transmits the command bus grant signal to the channel 141b at the time T3. As a result, the channel 141b is granted the command bus included in the slice bus 121 between the time T3 and the time T5 (downlink bus=B).

The command output from the channel 141b to the command bus included in the slice bus 121 between the time T3 and the time T5 is delayed in one cycle while passing through the slice group 124, and is output to the command bus included in the slice bus 122 between the time T4 and the time T6. Similarly, the command output to the command bus included in the slice bus 122 between the time T4 and the time T6 is delayed in one cycle while passing through the slice group 125, and is output to the command bus included in the slice bus 123 between the time T5 and the time T7. Here, the command is acquired by the external terminal I/F circuit 130b.

Hereinafter, allocation of the command bus and usage status of the command bus between the time T6 and the time T8 are respectively similar to those between the time T0 and the time T2. Also, allocation of the command bus and usage status of the command bus between the time T9 and the time T11 are respectively similar to those between the time T3 and the time T5.

Figure 19:
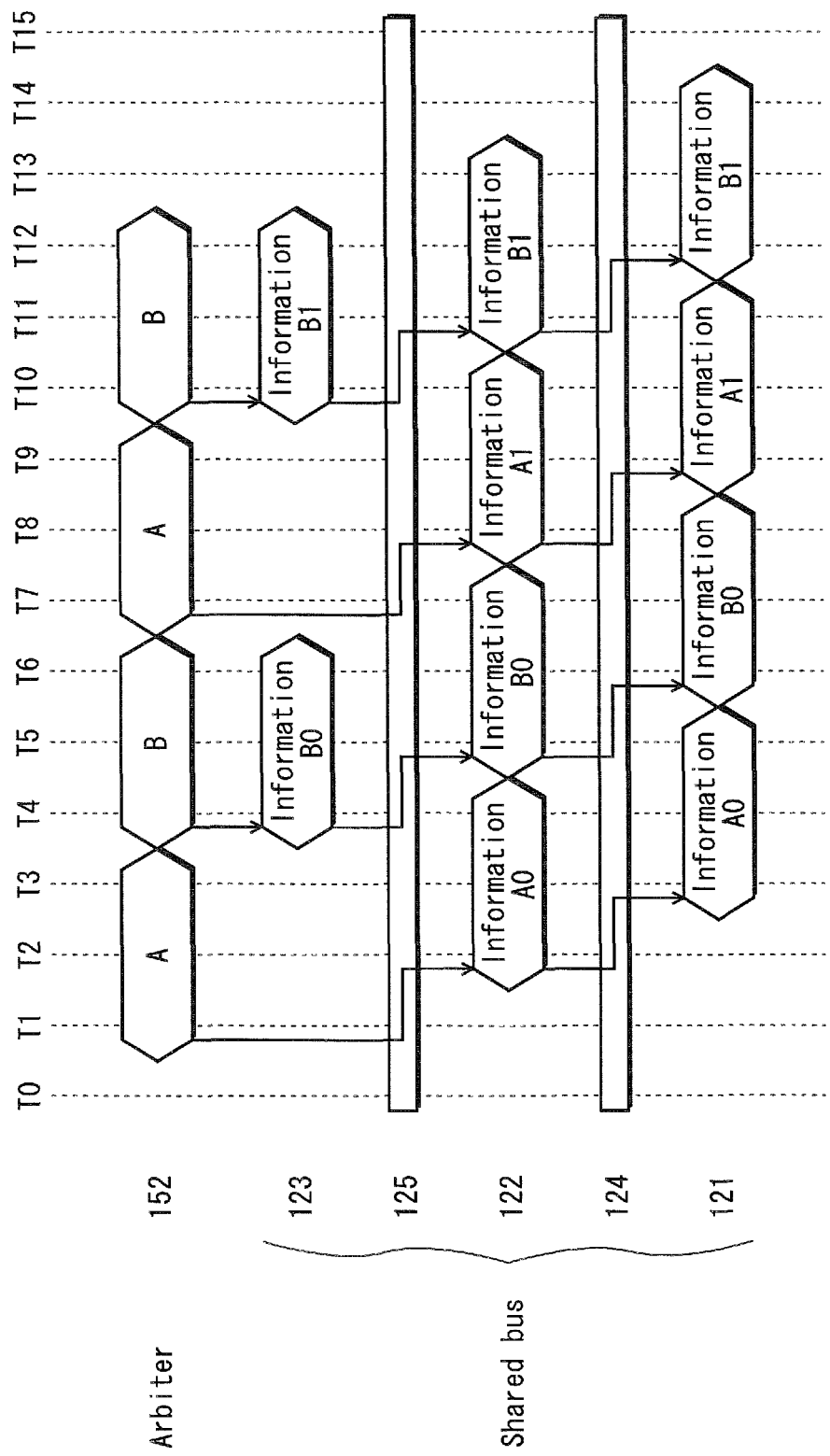
FIG. 19 is a timing diagram showing another example of data transfer within the semiconductor integrated circuit pertaining to Embodiment 2.

FIG. 19 illustrates allocation of the shared bus and usage status of the shared bus via which information is transmitted from the external terminal I/F circuit group 130 to the DMAC 140. Described here is an example where the external terminal I/F circuits 130a and 130b use the uplink information bus. Each of the external terminal I/F circuits 130a and 130b uses the shared bus in three cycles when being granted the shared bus.

By the time T0, the uplink information bus request signal transmitted from the external terminal I/F circuit 130a reaches the arbiter 152. Upon receiving the uplink information bus request signal, the arbiter 152 transmits the uplink information bus grant signal to the external terminal I/F circuit 130a at the time T0. As a result, the external terminal I/F circuit 130a is granted the uplink information bus included in the slice bus 123 between the time T0 and the time T2 (downlink bus=A). However, since the external terminal I/F circuit 130a is not connected to the slice bus 123, the slice bus 123 is not used between the time T0 and the time T2.

The uplink information bus grant signal to be transmitted to the external terminal I/F circuit 130a is delayed in one cycle while passing through the slice group 125, and reaches the external terminal I/F circuit 130a connected to the slice bus 122 at the time T1. As a result, the external terminal I/F circuit 130a is granted the uplink information bus included in the slice bus 122 between the time T1 and the time T3 (downlink bus=A).

The information output from the external terminal I/F circuit 130a to the uplink information bus included in the slice bus 122 between the time T1 and the time T3 is delayed in one cycle while passing through the slice group 124, and is output to the uplink information bus included in the slice bus 121 between the time T2 and the time T4. Here, the information transmitted via the uplink information bus is acquired by the channel 141a.

By the time T3, the uplink information bus request signal transmitted from the external terminal I/F circuit 130b reaches the arbiter 152. Upon receiving the uplink information bus request signal, the arbiter 152 transmits the uplink information bus grant signal to the external terminal I/F circuit 130b at the time T3. As a result, the external terminal I/F circuit 130b is granted the uplink information bus included in the slice bus 123 between the time T3 and the time T5 (downlink bus=B).

The information output from the external terminal I/F circuit 130b to the uplink information bus included in the slice bus 123 between the time T3 and the time T5 is delayed in one cycle while passing through the slice group 125, and is output to the uplink information bus included in the slice bus 122 between the time T4 and the time T6. Similarly, the information output to the uplink information bus included in the slice bus 122 between the time T4 and the time T6 is delayed in one cycle while passing through the slice group 124, and is output to the uplink information bus included in the slice bus 121 between the time T5 and the time T7. Here, the information transmitted via the uplink information bus is acquired by the channel 141b.

As described above, by slicing the bus grant signal similarly to the information transmitted via the shared bus, information is transferred without having a period in which the shared bus is not used at the time of switching the shared bus, and thus it becomes possible to achieve a high degree of efficiency in the use of the shared bus.

Note that FIGS. 18 and 19 each describe an example where each circuit (the channel 141a, the channel 141b, the external terminal I/F circuit 130a or the external terminal I/F circuit 130b) uses the shared bus in the fixed number of cycles (three cycles) when being granted the shared bus. The present invention, however, is not limited to this structure. For example, a period of using the shared bus may vary among circuits using the shared bus.

Figure 20:
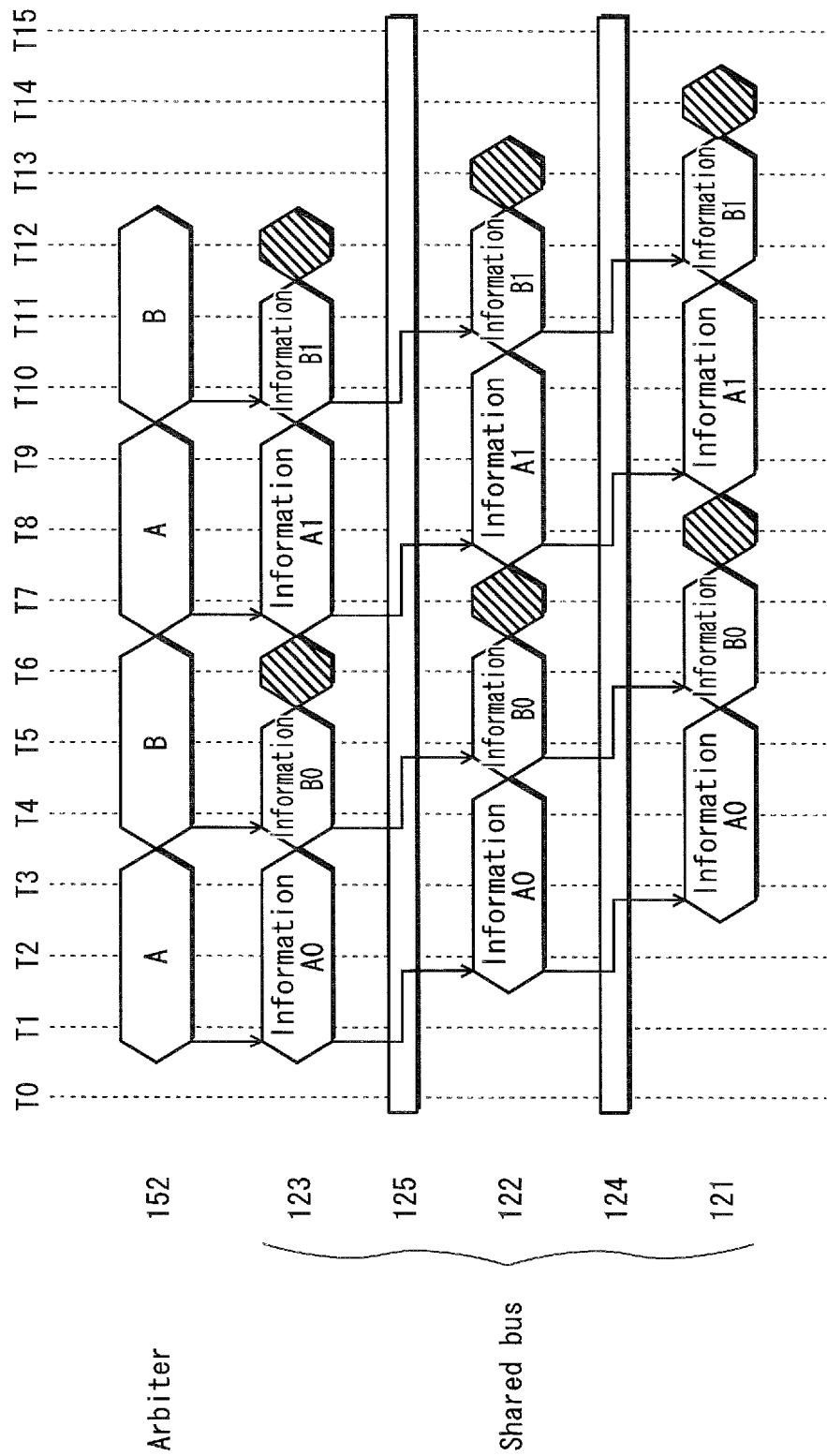
FIG. 20 is a timing diagram showing yet another example of data transfer within the semiconductor integrated circuit pertaining to Embodiment 2.
Figure 21:
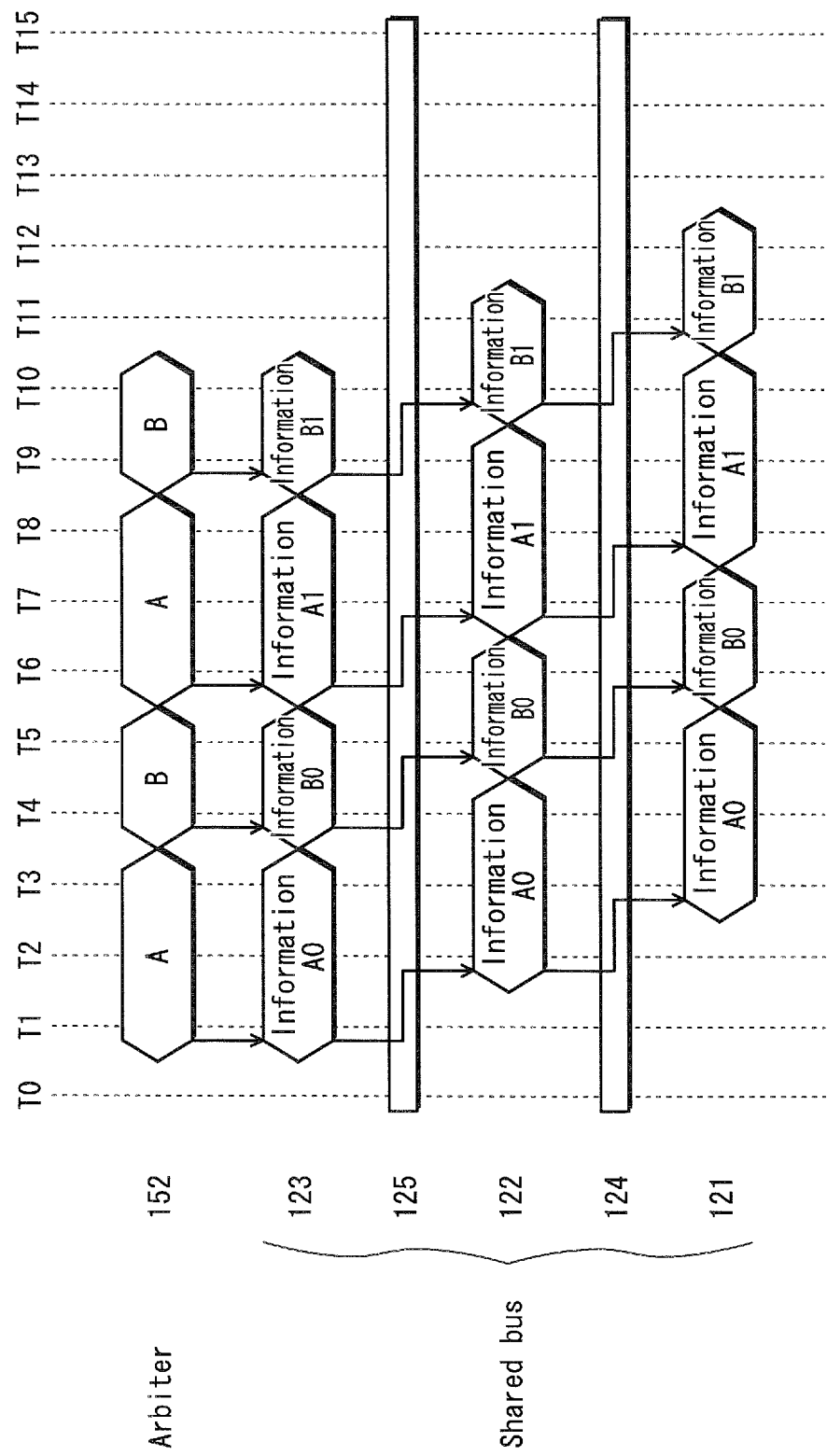
FIG. 21 is a timing diagram showing yet another example of data transfer within the semiconductor integrated circuit pertaining to Embodiment 2.

The following describes an example where the period of using the shared bus varies among circuits using the shared bus, with use of FIGS. 20 and 21. Described here is an example where the channels 141a and 141b use the command bus. The channel 141a uses the shared bus in three cycles when being granted the shared bus, and the channel 141b uses the shared bus in two cycles when being granted the shared bus.

FIG. 20 describes an example where the arbiter 151 does not hold information on the period of using the shared bus that varies among circuits using the shared bus, and performs arbitration for each maximum period of using the shared bus (three cycles) to grant the shared bus. In this case, the shared bus is not used in one cycle of the period in which the channel 141b is granted the shared bus (three cycles). Specifically, the channel 141b does not use the slice bus 121 at the time T5 and the time T11 at which the channel 141b is granted the shared bus. Therefore, the slice bus 122 is not used at the time T6 and the time T12. Furthermore, the slice bus 123 is not used at the time T7 and the time T13. This reduces efficiency in the use of the shared bus.

In order to avoid such a problem, the arbiter 151 may hold information on the period of using the shared bus that varies among circuits using the shared bus, and a timing at which the arbiter 151 performs arbitration may be varied according to the period of using the shared bus that varies among circuits using the shared bus.

FIG. 21 describes an example where the arbiter 151 holds information on the period of using the shared bus that varies among circuits using the shared bus, and a timing at which the arbiter 151 performs arbitration is varied according to the period of using the shared bus that varies among circuits using the shared bus. Similarly to FIG. 20, FIG. 21 describes the example where the channels 141a and 141b use the command bus. The channel 141a uses the shared bus in three cycles when being granted the shared bus, and the channel 141b uses the shared bus in two cycles when being granted the shared bus.

The arbiter 151 performs arbitration and transmits the command bus grant signal to the channel 141a at the time T0. Here, the arbiter 151 holds information on a period in which the channel 141a uses the shared bus (three cycles), and thus performs the next arbitration at the time T3, which is three cycles after the time T0.

The arbiter 151 transmits the command bus grant signal to the channel 141b at the time T3. Here, the arbiter 151 holds information on a period in which the channel 141b uses the shared bus (two cycles), and thus performs the next arbitration at the time T5, which is two cycles after the time T3.

The arbiter 151 transmits the command bus grant signal to the channel 141a at the time T5. Here, the arbiter 151 holds information on the period in which the channel 141a uses the shared bus (three cycles), and thus performs the next arbitration at the time T8, which is three cycles after the time T5.

As described above, by the arbiter 151 holding information on the period of using the shared bus that varies among circuits using the shared bus and by varying the timing at which the arbiter 151 performs arbitration according to the period of using the shared bus that varies among circuits using the shared bus, it is possible to maintain the high degree of efficiency in the use of the shared bus even when the period of using the shared bus varies among circuits using the shared bus.

Summary

As set forth the above, the semiconductor integrated circuit in Embodiment 2 is designed and manufactured according to the method described in the above modification. Therefore, it is possible to achieve the configuration in which the semiconductor integrated circuit operates without causing any problems even when the determination of the placement of the external terminals is delayed. That is to say, since the number of timing adjustment circuits is determined according to the placement of the external terminals when the semiconductor integrated circuit is manufactured, it is possible to achieve the configuration in which the semiconductor integrated circuit has a simple configuration considering data transfer delay and the like.

Embodiment 3

Described in Embodiment 2 is a case where the period of using the shared bus varies among circuits using the shared bus when data transfer is performed between the DMAC 140 and each of the external terminal I/F circuits 130a and 130b.

Described in Embodiment 3 is an example where another shared bus is provided when the period of using the shared bus varies among circuits using the shared bus. Note that the period of using the shared bus here may be rephrased as a burst length of data to be transferred at one time.

Figure 22:
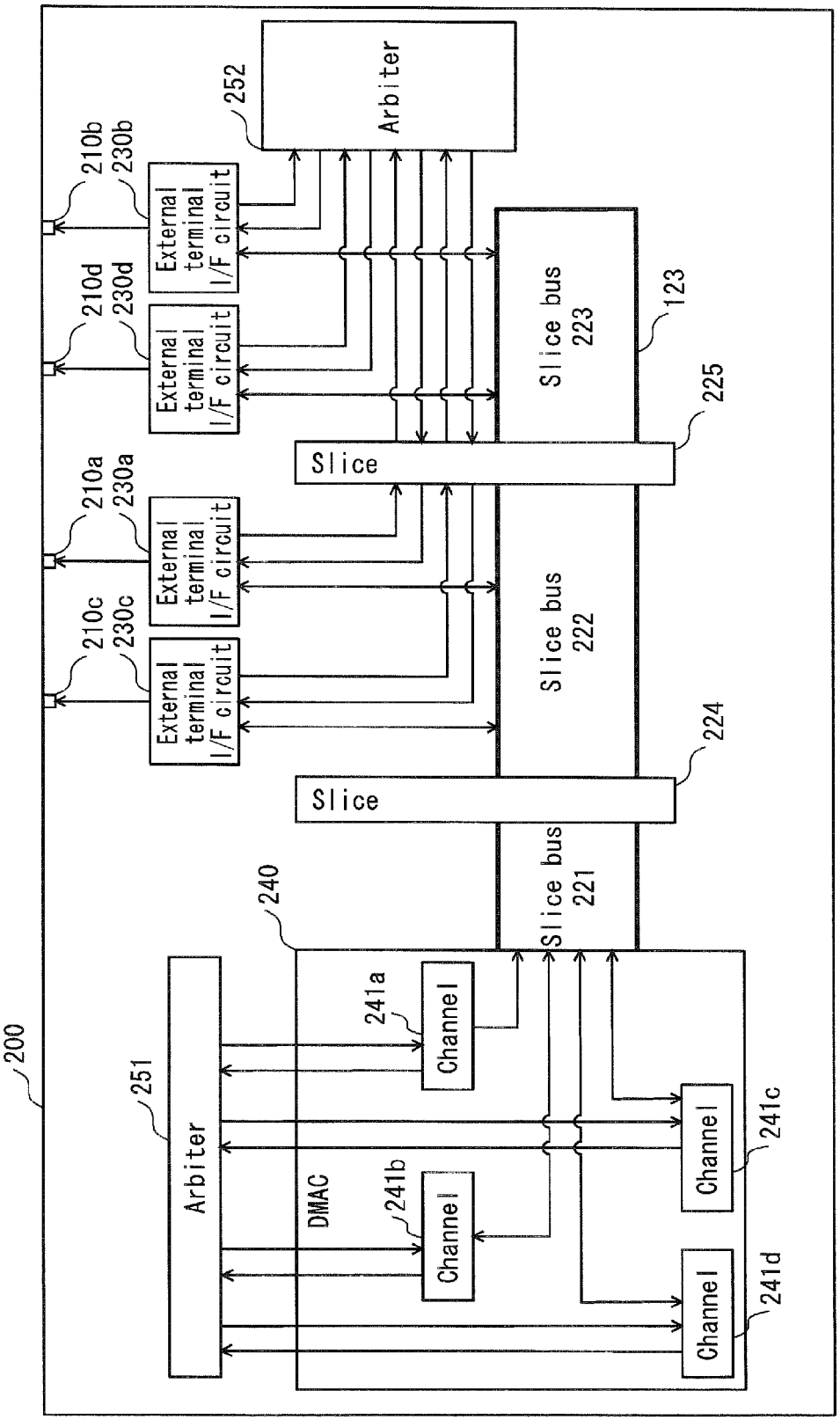
FIG. 22 is a functional block diagram illustrating an example of a configuration of a semiconductor integrated circuit 300$a$ pertaining to Embodiment 3 in a case of providing a shared bus according to a data length.
Figure 23:
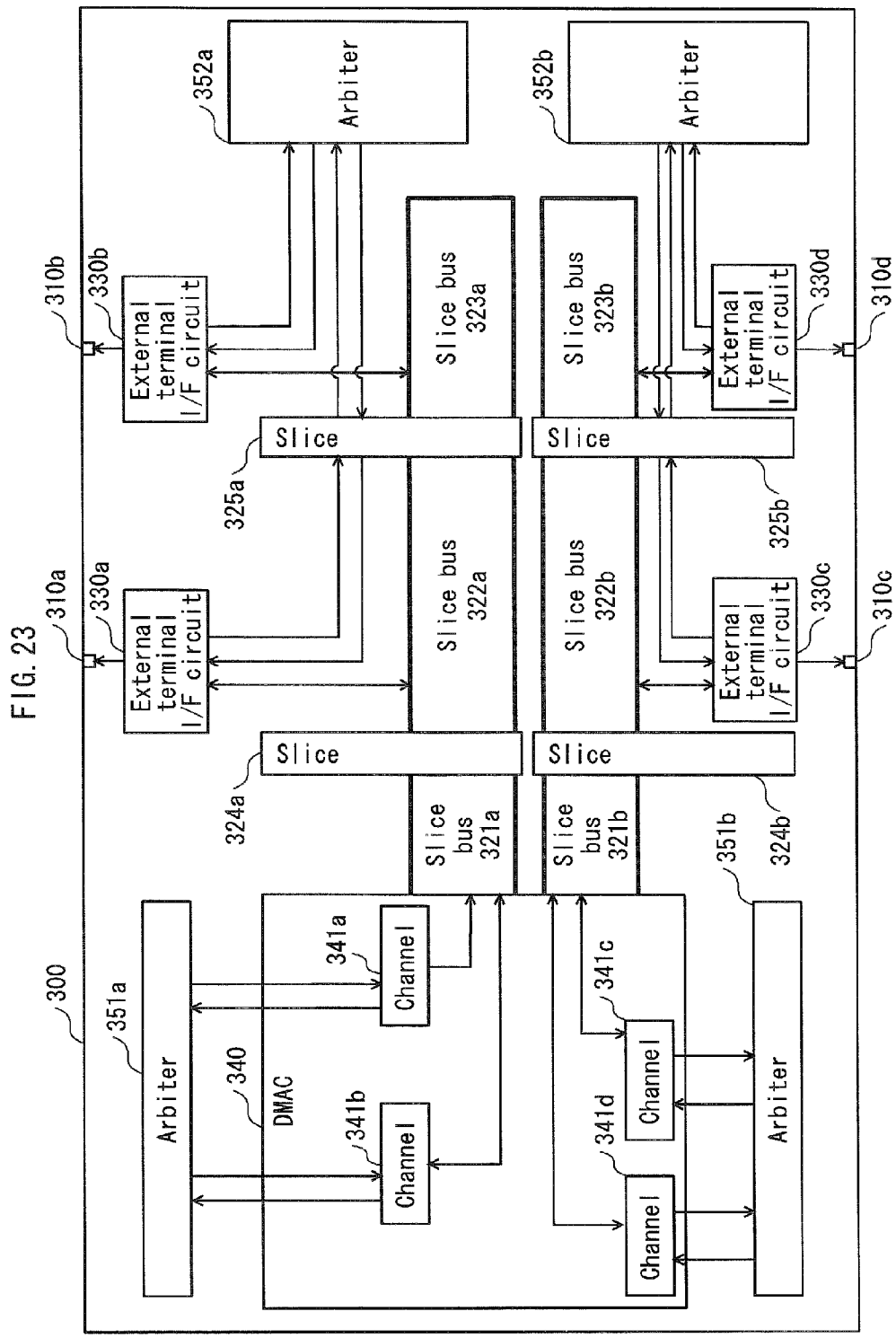
FIG. 23 is a functional block diagram illustrating an example of a configuration of a semiconductor integrated circuit 300$b$ pertaining to Embodiment 3 in the case of providing the shared bus according to the data length.

FIG. 22 is a functional block diagram illustrating a configuration of a semiconductor integrated circuit 200 in a case where another shared bus is not provided. FIG. 23 is a functional block diagram illustrating a configuration of a semiconductor integrated circuit 300 in a case where another shared bus is provided. Note that the semiconductor integrated circuits 200 and 300 respectively illustrated in FIGS. 22 and 23 each have a configuration that is approximately the same as the configuration of the semiconductor integrated circuit 100 in Embodiment 2. Therefore, some components of the semiconductor integrated circuits 200 and 300 such as the buffer 160 are omitted from FIGS. 22 and 23.

A DMAC 240 includes four channels, namely channels 241a, 241b, 241c and 241d, and is connected to an external terminal I/F circuit group 230 via the shared bus. The channel 241a transmits/receives information to/from an external terminal I/F circuit 230a. The channel 241b transmits/receives information to/from an external terminal I/F circuit 230b. The channel 241c transmits/receives information to/from an external terminal I/F circuit 230c. The channel 241d transmits/receives information to/from an external terminal I/F circuit 230d.

Each of the channels 241a, 241b, 241c and 241d transmits the bus request signal group to an arbiter 251. The arbiter 251 transmits the bus grant signal group to each of the channels 241a, 241b, 241c and 241d. Each of the external terminal I/F circuits 230a, 230b, 230c and 230d transmits the bus request signal group to an arbiter 252. The arbiter 252 transmits the bus grant signal group to each of the external terminal I/F circuits 230a, 230b, 230c and 230d. The configuration of the bus request signal group and the configuration of the bus grant signal group are each similar to the configuration illustrated in FIGS. 11A and 11B.

Although not illustrated in FIG. 22, the write ready signal and the read ready signal are transmitted between each of the channels and each of the external terminal I/F circuits for transmitting/receiving information via the slice, similarly to the configuration illustrated in FIG. 9.

The shared bus is composed of slice groups 224 and 225 as well as slice buses 221, 222 and 223 that are each sliced by the slice group 224 or the slice group 225. The DMAC 240 is connected to the slice bus 221. The external terminal I/F circuits 230a and 230c are each connected to the slice bus 222. The external terminal I/F circuits 230b and 230d are each connected to the slice bus 223.

Figure 24:
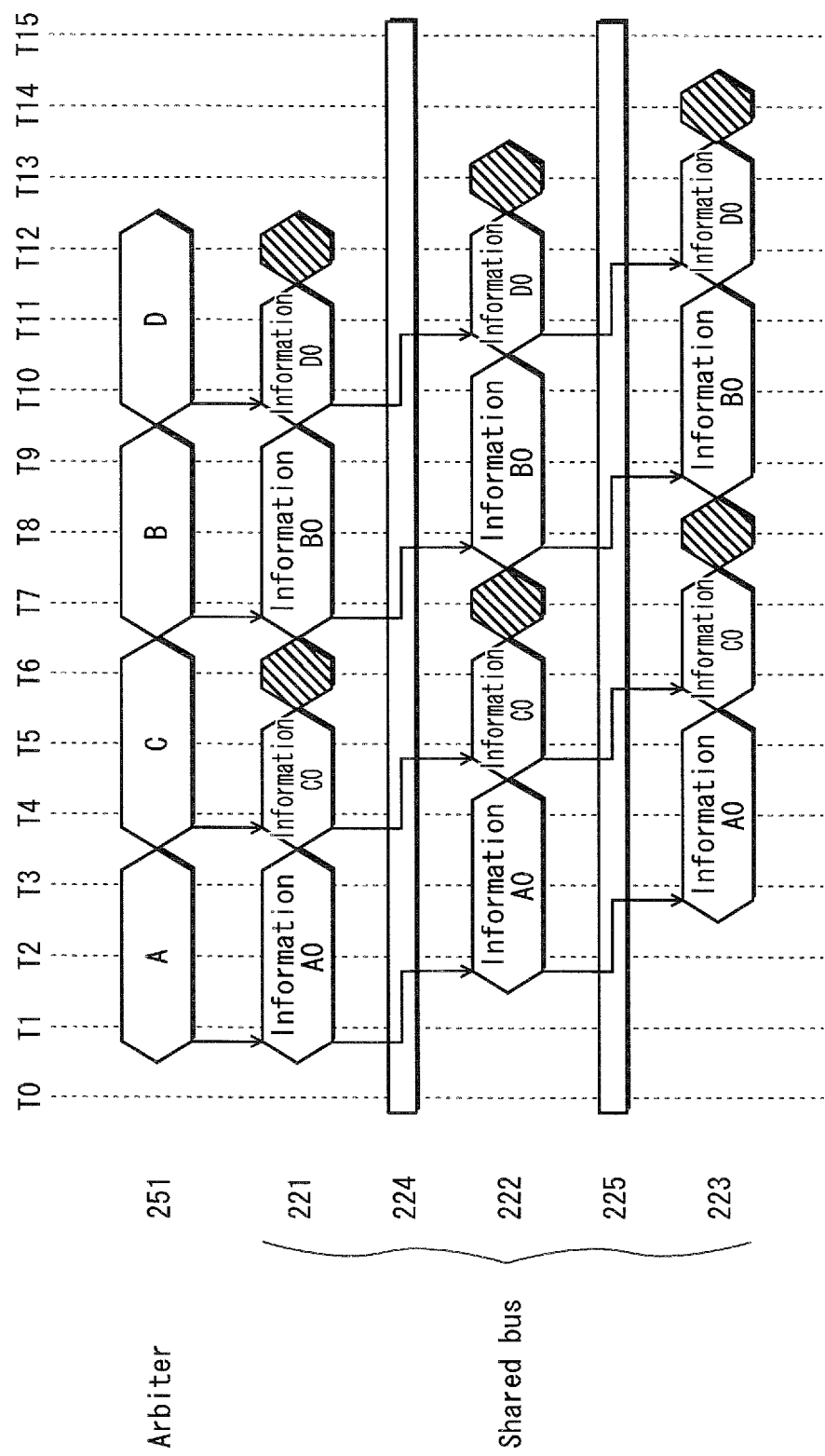
FIG. 24 is a timing diagram showing an example of data transfer within the semiconductor integrated circuit 300$a$ pertaining to Embodiment 3.

FIG. 24 illustrates allocation of the shared bus and usage status of the shared bus via which information is transmitted from the DMAC 240 to the external terminal I/F circuit group 230. Described here is an example where the channels 241a, 241b, 241c and 241d use the command bus. Each of the channels 241a and 241b uses the shared bus in three cycles when being granted the shared bus, and each of the channels 241c and 241d uses the shared bus in two cycles when being granted the shared bus. The arbiter 251 does not hold information on the period of using the shared bus that varies among circuits using the shared bus, and performs arbitration for each fixed number of cycles (three cycles).

In this case, when the channels 241c and 241d, whose period of using the shared bus is shorter than the cycle in which the arbiter 251 performs arbitration (three cycles), use the shared bus, there are periods in each of which the shared bus is not used (hatched portions in FIG. 24), similarly to the case as illustrated in FIG. 20. This reduces efficiency in the use of the shared bus.

In order to avoid reduction in efficiency in the use of the shared bus, the shared bus used by the channels 241a and 241b, whose period of using the shared bus is three cycles, and the shared bus used by the channels 241c and 241d, whose period of using the shared bus is two cycles, may be separately implemented. The following describes such a case with use of FIGS. 23, 25 and 26.

FIG. 23 illustrates an example of a configuration of a semiconductor integrated circuit in a case where another shared bus is implemented. The configuration of a DMAC 340 and the configuration of external terminal I/F circuits 330a, 330b, 330c and 330d are approximately the same as those illustrated in FIG. 22. The configuration illustrated in FIG. 23, however, is different from that illustrated in FIG. 22 in that two shared buses are provided and the arbiter is provided for each of the two shared buses.

Specifically, channels 341a and 341b, and external terminal I/F circuits 330a and 330b are each connected to a first shared bus composed of slice buses 321a, 322a and 323a, and slice groups 324a and 325a. Channels 341c and 341d, and external terminal I/F circuits 330c and 330d are each connected to a second shared bus composed of slice buses 321b, 322b and 323b, and slice groups 324b and 325b.

Each of the channels 341a and 341b transmits the bus request signal group to an arbiter 351a. The arbiter 351a transmits the bus grant signal group to each of the channels 341a and 341b. Each of the channels 341c and 341d transmits the bus request signal group to an arbiter 351b. The arbiter 351b transmits the bus grant signal group to each of the channels 341c and 341d.

Each of the external terminal I/F circuits 330a and 330b transmits the bus request signal group to an arbiter 352a. The arbiter 352a transmits the bus grant signal group to each of the external terminal I/F circuits 330a and 330b. Each of the external terminal I/F circuits 330c and 330d transmits the bus request signal group to an arbiter 352b. The arbiter 352b transmits the bus grant signal group to each of the external terminal I/F circuits 330c and 330d.

The configuration of the bus request signal group and the configuration of the bus grant signal group are each similar to the configuration described with use of FIGS. 11A and 11B. Although not illustrated in FIG. 23, the write ready signal and the read ready signal are transmitted between each of the channels and each of the external terminal I/F circuits for transmitting/receiving information via the slice, similarly to the configuration illustrated in FIG. 9.

Figure 25:
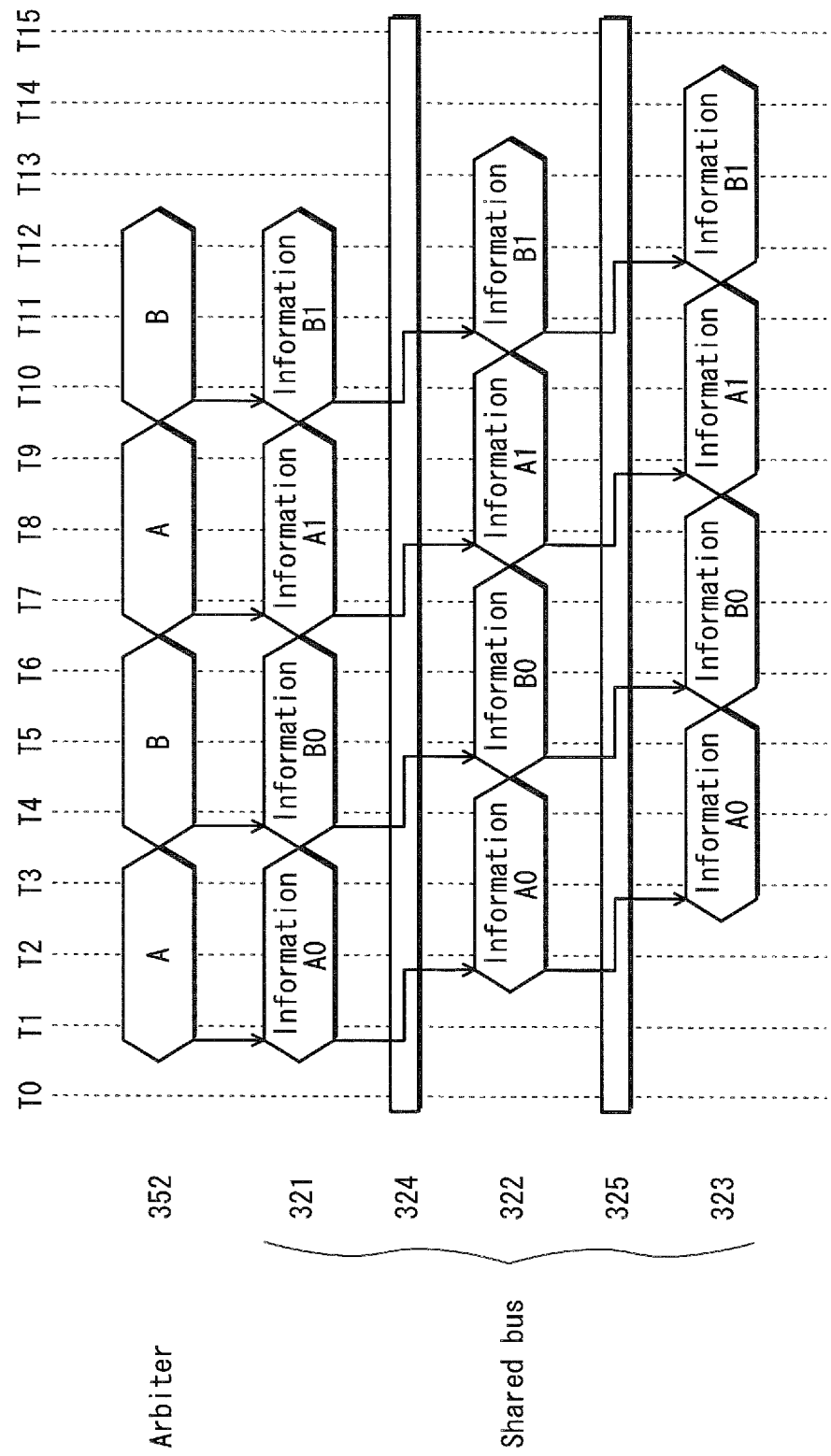
FIG. 25 is a timing diagram showing an example of data transfer within the semiconductor integrated circuit 300$b$ pertaining to Embodiment 3.
Figure 26:
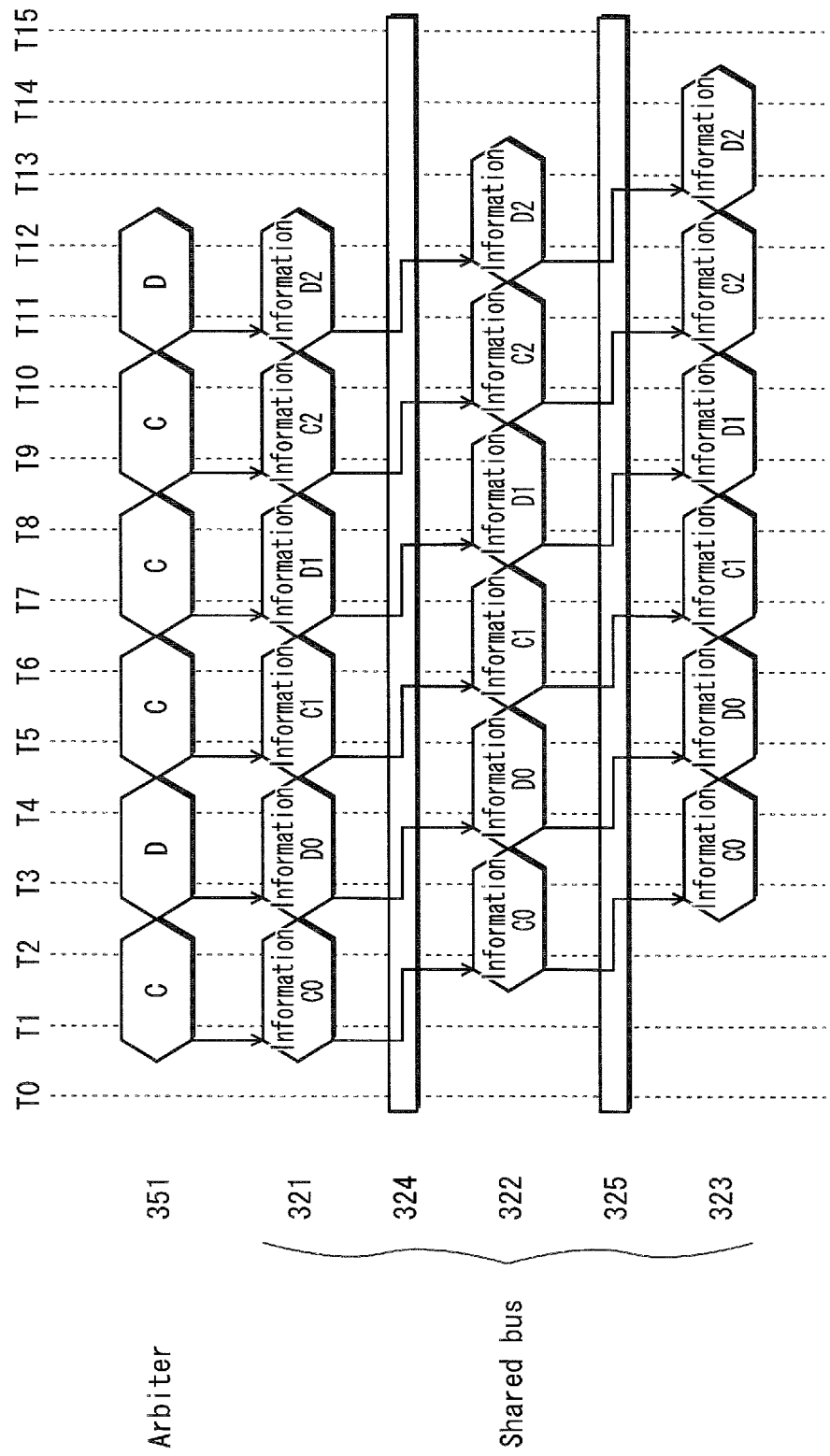
FIG. 26 is a timing diagram showing another example of data transfer within the semiconductor integrated circuit 300$b$ pertaining to Embodiment 3.

FIG. 25 illustrates allocation of the shared bus and usage status of the shared bus via which information is transmitted from each of the external terminal I/F circuits 330a, 330b, 330c and 330d to the DMAC 340. Here, the channels 341a and 341b use the command bus included in the first shared bus, and the channels 341c and 341d use the command bus included in the second shared bus. Each of the arbiters 351a and 351b performs arbitration for each fixed number of cycles. Specifically, the arbiter 351a performs arbitration for each three cycles, and the arbiter 351b performs arbitration for each two cycles.

In this case, as illustrated in FIG. 25, the shared bus is used without having a period in which the shared bus is not used, similarly to the case illustrated in FIG. 18.

Summary

As set forth the above, by separately providing the shared bus when the period of using the shared bus varies among circuits using the shared bus in the specification, it becomes possible to efficiently use the shared bus without providing a complex arbiter that varies an arbitration timing depending on the period of using the shared bus that varies among circuits using the shared bus.

Embodiment 4

Embodiments 1, 2 and 3 above each describe an example in which the DMAC as the data transfer control circuit is included in the functional block. With the configuration in which the DMAC is included in the functional block, the design can be less expandable.

This is because of the following reason. In the configuration in which the uplink arbiter and the downlink arbiter are each provided as illustrated in FIGS. 9, 22 and 23, for example, these arbiters are designed so as to operate according the respective configurations. Therefore, if another component such as the external terminal and the external terminal I/F circuit is added, the arbiters have to be redesigned. If the component such as the external terminal and the external terminal I/F circuit that is originally included in the design is removed, the arbiters have also to be redesigned. Also, since it is necessary to provide, to the DMAC, another channel corresponding to the added component such as the external terminal and the external terminal I/F circuit, the DMAC have also to be redesigned.

Therefore, Embodiment 1 and each of the above-mentioned modifications describe that the layout design may be performed by including, in the external terminal I/F circuit, the DMAC as the data transfer control circuit without including the DMAC in the functional block.

Figure 28A:
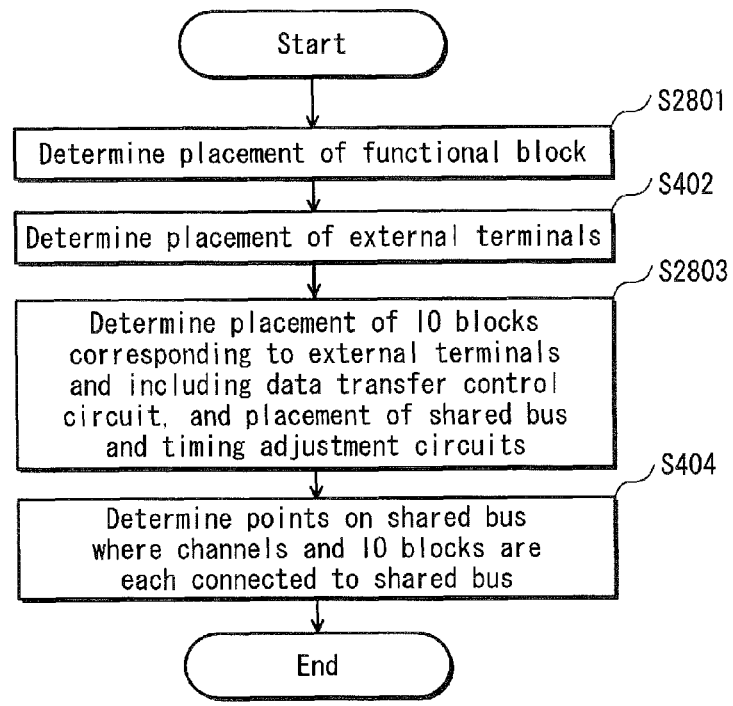
FIGS. 28A and 28B are each flow charts showing a layout design method for a semiconductor integrated circuit pertaining to Embodiment 4.
Figure 28B:
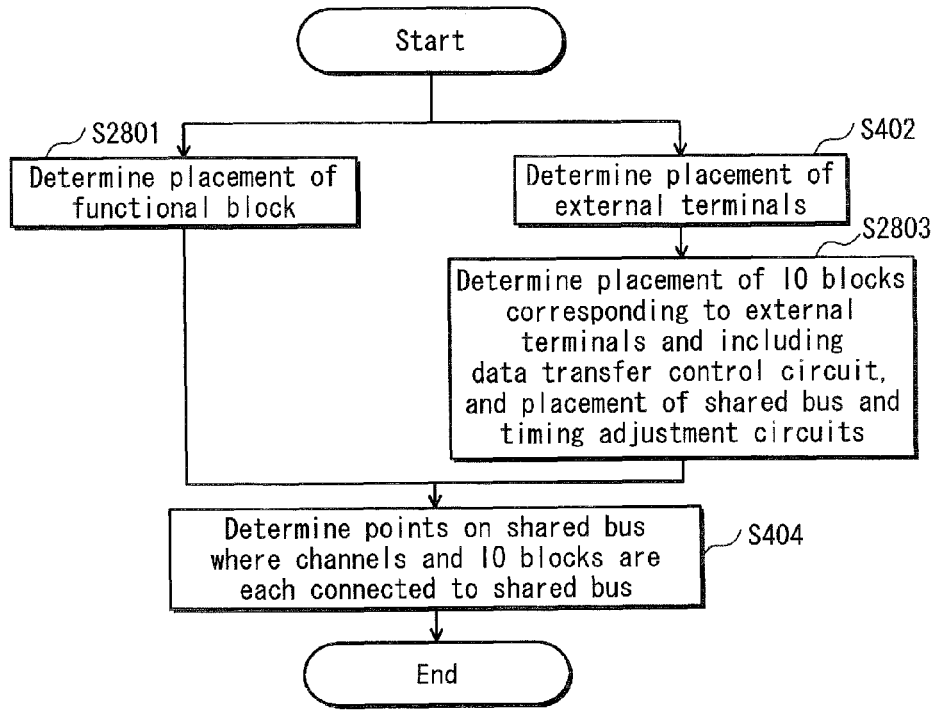

An example of the layout design method in such a case is shown in FIGS. 28A and 28B. FIG. 28A shows an example of the layout design method shown in FIG. 4A in which the data transfer control circuit is not included in the functional block. The same number is assigned to common steps in the methods shown in FIGS. 4A, 4B, 28A and 28B, and different numbers are assigned to different steps in the methods shown in FIGS. 4A, 4B, 28A and 28B. Note that, in addition to the layout design method shown in FIGS. 4A and 4B, the design method in Embodiment 4 in which the data transfer control circuit is not included in the functional block is also applicable to the layout design methods shown in FIGS. 1A, 1B, 6A and 6B.

The flow chart of FIG. 28A is different from the flow chart of FIG. 4A in timing at which the placement of the data transfer control circuits is determined.

As can be seen from comparison to processing in the Step S401, the placement of the functional blocks in which the data transfer control circuit is not included is first determined in a Step S2801 (step S2801).

After the placement of the external terminals is determined (step S402), placement of IO blocks that each correspond to a different one of the external terminals and include the data transfer control circuit is determined. In a case where each of the IO blocks does not include the data transfer control circuit, the placement of the data transfer control circuit is also determined such that the data transfer control circuit corresponds to each of the IO blocks. After the placement of the IO blocks is determined, the placement of the shared bus and one or more timing adjustment circuits to be inserted into the shared bus is determined (step S2803).

Note that FIG. 28B shows the layout design method in which steps shown in FIG. 28A are performed in parallel with each other, similarly to FIG. 4B.

Configuration

The following describes a configuration of a semiconductor integrated circuit designed according to the design method shown in each of FIGS. 28A and 28B.

Figure 29:
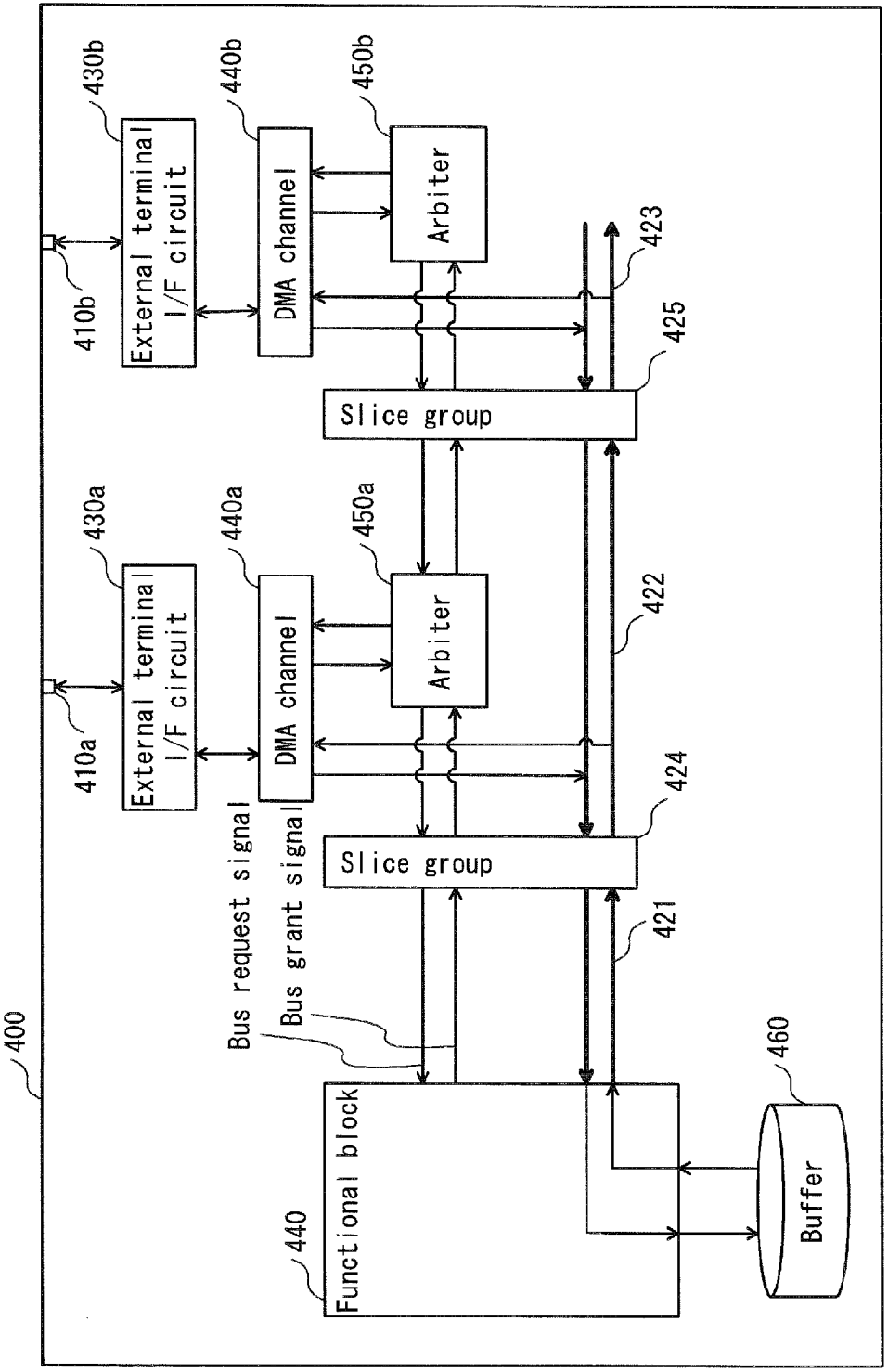
FIG. 29 illustrates an example of a configuration of the semiconductor integrated circuit pertaining to Embodiment 4.

FIG. 29 is a block diagram illustrating a functional configuration of a semiconductor integrated circuit 400.

The configuration illustrated in FIG. 29 is different from the configuration illustrated in each of FIGS. 22 and 23 in that a circuit having a DMAC function is provided as the data transfer control circuit (DMA channel) so as to correspond to each of the external terminal I/F circuits, and a simplified arbiter is provided so as to correspond to each of the DMA channels instead of providing the uplink arbiter and the downlink arbiter. That is to say, with the configuration illustrated in each of FIGS. 22 and 23, the DMA channel is configured such that a single circuit (DMAC) performs control over a remote external terminal I/F circuit, while the DMAC function is shifted to the external terminal I/F circuit-side with the configuration in Embodiment 4 illustrated in FIG. 29.

The following describes a configuration of the semiconductor integrated circuit 400 designed in the above-mentioned manner. Note that description on the same configuration as that of the semiconductor integrated circuits 200 and 300 is omitted here, and description is made on the configuration different from that of the semiconductor integrated circuits 200 and 300.

As illustrated in FIG. 29, the semiconductor integrated circuit 400 designed according to the method shown in the flow chart of FIGS. 28A and 28B includes a functional block 440, external terminals 410a and 410b, external terminal I/F circuits 430a and 430b, DMA channels 440a and 440b, arbiters 450a and 450b, slice groups 424 and 425, slice buses 421, 422 and 423 and a buffer 460. These circuits are connected as illustrated in FIG. 29.

The semiconductor integrated circuit 400 is a circuit having functions including a function of receiving, by the external terminals 410a and 410b, data transmitted from an external device connected to the semiconductor integrated circuit 400 and transferring the data to the buffer 460, and a function of transferring, by the external terminals 410a and 410b, data transmitted from the buffer 460 to the external device connected to the semiconductor integrated circuit 400.

Functions of the external terminals 410a and 410b, the slice groups 424 and 425, and the buffer 460 are similar to the functions of the respective components described in Embodiment 1, 2 and 3 above.

The DMA channel 440a has a function of controlling data transfer between the external terminal I/F circuit 430a and the buffer 460. In order to perform the data transfer, the DMA channel 440a first transmits a data transfer request to the arbiter 450a. After being granted the shared bus by the arbiter 450a, the DMA channel 440a performs the data transfer.

The DMA channel 440b has a function of controlling data transfer between the external terminal I/F circuit 430b and the buffer 460. In order to perform the data transfer, the DMA channel 440b first transmits a data transfer request to the arbiter 450b. After being granted the shared bus by the arbiter 450b, the DMA channel 440b performs the data transfer.

The DMA channels 440a and 440b are each connected to the shared bus (421, 422 and 423). Therefore, it is necessary to be granted the shared bus to actually perform the data transfer.

The arbiters 450a and 450b are provided to manage the shared bus.

When the arbiter 450a receives the data transfer request from the DMA channel and, at the same time, receives the bus request signal from the arbiter 450*b*, which is located further downstream than the arbiter 450*a* as viewed from the functional block 440, the arbiter 450*a* prioritizes the bus request signals according to a predetermined policy, and outputs a bus request signal with the highest priority upstream (to the functional block 440). When the arbiter 450*a* does not receive the data transfer request from the DMA channel and, at the same time, receives the bus request signal from the arbiter 450*b*, which is located further downstream than the arbiter 450*a* as viewed from the functional block 440, the arbiter 450*a* outputs the bus request signal received from the arbiter 450*b* upstream as it is.

The functional block 440 has a function of transmitting the bus grant signal to the arbiter 450*a* at the right timing to grant the bus (e.g. the timing at which the shared bus is not used by any circuits) according to the bus request signal transmitted from the arbiter 450*a*.

With such a configuration, it becomes easier to add or remove the external terminal and the external terminal I/F circuit. Furthermore, since the arbiter only has to manage the bus in the above-mentioned manner, it is unnecessary to redesign the arbiter.

Figure 30:
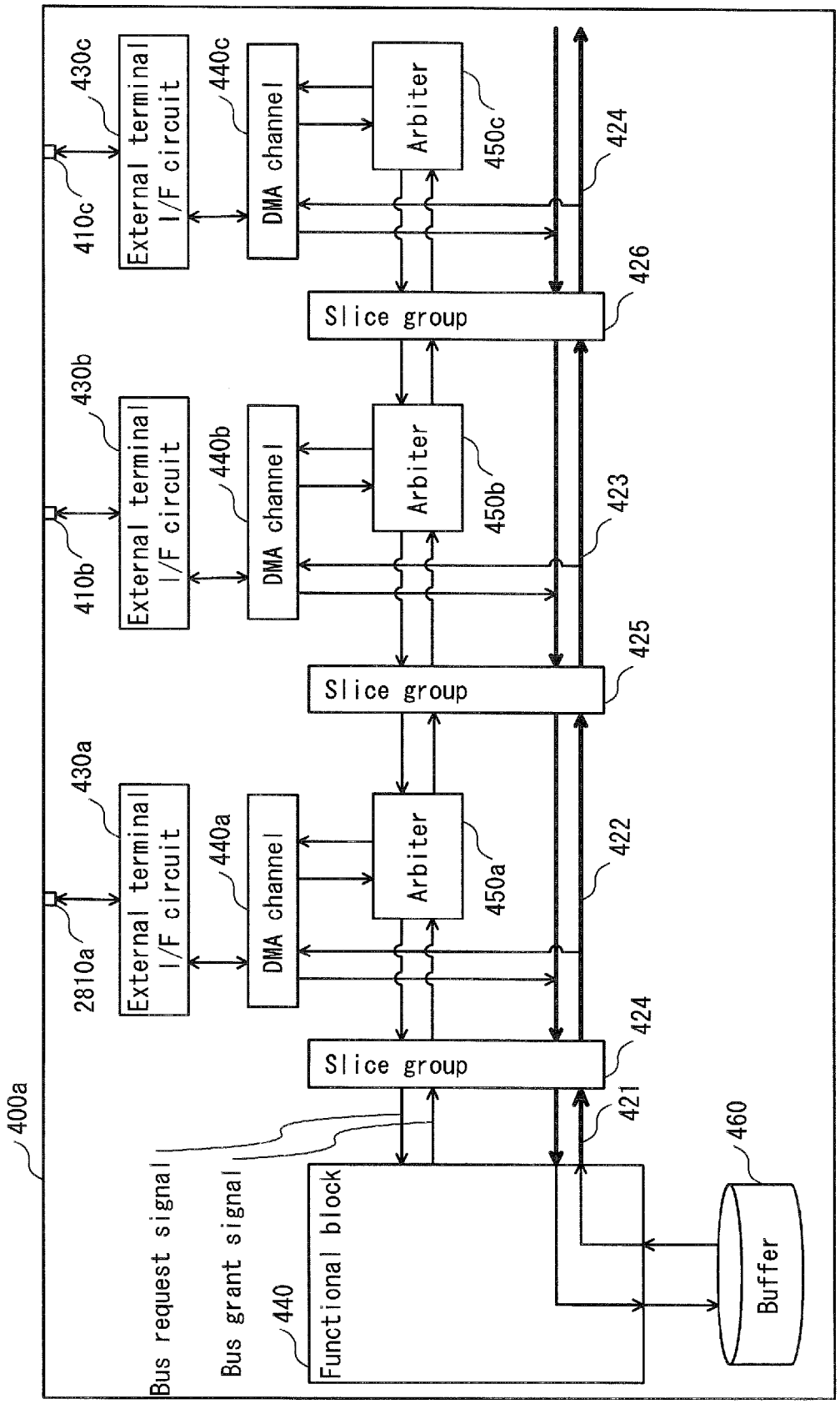
FIG. 30 illustrates an example of a configuration in which a data transfer path is newly added to a semiconductor integrated circuit 400.
Figure 31:
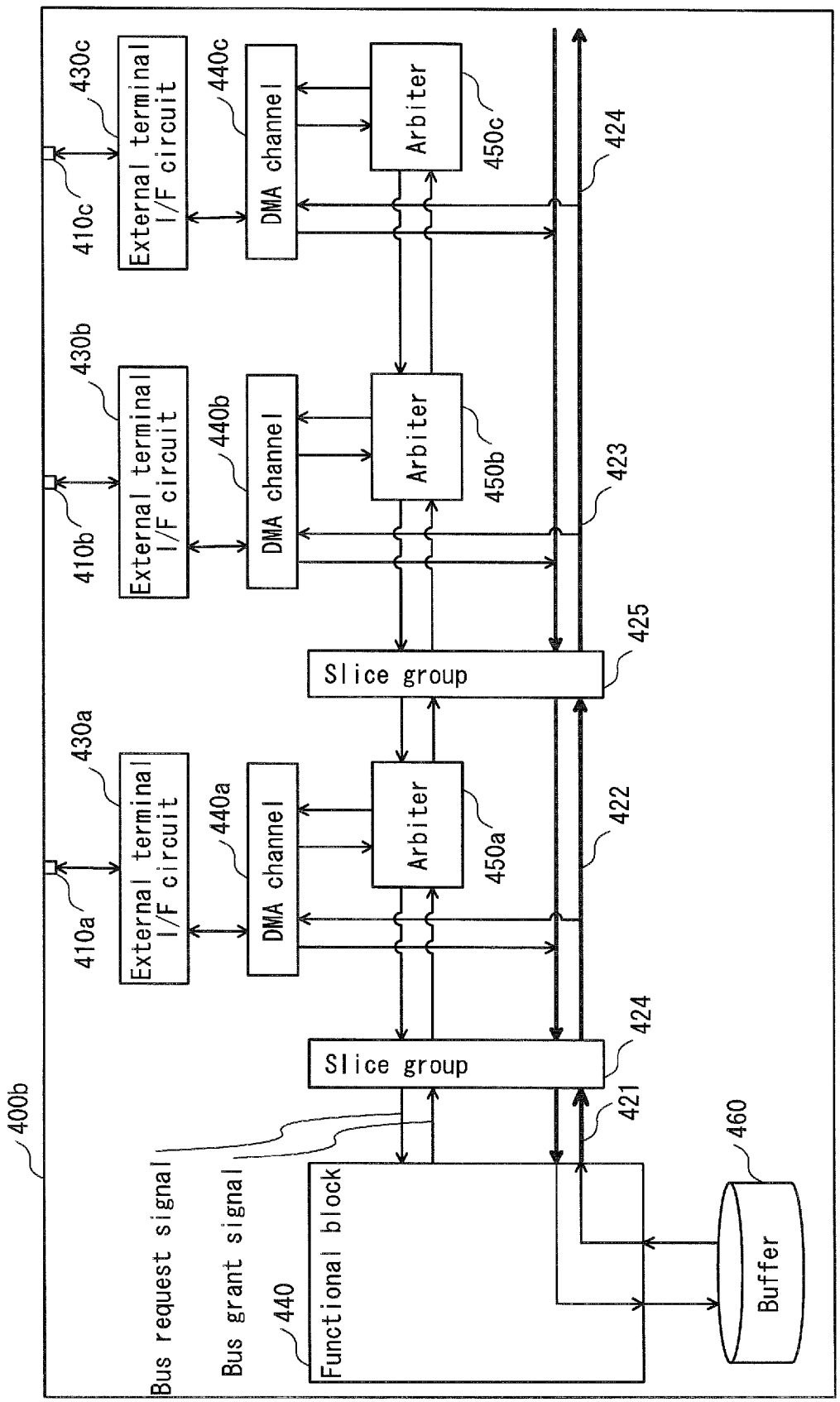
FIG. 31 illustrates another example of a configuration in which a data transfer path is newly added to the semiconductor integrated circuit 400.

FIG. 30 illustrates a semiconductor integrated circuit 400*a* in which an external terminal 410*c*, an external terminal I/F circuit 430*c*, a DMA channel 440*c* and an arbiter 450*c* are newly added to the configuration illustrated in FIG. 29. In FIG. 30, a slice group 426 is newly added. Note that the slice group 426 is provided according to the wiring length of the shared bus. Therefore, in a case where the wiring length to the newly added external terminal and the external terminal I/F circuit is not so large, there is unnecessary to newly provide the slice group for timing adjustment. In such a case, a semiconductor integrated circuit 400*b* having a configuration as illustrated in FIG. 31 is designed.

Figure 32:
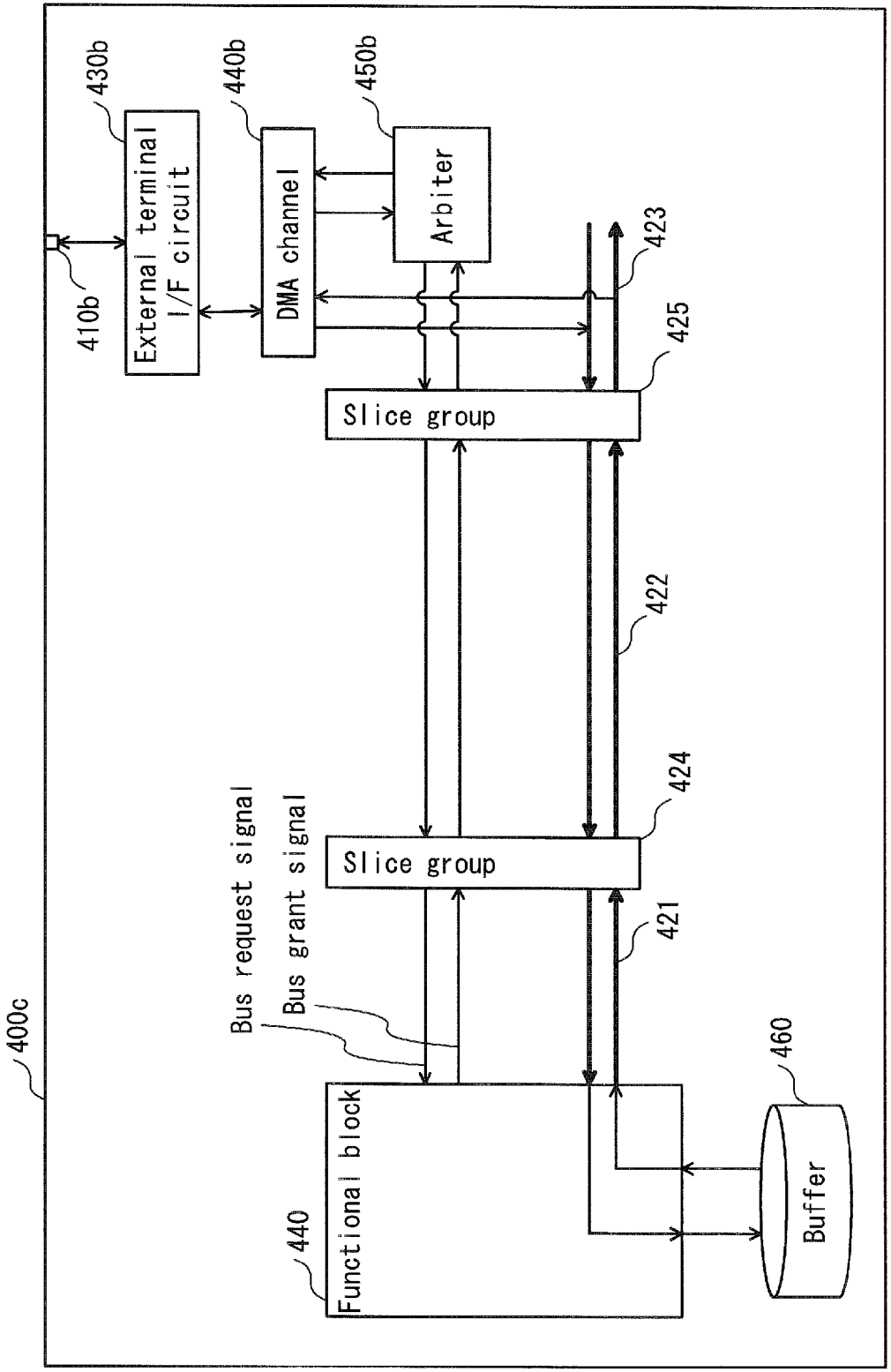
FIG. 32 illustrates an example of a configuration in which a data transfer path is removed from the semiconductor integrated circuit 400.

On the contrary, the data transfer path (a combination of the external terminal, the external terminal I/F circuit, the DMA channel and the arbiter) originally designed can become unnecessary. FIG. 32 illustrates a configuration in which the data transfer path is removed instead of being added. With such a configuration, it becomes possible to add or remove a data transfer path by considering a combination of the external terminal, the external terminal I/F circuit, the DMA channel and the arbiter as one unit.

As illustrated in FIG. 29 and other figures, since components are arranged by considering the combination of the external terminal, the external terminal I/F circuit, the DMA channel and the arbiter as one unit, a design change such as addition or removal of the external terminal and the external terminal I/F circuit can easily be made compared with the configuration illustrated in FIGS. 9, 22 and 23.

Figure 33:
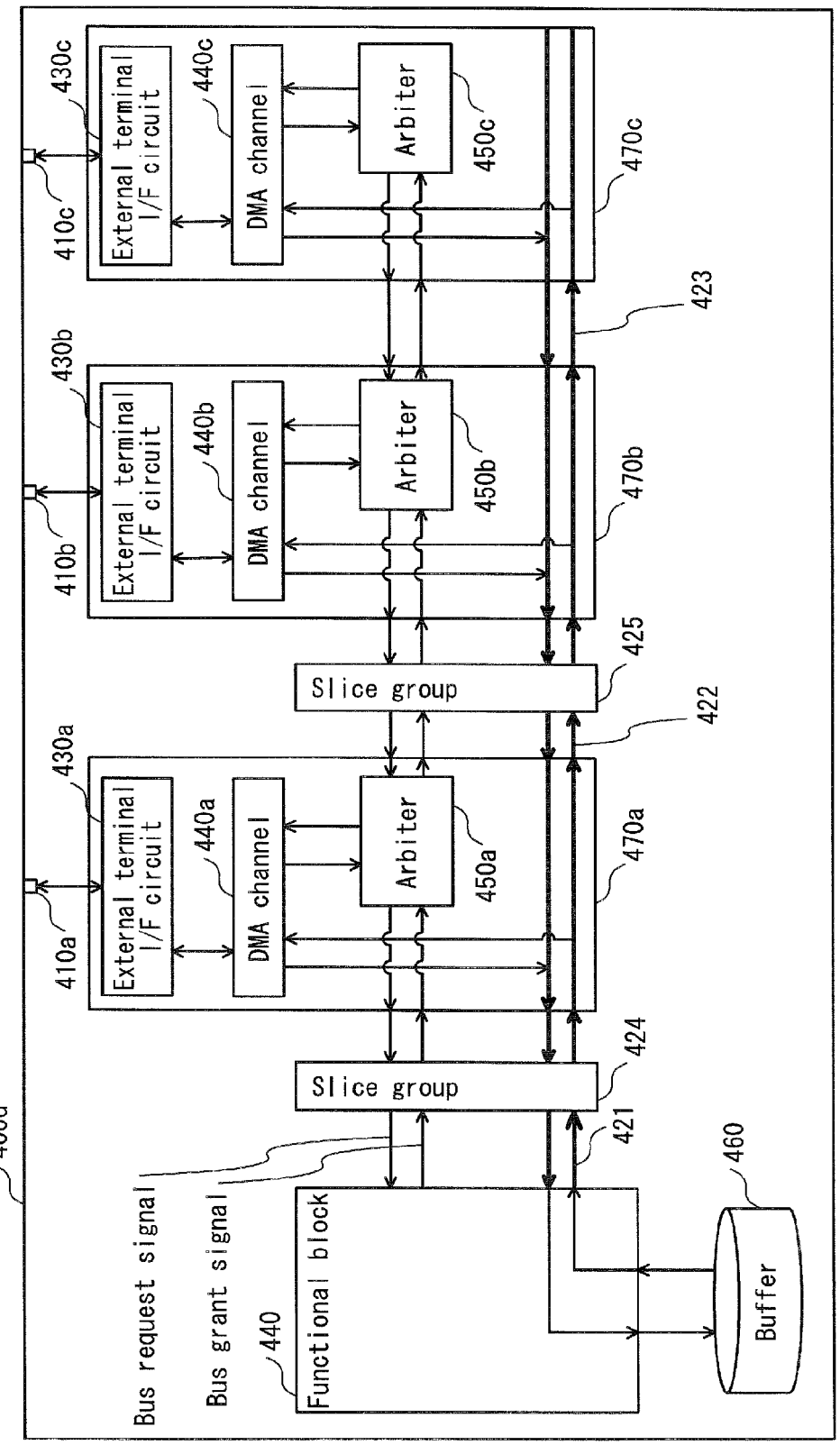
FIG. 33 illustrates an example of a configuration of a semiconductor integrated circuit in a case where blocks are connected to each other in a daisy chain.

Although FIGS. 29, 30, 31 and 32 each illustrate an example in which the functional block and each of the IO blocks are connected to each other in a bus topology, the functional block and each of the IO blocks may be connected to each other in a daisy-chain topology. As the configuration in which the functional block and each of the IO blocks are connected to each other in a daisy-chain topology, a configuration as illustrated in FIG. 33 is considered, for example. A semiconductor integrated circuit 400*d* illustrated in FIG. 33 has a configuration obtained by changing the configuration of the semiconductor integrated circuit 400*b* illustrated in FIG. 31 in which the functional block and each of the IO blocks are connected to each other in a bus topology so as to be connected to each other in a daisy-chain topology. For example, a circuit including, as the IO blocks, the external terminal I/F circuit (430*a*/430*b*/430*c*), the DMA channel (440*a*/440*b*/440*c*) and the arbiter (450*a*/450*b*/450*c*) in a single package is used. As illustrated in FIG. 33, the functional block 440, the slice groups 424 and 425, and IO blocks 470*a*, 470*b* and 470*c* are connected to one another via the bus (421, 422 and 423) in a daisy-chain topology.

Figure 34:
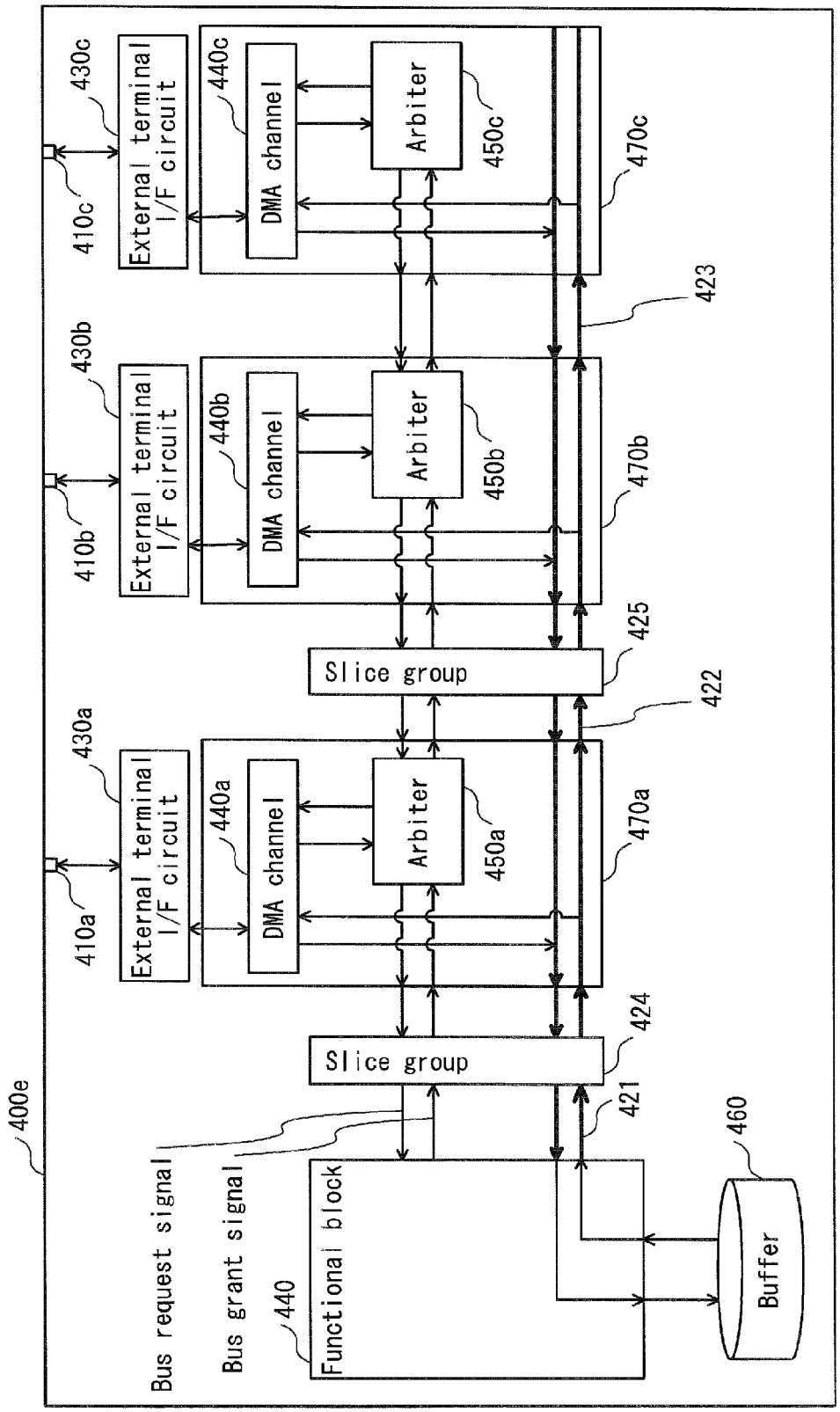
FIG. 34 illustrates another example of the configuration of the semiconductor integrated circuit in the case where blocks are connected to each other in a daisy chain.
Figure 35A:
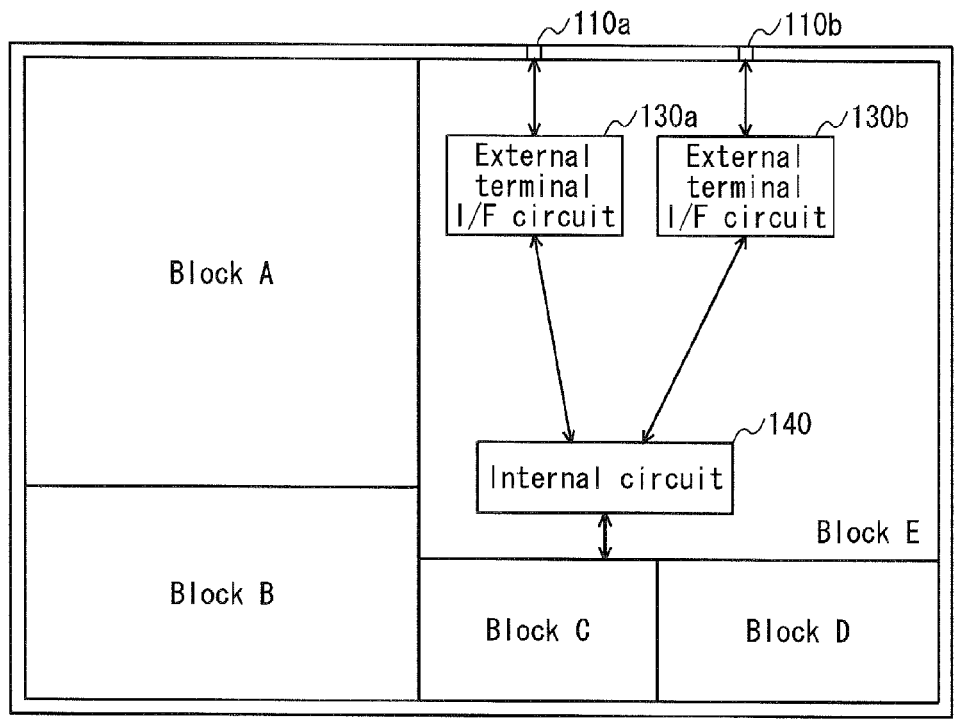
FIGS. 35A and 35B illustrate a conventional layout design method.
Figure 35B:
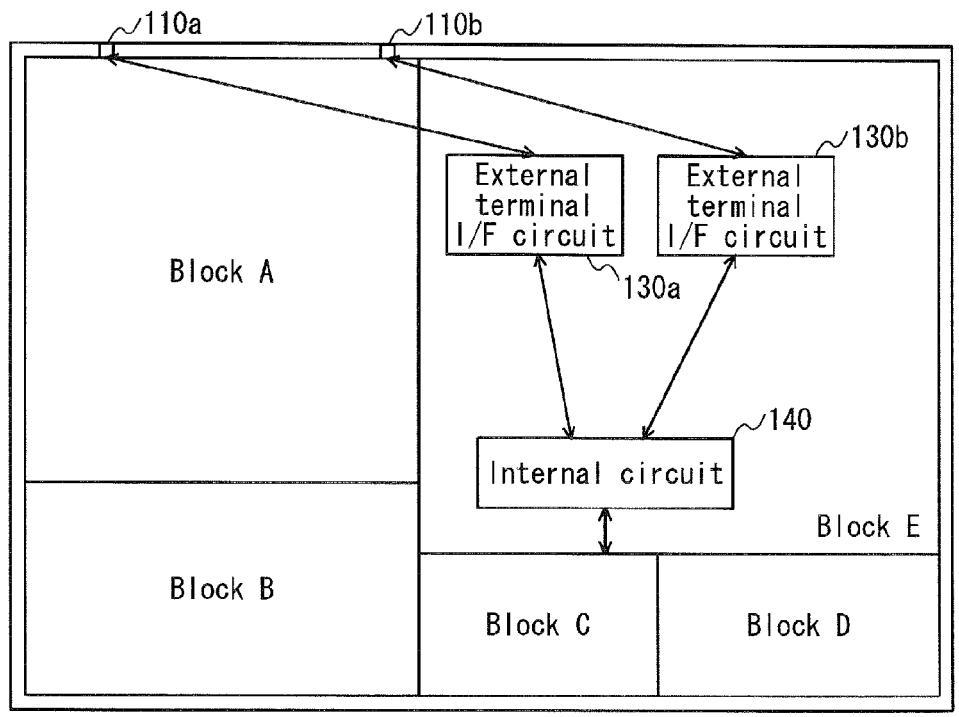

Also, as a semiconductor integrated circuit 400*e* illustrated in FIG. 34, the IO blocks 470*a*, 470*b* and 470*c* may be a circuit including a pair of the DMA channel (440*a*/440*b*/440*c*) and the arbiter (450*a*/450*b*/450*c*) in a single package.

With such a configuration, the semiconductor integrated circuit 400*d* illustrated in FIG. 33 and the semiconductor integrated circuit 400*e* illustrated in FIG. 34 each substantially fulfill an equivalent function to the semiconductor integrated circuit 400*b* illustrated in FIG. 31.

Whether to connect blocks in the bus topology or in the daisy-chain topology is determined according to a design specification. The layout design is performed according to the design specification.

Summary

As described in Embodiment 4 above, with the configuration in which the arbiter and the DMA channel as the data transfer control circuit are provided so as to correspond to the external terminal and the external terminal I/F circuit, it is possible to provide the layout design method by which the data transfer path being the combination of the external terminal, the external terminal I/F circuit, the DMA channel and the arbiter is easily added or removed, and to provide the semiconductor integrated circuit designed by the layout design method.

Supplement

Although the present invention has been described based on the above embodiments, it is obvious that the present invention is not limited to the above embodiments. The following describes other modifications of the above embodiments of the present invention that can be made without departing from the spirit of the present invention.

(1) The layout design method has been described in the above embodiments. As for the layout design method, human beings may design the layout of the semiconductor integrated circuit according to the layout design method. Alternatively, a device that automatically designs the layout of the semiconductor integrated circuit may design the layout of the semiconductor integrated circuit according to the layout design method in the above embodiments, or the device may instruct another device to design the layout of the semiconductor integrated circuit according to the layout design method in the above embodiments.

(2) A design device that designs the layout of the semiconductor integrated circuit may perform the layout design method described in the above embodiments.

That is to say, the design device receives, as an input, information on the area of the data transfer control circuit, the functional blocks and the like, and information on the total area on which components are allowed to be placed according to the size of the semiconductor integrated circuit, and then determines the optimum placement of the functional blocks and the data transfer control circuit. The details of the method for determining the placement are disclosed in various prior arts, and thus the description thereof is omitted here.

After determining the placement of the functional blocks and the data transfer control circuit, the design device receives an input of information on the placement of the external terminals from, for example, an operator of the design device.

After receiving the input of the information on the placement of the external terminals, the design device determines the placement indicated by the information as the actual placement of the external terminals.

The design device determines the placement of the IO blocks such that each of the IO blocks is placed close to any of the external terminals. The placement of the IO blocks are determined such that each of the IO blocks is within a predetermined distance from the any of the external terminals and does not overlap the other components, and the wiring length between each of the IO blocks and the any of the external terminals is reduced as much as possible.

After determining the placement of the IO blocks, the design device determines placement of buses each connecting a different one of the IO blocks to the data transfer control circuit such that each of the buses does not overlap the other components.

After determining the placement of the buses, the design device determines the number of timing adjustment circuits to be inserted into each of the buses according to the wiring length of the bus, and determines placement of the determined number of timing adjustment circuits such that the timing adjustment circuits do not overlap the other components. The number of timing adjustment circuits to be inserted into each of the buses is determined in the following manner. That is, the design device has stored therein a table indicating the number of timing adjustment circuits to be inserted into each of the buses having the wiring length falling within a predetermined range. The design device calculates the wiring length of a bus based on the placement of the bus. Based on the table indicating the range within which the calculated wiring length falls, the design device determines the number of timing adjustment to be inserted into the bus.

In the above-mentioned manner, the layout design as illustrated in FIG. 3B is finally performed.

Although description has been made on the design device that designs the layout according to the layout design method in Embodiment 1 here, the design device may design the layout according to the layout design method in the other embodiments.

The design device may also design the layout according to the layout design method in Modification 1 and 2, or Embodiment 4.

Figure 27:
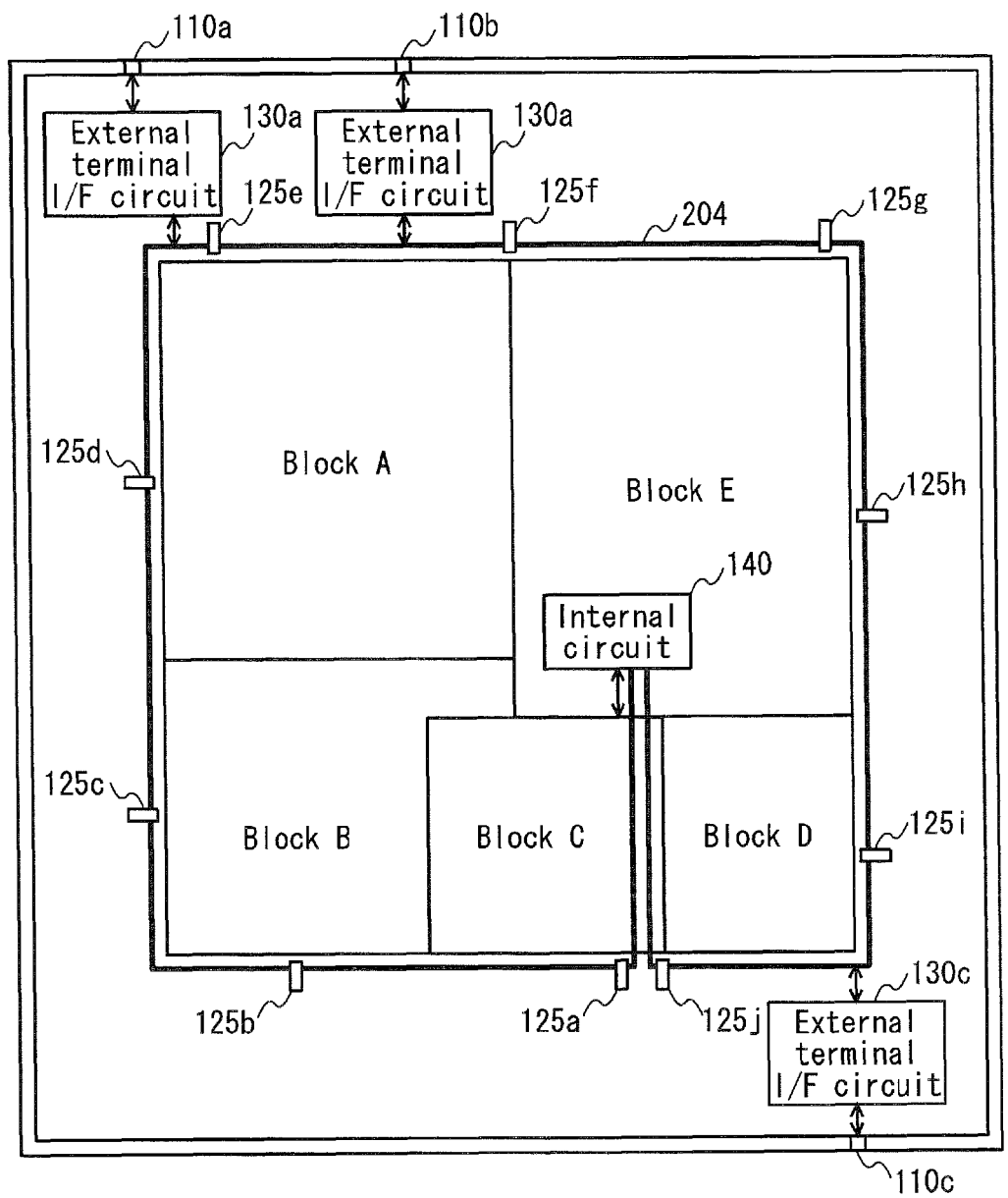
FIG. 27 illustrates another example of layout of a semiconductor integrated circuit.

(3) In the layout design method in the above embodiments, the placement of the shared bus may be determined such that the shared bus is placed as illustrated in FIG. 27. That is to say, the placement of the shared bus may be determined such that the shared bus surrounds functional blocks. Then, according to the wiring length from the internal circuit 140, placement of slice groups 125a, 125b, 125c, 125d, 125e, 125f, 125g, 125h, 125i and 125j as the timing adjustment circuits is determined. After spaces for the external terminal I/F circuits are ensured around the slice groups 125a, 125b, 125c, 125d, 125e, 125f, 125g, 125h, 125i and 125j, determination of the placement of the external terminals is waited.

After the placement of the external terminals is determined, the placement is determined as actual placement of the external terminals 110a and 110b and an external terminal 110c. Placement of the external terminal I/F circuits 130a and 130b and an external terminal I/F circuit 130c as the IO blocks is determined such that each of the external terminal I/F circuits is placed close to any of the external terminals. Then, placement of wiring connecting each of the external terminal I/F circuits to the any of the external terminals is determined, and placement of the shared bus is determined such that a linear distance between the shared bus and each of the external terminal I/F circuits is reduced as much as possible.

In the above-mentioned method, the placement of the wiring connecting each of the external terminal I/F circuits to the shared bus is easily determined without considering how to thread the shared bus from each of the IO blocks to the data transfer control circuit through components included in functional blocks. Therefore, the above-mentioned method is an effective method to be applied to the design method in Modification 2 above.

(4) Embodiment 2 above describes the example in which the five pieces of information, namely the command, the downlink data, the downlink information, the uplink data and the uplink information are all transmitted/received between the DMAC 140 and each of the external terminal I/F circuits 130a and 130b. The present invention, however, is not limited to this configuration. For example, only the command and the downlink data may be transmitted/received between the DMAC 140 and each of the external terminal I/F circuits 130a and 130b as long as the subset of the five pieces of information are included.

(5) Embodiment 2 above describes the example in which the write ready signal and the read ready signal transmitted from each of the external terminal I/F circuits 130a and 130b to the DMAC 140 are sliced. The present invention, however, is not limited to this configuration. The write ready signal and the read ready signal may be directly transmitted from each of the external terminal I/F circuits 130a and 130b to the DMAC 140 without passing through the slices.

(6) Embodiment 2 above describes the example in which bus request signal group transmitted from the external terminal I/F circuit 130a to the arbiter 152 is sliced by the slice 125B. The present invention, however, is not limited to this configuration. The bus request signal group may be directly transmitted to the arbiter without passing through the slices.

(7) Embodiment 2 above describes the example in which each of the arbiters 151 and 152 includes arbiters for all the components of the shared bus (the command bus, the downlink data bus, the downlink information bus, the uplink data bus and the uplink information bus). The present invention, however, is not limited to this configuration.

For example, in a case where the DMAC 140 does not need to transmit the downlink information to the external terminal I/F circuit group 130 and the downlink information bus is not implemented as the shared bus, it is unnecessary to implement the downlink information bus arbiter 1513 corresponding to the downlink information bus.

Even in a case where the DMAC 140 needs to transmit the downlink information but only the channel 141a transmits information and the channel 141b does not transmit information (in a case where it is unnecessary to occupy the downlink information bus), it is unnecessary to implement the downlink information bus arbiter 1513.

(8) Embodiment 2 above describes the example in which the command bus arbiter 1511, the downlink data bus arbiter 1512 and the downlink information bus arbiter 1513 are laid out in a localized physical area within the arbiter 1510. The present invention, however, is not limited to this configuration. The command bus arbiter 1511, the downlink data bus arbiter 1512 and the downlink information bus arbiter 1513 may be laid out in distributed areas, as necessary. The same applies to the uplink data bus arbiter 1522 and the uplink information bus arbiter 1523 included in the arbiter 1520.

(9) Embodiment 2 above describes the example in which the data is transferred after the command is transmitted. The method for transmitting the command and the number of times that the command is transmitted, however, are not limited to those described in Embodiment 2. For example, the commands may sequentially be transmitted N times (N is an integer equal to or greater than two) before transmission of data, and then the data transfer may be started.

(10) In Embodiment 3, the command bus is taken as an example. The present invention, however, is not limited to this configuration. For example, a similar configuration may be adopted to the downlink data bus and the downlink information bus that each transfer information from the DMAC 240 (340) to each of the external terminal I/F circuits 230*a*, 230*b*, 230*c* and 230*d* (330*a*, 330*b*, 330*c* and 330*d*). Also, a similar configuration may be adopted to the uplink data bus and the uplink information bus that each transfer information from the external terminal I/F circuit group 230 to the DMAC 240.

(11) The above embodiments describe the examples in each of which the IO terminals are in one-to-one correspondence with the external terminal I/F circuits. The present invention, however, is not limited to this configuration. A single external terminal I/F circuit may correspond to a plurality of the IO terminals. The semiconductor integrated circuit to be designed may have a configuration in which a single external terminal I/F circuit and a single DMA channel are included as illustrated in FIG. 32.

(12) A control program including a program code for causing a processor such as a layout design device and various circuits connected to the processor to perform operations pertaining to the layout design described in the above embodiments (see FIGS. 1A, 1B, 4A, 4B, 6A and 6B) may be recorded on a recording medium or distributed via various communication channels. Examples of the recording medium are an IC card, a hard disk, an optical disc, a flexible disk and a ROM. The distributed control program are stored in a memory and the like capable of being read by the processor and are provided for use. By the processor executing the control program, various functions as described in the above embodiments are achieved.

(13) Each functional block and each circuit illustrated in block diagrams (see FIGS. 8, 9, 10, 11A, 11B, 12A, 12B, 22 and 23) in the above embodiments may be integrated into a single or a plurality of LSIs (Large Scale Integration). Also, a plurality of functional blocks may be achieved by a single LSI.

While an LSI has been referred to, the terms Integrated Circuit (IC), system LSI, VLSI (Very Large Scale Integration), SLSI (Super Large Scale Integration) or ULSI (Ultra Large Scale Integration) may be used depending on the degree of integration.

Furthermore, if technology for forming integrated circuits that replaces LSIs emerges, owing to advances in semiconductor technology or to another derivative technology, the integration of functional blocks may naturally be accomplished using such technology. The application of biotechnology or the like is possible.

(14) The following describes the embodiments and the effects of the integrated circuit manufacturing method and the semiconductor integrated circuit pertaining to the present invention.

A first integrated circuit manufacturing method pertaining to the present invention is an integrated circuit manufacturing method including: a layout design step of creating a mask pattern for integrated circuit manufacturing; and a manufacturing step of manufacturing an integrated circuit on a semiconductor material using the mask pattern, wherein the layout design step includes: a first step of determining placement of a functional block; a second step of determining placement of a plurality of IO (Input-Output) terminals for connecting the integrated circuit to an external device; a third step of determining placement of one or more IO blocks each to be connected to any of the plurality of IO terminals, according to the placement of the plurality of IO terminals determined in the second step; and a fourth step of determining placement of one or more buses each connecting a different one of the IO blocks to the functional block, and determining (i) a number of timing adjustment circuits to be inserted into each of the buses according to a wiring length of the bus and (ii) placement of the determined number of timing adjustment circuits, the timing adjustment circuits each adjusting timing of signals flowing through the bus.

A second integrated circuit manufacturing method pertaining to the present invention is an integrated circuit manufacturing method including: a layout design step of creating a mask pattern for integrated circuit manufacturing; and a manufacturing step of manufacturing an integrated circuit on a semiconductor material using the mask pattern, wherein the layout design step includes: a first step of determining placement of a functional block; a second step of determining placement of a plurality of IO (Input-Output) terminals for connecting the integrated circuit to an external device; a third step of determining placement of one or more IO blocks each to be connected to any of the plurality of IO terminals, according to the placement of the plurality of IO terminals determined in the second step; and a fourth step of determining placement of a shared bus via which each of the IO blocks is connected to the functional block, and determining (i) a number of timing adjustment circuits to be inserted into the shared bus according to a wiring length of the shared bus and (ii) placement of the determined number of timing adjustment circuits, the timing adjustment circuits each adjusting timing of signals flowing through the shared bus.

A third integrated circuit manufacturing method pertaining to the present invention is an integrated circuit manufacturing method including: a layout design step of creating a mask pattern for integrated circuit manufacturing; and a manufacturing step of manufacturing an integrated circuit on a semiconductor material using the mask pattern, wherein the layout design step includes: a first step of determining placement of a functional block; a second step of determining placement of a shared bus, and determining (i) a number of timing adjustment circuits to be inserted into the shared bus and (ii) placement of the determined number of timing adjustment circuits, the timing adjustment circuits each adjusting timing of signals flowing through the shared bus; a third step of determining placement of a plurality of IO (Input-Output) terminals for connecting the integrated circuit to an external device; a fourth step of determining placement of one or more IO blocks each to be connected to any of the plurality of IO terminals, according to the placement of the plurality of IO terminals determined in the third step; and a fifth step of determining a point on the shared bus where the functional block is connected to the shared bus and points on the shared bus where the IO blocks are each connected to the shared bus.

A semiconductor integrated circuit manufactured by these integrated circuit manufacturing methods is a semiconductor integrated circuit comprising: a functional block; a plurality of IO (Input-Output) terminals; one or more IO blocks each connected to any of the plurality of IO terminals; a shared bus shared among the functional block and the IO blocks; and one or more timing adjustment circuits inserted into the shared bus to adjust timing of signals flowing through the shared bus; wherein the shared bus is divided into a plurality of slices by the timing adjustment circuits, and the functional block and the IO blocks are each connected to any one of the plurality of slices.

With these layout design methods, constraints on the wiring connecting each external terminal to corresponding one of the IO blocks and the wiring connecting each external terminal to the data transfer circuit are alleviated, and an increase of wiring area, which is caused by installation of the wiring, is suppressed. Therefore, reduction of load on the layout design and suppression of the increase in area are achieved.

In the above first, second and third integrated circuit manufacturing methods, the functional block may include a data transfer control circuit.

Alternatively, in the above semiconductor integrated circuit, the functional block may include a data transfer control circuit.

With such a configuration, by only placing the functional block including the data transfer control circuit, an integrated circuit having a functional part that can control the data transfer is manufactured.

Also, in the above first, second and third integrated circuit manufacturing methods, each of the IO blocks may include a data transfer control circuit.

Alternatively, in the above semiconductor integrated circuit, each of the IO blocks may include a data transfer control circuit.

With such a configuration, by including the data transfer control circuit in each of the IO blocks, it becomes easier to add or remove a data transfer path by using the IO terminal and the IO block as one unit.

In the above first and second integrated circuit manufacturing methods, in the third step, the placement of the IO blocks may be determined such that each of the IO blocks is placed close to the any of the plurality of IO terminals to be connected thereto.

Alternatively, in the above third integrated circuit manufacturing method, in the fourth step, the placement of the IO blocks may be determined such that each of the IO blocks is placed close to the any of the plurality of IO terminals to be connected thereto.

Alternatively, in the above semiconductor integrated circuit, each of the IO blocks may be placed close to the any of the plurality of IO terminals connected thereto.

Here, the term "close to" indicates that the IO block is placed within such a distance that a communication delay occurring in the data transfer between the external terminal and the IO block is acceptable as an error.

Since the IO block is placed close to the external terminal, the load on the layout design can be reduced without taking into account a configuration for timing adjustment in the data transfer between the external terminal and the IO block.

In the above first integrated circuit manufacturing method, each of the timing adjustment circuits may be a circuit that adjusts a phase difference between input signals flowing through each of the buses and outputs the input signals after adjustment, and in the fourth step, the number of timing adjustment circuits may be determined according to an amount of delay of the input signals that varies depending on the wiring length.

Alternatively, in the above second integrated circuit manufacturing method, each of the timing adjustment circuits may be a circuit that adjusts a phase difference between input signals flowing through the shared bus and outputs the input signals after adjustment, and in the fourth step, the number of timing adjustment circuits may be determined according to an amount of delay of the input signals that varies depending on the wiring length.

Furthermore, in the above third integrated circuit manufacturing method, each of the timing adjustment circuits may be a circuit that adjusts a phase difference between input signals flowing through the shared bus and outputs the input signals after adjustment, and in the second step, the number of timing adjustment circuits may be determined according to an amount of delay of the input signals that varies depending on a wiring length of the shared bus.

With such a configuration, an integrated circuit manufactured by these integrated circuit manufacturing methods adjusts a delay in signals flowing through the bus from the operation clock.

In the above second integrated circuit manufacturing method, in the fourth step, the placement of the shared bus may be determined such that each of the IO blocks and the functional block are connected to each other in a daisy chain.

In the above third integrated circuit manufacturing method, in the fifth step, the determination may be made such that each of the IO blocks and the functional block are connected to each other by the shared bus in a daisy chain.

With such a configuration, a semiconductor integrated circuit having a circuit configuration in which each of the IO blocks and the functional block are connected to each other in a daisy chain is designed according to these integrated circuit manufacturing methods.

Also, the above semiconductor integrated circuit may further comprise an uplink arbiter that is connected to one end of the shared bus and arbitrates bus request signals with respect to data transfer from each of the IO blocks to the data transfer control circuit, the uplink arbiter may arbitrate the bus request signals transmitted from the IO blocks and issue a bus grant signal to one of the IO blocks, and the bus grant signal issued to the one of the IO blocks may be delayed while passing through the shared bus divided into the plurality of slices and reach the one of the IO blocks.

With such a configuration, the uplink arbiter is simplified and efficiency for shared bus utilization increases.

Also, in the above semiconductor integrated circuit, the shared bus may include: a downlink bus for transmitting signals from the data transfer control circuit to each of the IO blocks; and an uplink bus for transmitting signals from each of the IO blocks to the data transfer control circuit.

Furthermore, in the above semiconductor integrated circuit, the uplink arbiter may hold information on a burst length of data to be transmitted from each of the IO blocks, and the uplink arbiter may determine interval of the arbitration of the bus request signals based on information on a burst length of data to be transmitted from the one of the IO blocks to which the bus grant signal has been issued.

With such a configuration, even in a case where the burst length of data varies among IO blocks, efficiency for uplink bus utilization increases.

Also, the above semiconductor integrated circuit may further comprise a downlink arbiter that is connected to the data transfer control circuit and arbitrates bus request signals with respect to data transfer from the data transfer control circuit to each of the IO blocks, and the data transfer control circuit may output data to the shared bus in accordance with a timing at which data is delayed before reaching to any one of the plurality of slices connected to each of the IO blocks.

With such a configuration, the downlink arbiter is simplified and efficiency for shared bus utilization increases.

Also, in the above semiconductor integrated circuit, the downlink arbiter may hold information on a burst length of data to be transmitted from each of a plurality of channels, and the downlink arbiter may determine interval of the arbitration of the bus request signals based on information on a burst length of data to be transmitted from one of the plurality of channels to which a bus grant signal has been issued.

With such a configuration, even in a case where the burst length of data varies among channels, efficiency for downlink bus utilization increases.

In the above semiconductor integrated circuit, the shared bus may include: a bus for a device outputting data with a long burst length; and a bus for a device outputting data with a short burst length, and one of the bus for a device outputting data with a long burst length and the bus for a device outputting data with a short burst length may be selected and used according to a burst length of data transmitted between the data transfer control circuit and each of the IO blocks.

With such a configuration, efficiency for shared bus utilization increases without changing the interval of the arbitration depending on a device using the shared bus.

INDUSTRIAL APPLICABILITY

The integrated circuit manufacturing method pertaining to the present invention can perform the layout design of the integrated circuit even when the placement of the external terminals is not determined, contribute to the reduction of time to design the semiconductor integrated circuit, and be provided to manufacture the semiconductor integrated circuit.

REFERENCE SIGNS LIST 100, 200, 300, 400, 400a, 400b, 400c, 400d semiconductor integrated circuit
110a, 110b, 210a, 210b, 210c, 210d, 310a, 310b, 310c, 310d, 410a, 410b, 410c external terminal (IO terminal)
140 internal circuit (DMAC, data transfer control circuit)
141a, 141b, 241a, 241b, 241c, 241d, 341a, 341b, 341c, 341d, 441a, 441c channel
151, 152, 251, 252, 351a, 351b, 352a, 352b, 450a, 450b, 450c arbiter
130a, 130b, 230a, 230b, 230c, 230d, 330a, 330b, 330c, 330d, 430a, 430b, 430c external terminal I/F circuit (IO block)
124 bus
125a, 125b, 125c slice (timing adjustment circuit)
240, 340 DMAC (data transfer control circuit)
440 functional block
440a, 440b, 440c DMA channel (data transfer control circuit)
470a, 470b, 470c IO block

The invention claimed is:

1. An integrated circuit manufacturing method including:
a layout design step of creating a mask pattern for integrated circuit manufacturing; and
a manufacturing step of manufacturing an integrated circuit on a semiconductor material using the mask pattern, wherein
the layout design step includes:
   a first step of determining placement of a functional block;
   a second step of determining placement of a plurality of IO (Input-Output) terminals for connecting the integrated circuit to an external device;
   a third step of determining placement of one or more IO blocks each to be connected to any of the plurality of IO terminals, according to the placement of the plurality of IO terminals determined in the second step; and
   a fourth step of determining placement of one or more buses each connecting a different one of the IO blocks to the functional block, and determining (i) a number of timing adjustment circuits to be inserted into each of the buses according to a wiring length of the bus and (ii) placement of the determined number of timing adjustment circuits, the timing adjustment circuits each adjusting timing of signals flowing through the bus, and
at least one of the first step, the second step, the third step and the fourth step is performed by a design device.

2. The integrated circuit manufacturing method of claim 1, wherein
the functional block includes a data transfer control circuit.

3. The integrated circuit manufacturing method of claim 1, wherein
each of the IO blocks includes a data transfer control circuit.

4. The integrated circuit manufacturing method of claim 1, wherein
in the third step, the placement of the IO blocks is determined such that each of the IO blocks is placed close to the any of the plurality of IO terminals to be connected thereto.

5. The integrated circuit manufacturing method of claim 1, wherein
each of the timing adjustment circuits is a circuit that adjusts a phase difference between input signals flowing through each of the buses and outputs the input signals after adjustment, and
in the fourth step, the number of timing adjustment circuits is determined according to an amount of delay of the input signals that varies depending on the wiring length.

6. An integrated circuit manufacturing method including:
a layout design step of creating a mask pattern for integrated circuit manufacturing; and
a manufacturing step of manufacturing an integrated circuit on a semiconductor material using the mask pattern, wherein
the layout design step includes:
   a first step of determining placement of a functional block;
   a second step of determining placement of a plurality of IO (Input-Output) terminals for connecting the integrated circuit to an external device;
   a third step of determining placement of one or more IO blocks each to be connected to any of the plurality of IO terminals, according to the placement of the plurality of IO terminals determined in the second step; and
   a fourth step of determining placement of a shared bus via which each of the IO blocks is connected to the functional block, and determining (i) a number of timing adjustment circuits to be inserted into the shared bus according to a wiring length of the shared bus and (ii) placement of the determined number of timing adjustment circuits, the timing adjustment circuits each adjusting timing of signals flowing through the shared bus, and
at least one of the first step, the second step, the third step and the fourth step is performed by a design device.

7. The integrated circuit manufacturing method of claim 6, wherein
the functional block includes a data transfer control circuit.

8. The integrated circuit manufacturing method of claim 7, wherein
in the fourth step, the placement of the shared bus is determined such that each of the IO blocks and the functional block are connected to each other in a daisy chain.

9. The integrated circuit manufacturing method of claim 6, wherein
each of the IO blocks includes a data transfer control circuit.

10. The integrated circuit manufacturing method of claim 9, wherein in the fourth step, the placement of the shared bus is determined such that each of the IO blocks and the functional block are connected to each other in a daisy chain.

11. The integrated circuit manufacturing method of claim 6, wherein in the third step, the placement of the IO blocks is determined such that each of the IO blocks is placed close to the any of the plurality of IO terminals to be connected thereto.

12. The integrated circuit manufacturing method of claim 6, wherein each of the timing adjustment circuits is a circuit that adjusts a phase difference between input signals flowing through the shared bus and outputs the input signals after adjustment, and in the fourth step, the number of timing adjustment circuits is determined according to an amount of delay of the input signals that varies depending on the wiring length.

13. An integrated circuit manufacturing method including:

a layout design step of creating a mask pattern for integrated circuit manufacturing; and a manufacturing step of manufacturing an integrated circuit on a semiconductor material using the mask pattern, wherein the layout design step includes:
- a first step of determining placement of a functional block;
- a second step of determining placement of a shared bus, and determining (i) a number of timing adjustment circuits to be inserted into the shared bus and (ii) placement of the determined number of timing adjustment circuits, the timing adjustment circuits each adjusting timing of signals flowing through the shared bus;
- a third step of determining placement of a plurality of IO (Input-Output) terminals for connecting the integrated circuit to an external device;
- a fourth step of determining placement of one or more IO blocks each to be connected to any of the plurality of IO terminals, according to the placement of the plurality of IO terminals determined in the third step; and
- a fifth step of determining a point on the shared bus where the functional block is connected to the shared bus and points on the shared bus where the IO blocks are each connected to the shared bus so that an amount of wiring delay is small, and at least one of the first step, the second step, the third step, the fourth step, and the fifth step is performed by a design device.

14. The integrated circuit manufacturing method of claim 13, wherein the functional block includes a data transfer control circuit.

15. The integrated circuit manufacturing method of claim 14, wherein in the fifth step, the determination is made such that each of the IO blocks and the functional block are connected to each other by the shared bus in a daisy chain.

16. The integrated circuit manufacturing method of claim 13, wherein each of the IO blocks includes a data transfer control circuit.

17. The integrated circuit manufacturing method of claim 16, wherein in the fifth step, the determination is made such that each of the IO blocks and the functional block are connected to each other by the shared bus in a daisy chain.

18. The integrated circuit manufacturing method of claim 13, wherein in the fourth step, the placement of the IO blocks is determined such that each of the IO blocks is placed close to the any of the plurality of IO terminals to be connected thereto.

19. The integrated circuit manufacturing method of claim 13, wherein each of the timing adjustment circuits is a circuit that adjusts a phase difference between input signals flowing through the shared bus and outputs the input signals after adjustment, and in the second step, the number of timing adjustment circuits is determined according to an amount of delay of the input signals that varies depending on a wiring length of the shared bus.

20. A semiconductor integrated circuit comprising:

a functional block;

a plurality of IO (Input-Output) terminals;

one or more IO blocks each connected to any of the plurality of IO terminals;

a shared bus shared among the functional block and the IO blocks; and one or more timing adjustment circuits inserted into the shared bus to adjust timing of signals flowing through the shared bus; wherein the shared bus is divided into a plurality of slices by the timing adjustment circuits, and the functional block and the IO blocks are each connected to any one of the plurality of slices so that an amount of wiring delay is small.

21. The semiconductor integrated circuit of claim 20, wherein the functional block includes a data transfer control circuit.

22. The semiconductor integrated circuit of claim 21, wherein the shared bus includes:
- a downlink bus for transmitting signals from the data transfer control circuit to each of the IO blocks; and
- an uplink bus for transmitting signals from each of the IO blocks to the data transfer control circuit.

23. The semiconductor integrated circuit of claim 22 further comprising an uplink arbiter that is connected to one end of the shared bus and arbitrates bus request signals with respect to data transfer from each of the IO blocks to the data transfer control circuit, wherein the uplink arbiter arbitrates the bus request signals transmitted from the IO blocks, and issues a bus grant signal to one of the IO blocks, and the bus grant signal issued to the one of the IO blocks is delayed while passing through the shared bus divided into the plurality of slices, and reaches the one of the IO blocks.

24. The semiconductor integrated circuit of claim 23, wherein the uplink arbiter holds information on a burst length of data to be transmitted from each of the IO blocks, and the uplink arbiter determines interval of the arbitration of the bus request signals based on information on a burst length of data to be transmitted from the one of the IO blocks to which the bus grant signal has been issued.

25. The semiconductor integrated circuit of claim 22 further comprising a downlink arbiter that is connected to the data transfer control circuit and arbitrates bus request signals with respect to data transfer from the data transfer control circuit to each of the IO blocks, wherein the data transfer control circuit outputs data to the shared bus in accordance with a timing at which data is delayed before reaching to any one of the plurality of slices connected to each of the IO blocks.

26. The semiconductor integrated circuit of claim 25, wherein the downlink arbiter holds information on a burst length of data to be transmitted from each of a plurality of channels, and the downlink arbiter determines interval of the arbitration of the bus request signals based on information on a burst length of data to be transmitted from one of the plurality of channels to which a bus grant signal has been issued.

27. The semiconductor integrated circuit of claim 20, wherein the shared bus includes:

a bus for a device outputting data with a long burst length; and a bus for a device outputting data with a short burst length, and one of the bus for a device outputting data with a long burst length and the bus for a device outputting data with a short burst length is selected and used according to a burst length of data transmitted between the data transfer control circuit and each of the IO blocks.

28. The semiconductor integrated circuit of claim 20, wherein each of the IO blocks includes a data transfer control circuit.

29. The semiconductor integrated circuit of claim 20, wherein each of the IO blocks is placed close to the any of the plurality of IO terminals connected thereto.

* * * * *